United States Patent [19]

Robinson et al.

[11] 4,315,251

[45] Feb. 9, 1982

[54] AUTOMATIC METER READING AND CONTROL SYSTEM

[75] Inventors: Paul B. Robinson, Durham, N.H.; Maurice J. Ouellette, North Berwick, Me.; Larry A. Schmidt, Rochester, N.H.

[73] Assignee: General Electric Company, Somersworth, N.H.

[21] Appl. No.: 135,860

[22] Filed: Mar. 31, 1980

[51] Int. Cl.³ .............................................. H04B 3/54
[52] U.S. Cl. ........................... 340/310 A; 340/870.03; 340/825.07
[58] Field of Search ............... 340/310 R, 310 A, 151, 340/150, 870.02, 870.03, 163, 171 R; 179/2 AM; 364/483

[56] References Cited

U.S. PATENT DOCUMENTS

| | | | |
|---|---|---|---|
| 3,622,994 | 11/1971 | Schoenwitz | 340/163 |
| 4,008,458 | 2/1977 | Wensley | 340/151 |
| 4,012,734 | 3/1977 | Jagoda et al. | 340/310 A |
| 4,161,720 | 7/1979 | Bogacki | 340/870.03 |

Primary Examiner—James J. Groody
Attorney, Agent, or Firm—Robert E. Brunson

[57] ABSTRACT

An automatic meter reading and control system for communicating with remote terminal points includes a reading control center which selectively communicates with a meter terminal unit at each terminal point by way of a section control unit, each section control unit serving several meter terminal units. The section control unit is responsive to various commands issued by the reading control center to selectively route the commands to specified meter terminal units or groups of meter terminal units to direct the meter terminal units to selectively carry out a meter reading operation, a load control operation, a user alert operation or transfer of previously stored meter data or switch status data from the meter terminal units to the reading control center in accordance with functions specified by the various commands.

Each meter terminal unit will effect the immediate execution of the function specified by a function code portion of a received command upon recognition of a first address type contained in an action field portion of the received command, and its assigned address which forms a portion of the contents of the first address type. In addition, the meter terminal unit will, again upon recognition of its assigned address, effect the execution of a specified function at a specified future time when it recognizes a second address type, the time of execution being specified in a time field portion of the second address type.

22 Claims, 61 Drawing Figures

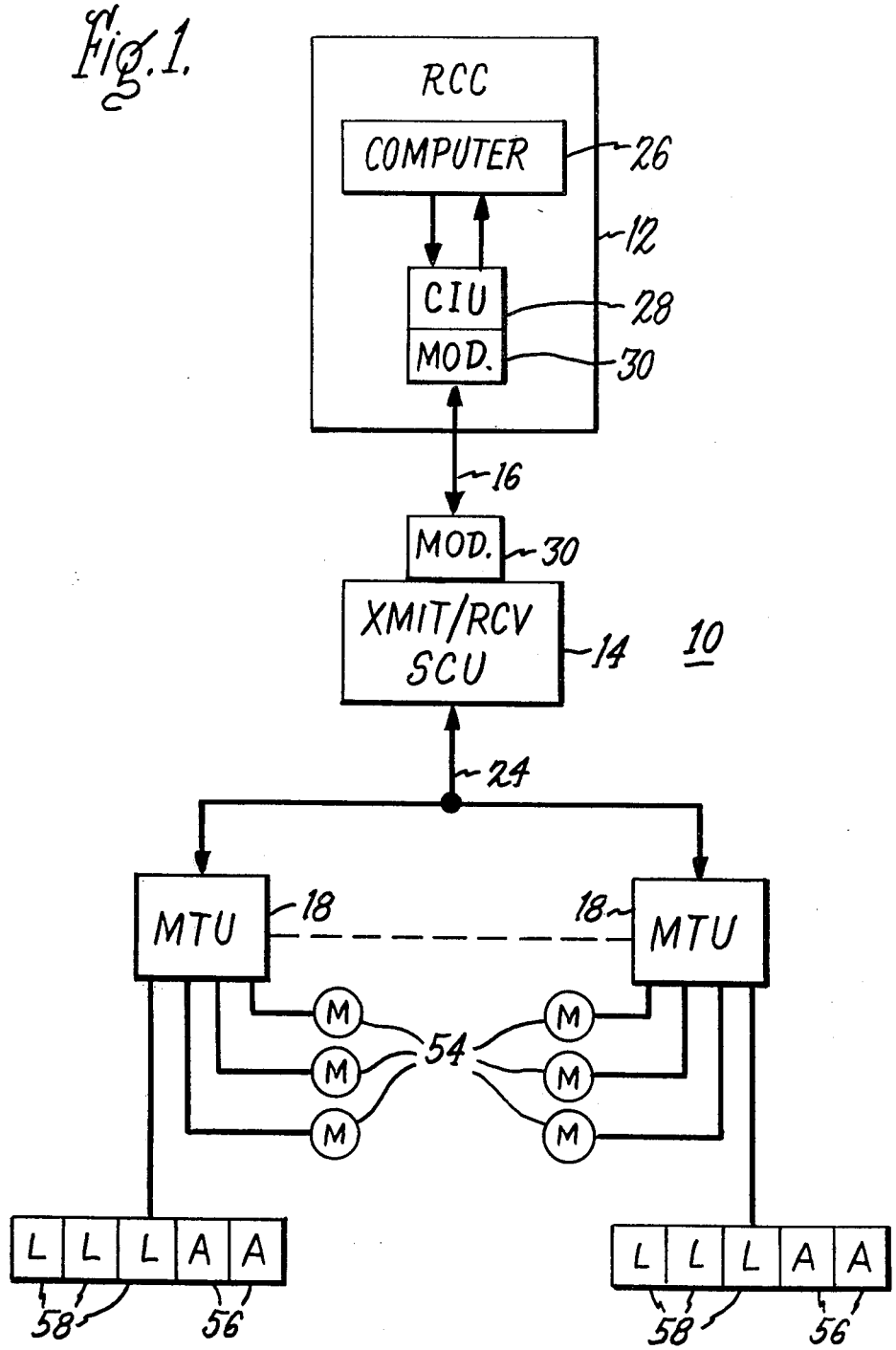

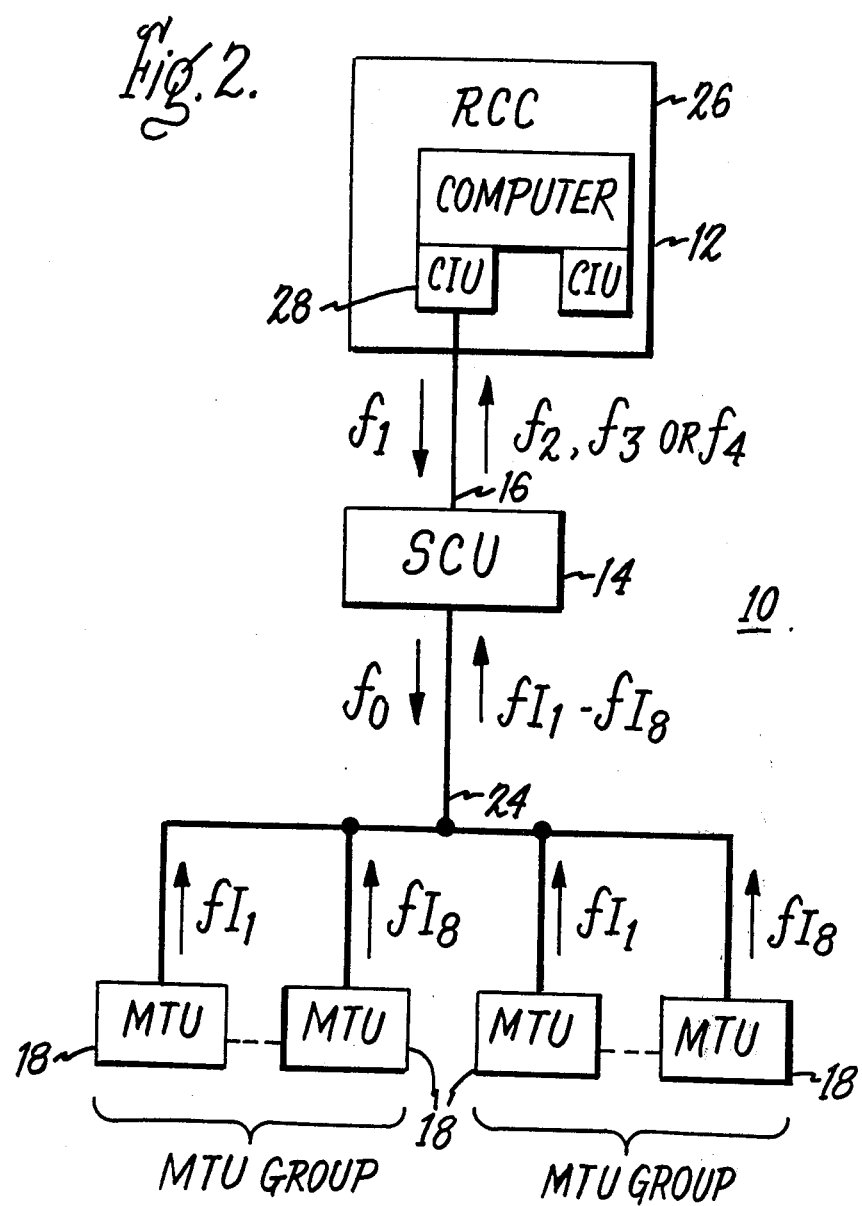

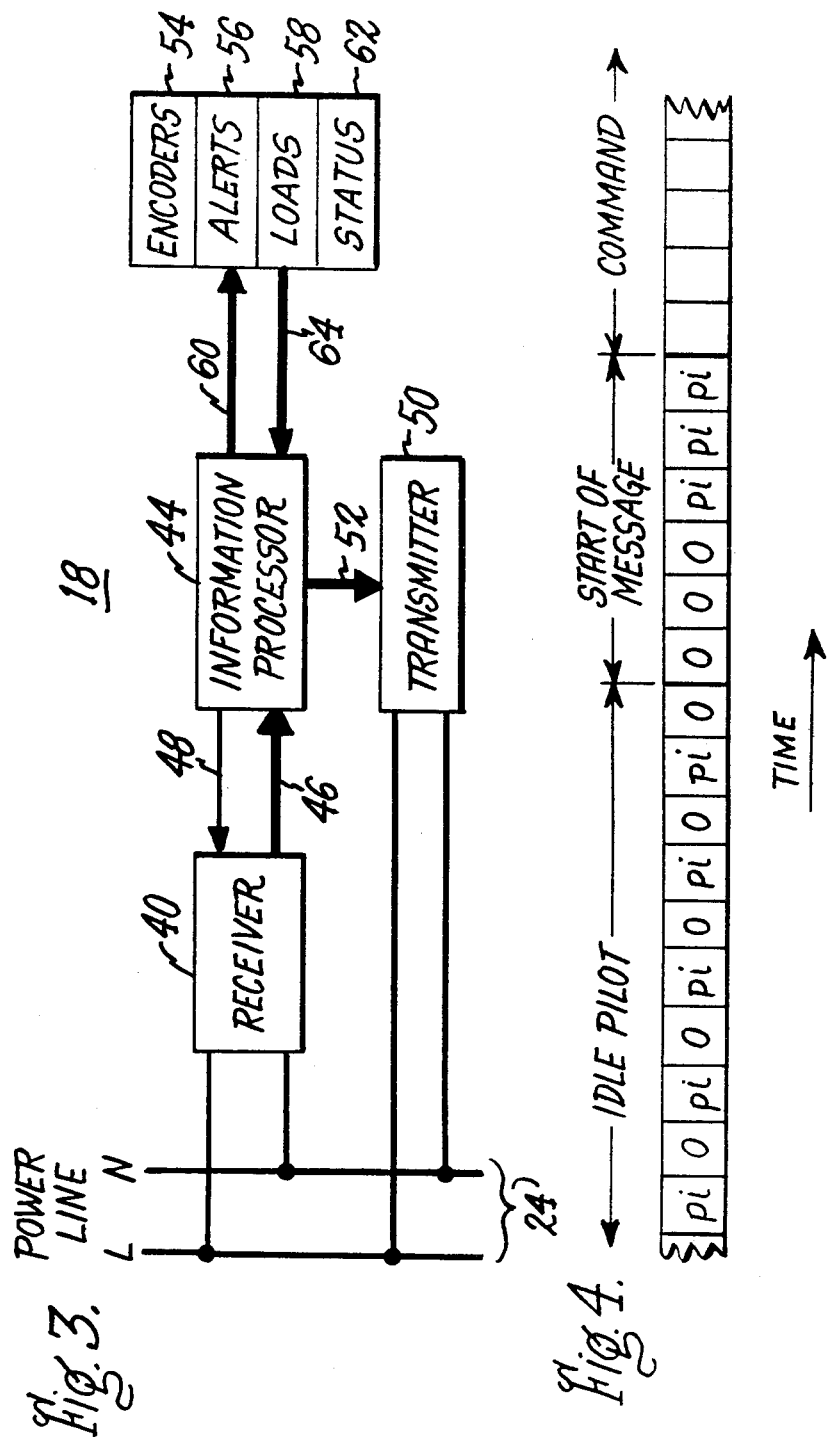

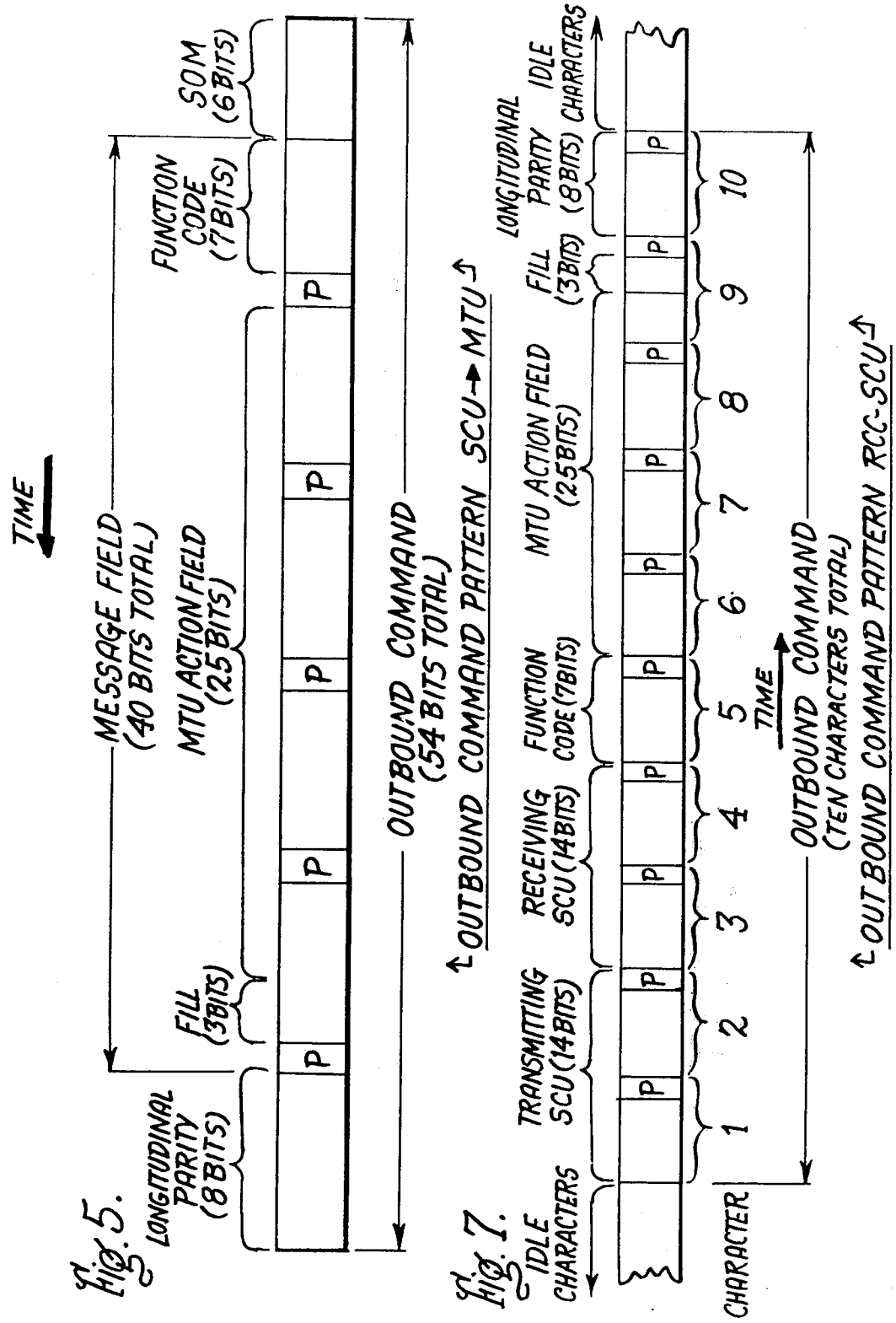

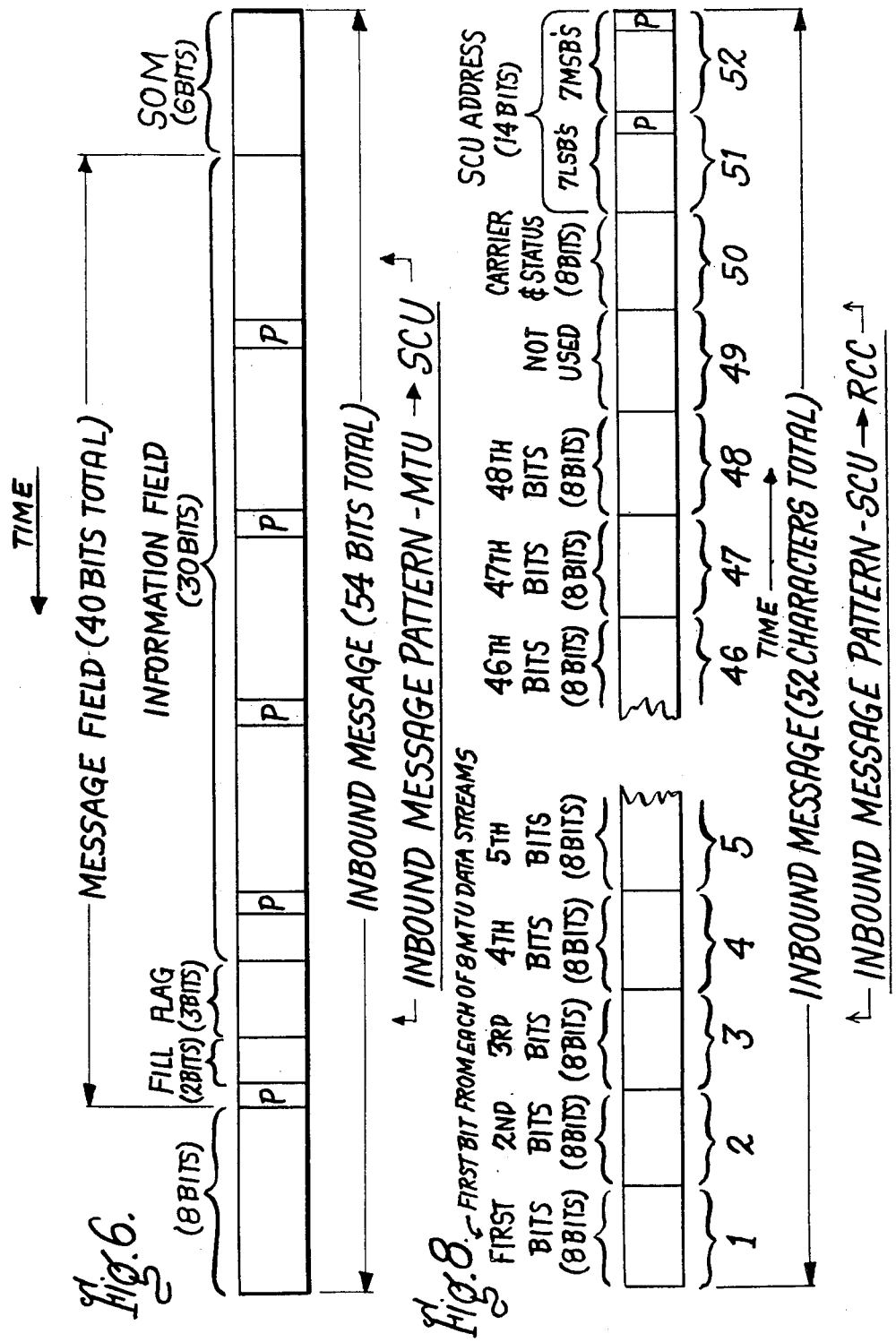

Fig. 9.

FUNCTION CODE FIELD

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | | | | | | | | | | | | | | | | |
| 1 | | | | | | | | | ALERT ON | LOAD 1 ON | RES3 A | | RES2 A | | RES1 A | |
| 2 | ACTION AT SCU | | XMIT A | RESET A | DEM2 A | DEM2 A | DEM1 A | DEM1 A | ALERT OFF | LOAD 1 OFF | RES3 B | | RES2 B | | RES1 B | |
| 3 | | | XMIT B | RESET B | DEM2 B | DEM2 B | DEM1 B | DEM1 B | ALERT 2 ON | LOAD 2 ON | RES3 C | | RES2 C | | RES1 C | |
| 4 | | XMIT J | XMIT C | RESET C | DEM2 C | DEM2 C | DEM1 C | DEM1 C | ALERT 2 OFF | LOAD 2 OFF | RES3 D | | RES2 D | | RES1 D | |
| 5 | | XMIT K | XMIT D | RESET D | DEM2 OFF | DEM2 OFF | DEM1 OFF | DEM1 OFF | | LOAD 3 ON | RES3 E | RES3 L | RES2 E | RES2 L | RES1 E | |
| 6 | | XMIT L | XMIT E | RESET E | DEM2 E | DEM2 E | DEM1 E | DEM1 E | | LOAD 3 OFF | RES3 F | | RES2 F | | RES1 F | |
| 7 | | XMIT STATUS ADDR | XMIT F | RESET F | DEM2 F | DEM2 F | DEM1 F | DEM1 F | | LOADS 1,2,3 ON | RES3 G | | RES2 G | | RES1 G | |
| | | | XMIT G | RESET G | DEM2 G | DEM2 G | DEM1 G | DEM1 G | | | RES3 H | RES3 K | RES2 H | RES2 J | RES1 H | RES1 L |
| | | | XMIT H | RESET H | DEM2 OFF | DEM2 OFF | DEM1 OFF | DEM1 OFF | | LOADS 1,2,3 OFF | | | | | | |

BITS 1-4 (LEAST SIGNIFICANT)

BITS 5-7 (MOST SIGNIFICANT)

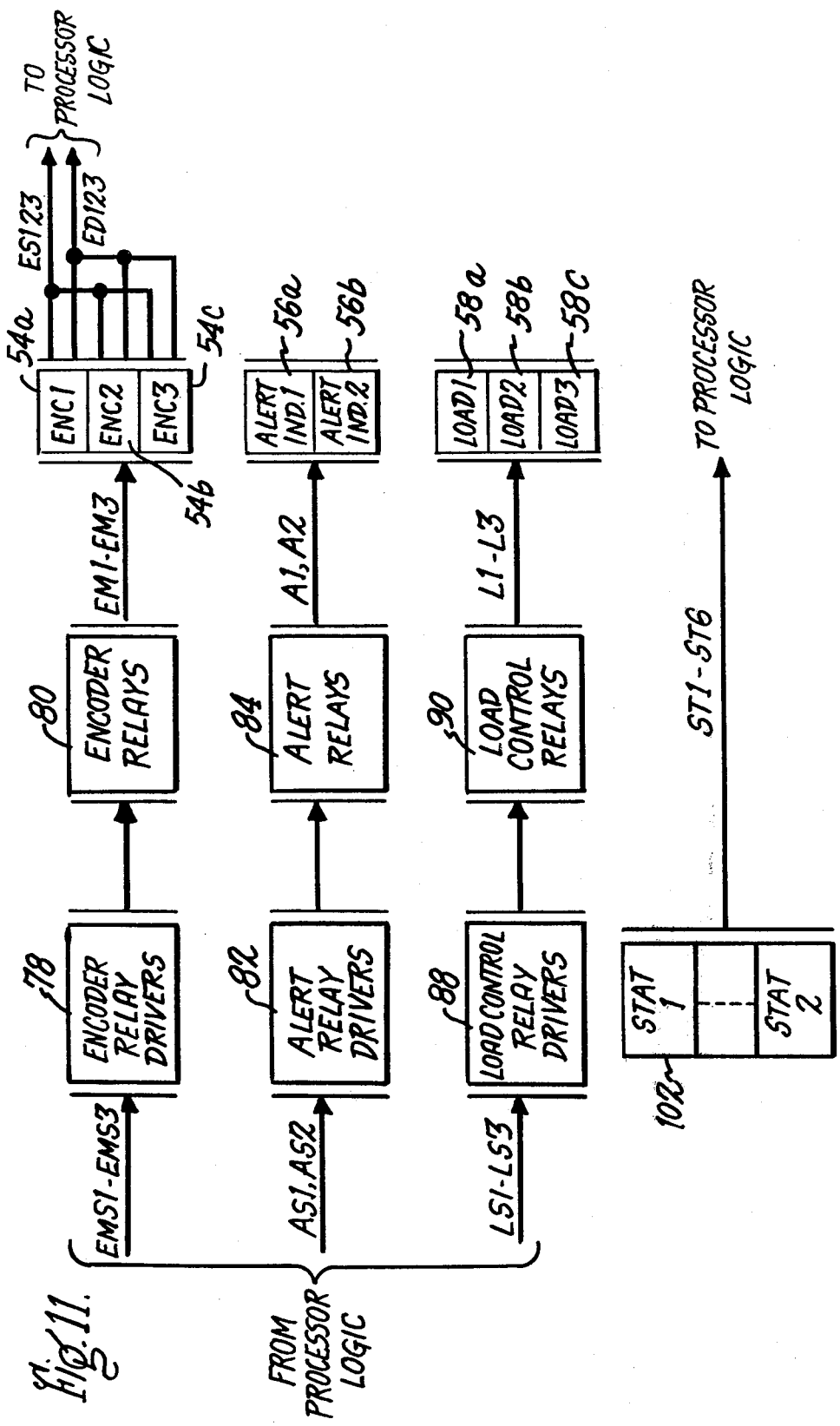

Fig. 12a.

| TOP MEM |
| --- |
| EXECUTE HENCE COMMAND FILE |
| CMDFIL |
| WORK SPACE |
| WRKSPS |
| PRESENT READ AREA |
| PRESRD |
| DEMFLG. \| M2 \| M1 |
| ACCSTR |
| M2DT |
| M1DT |
| SOMWD |
| EXREG \| B7 |
| RDREG |
| INTERRUPT RETURN STACK |
| INTERRUPT RETURN STACK |
| GEN. PURPOSE REGISTERS |

MICROPROCESSOR INTERVAL RAM

B7=1=BLOCK CMD
B7=0=SINGLE OR GROUP CMD

Fig. 12b.

| AUXAD3 (1/32) |
| --- |
| AUXAD2 (1/16) |
| AUXAD1 (ALL) |
| L/23 TIMEOUT |
| L FLAGS |
| THIS MTUADR |
| DEMID |

ADDRESS PROM

Fig. 12c.

| REGISTER L |
| --- |
| METER READING REGISTERS FOR METERS 1,2,3 AND DEMAND REGISTERS (DEMREG) FOR METERS 1 & 2 |
| REGISTER A |
| DATFIL |
| PREVIOUS READINGS FOR DEMAND METER 2 |
| M2 PREV |
| PREVIOUS READINGS FOR DEMAND METER 1 |
| M1 PREV. |
| DCW2 (M2) |
| DCW1 (M1) |

METER ENCODER DATA RAM

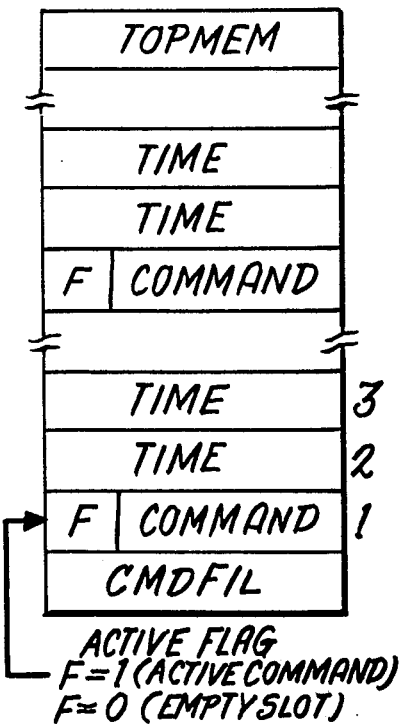
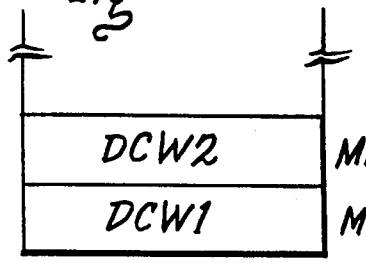

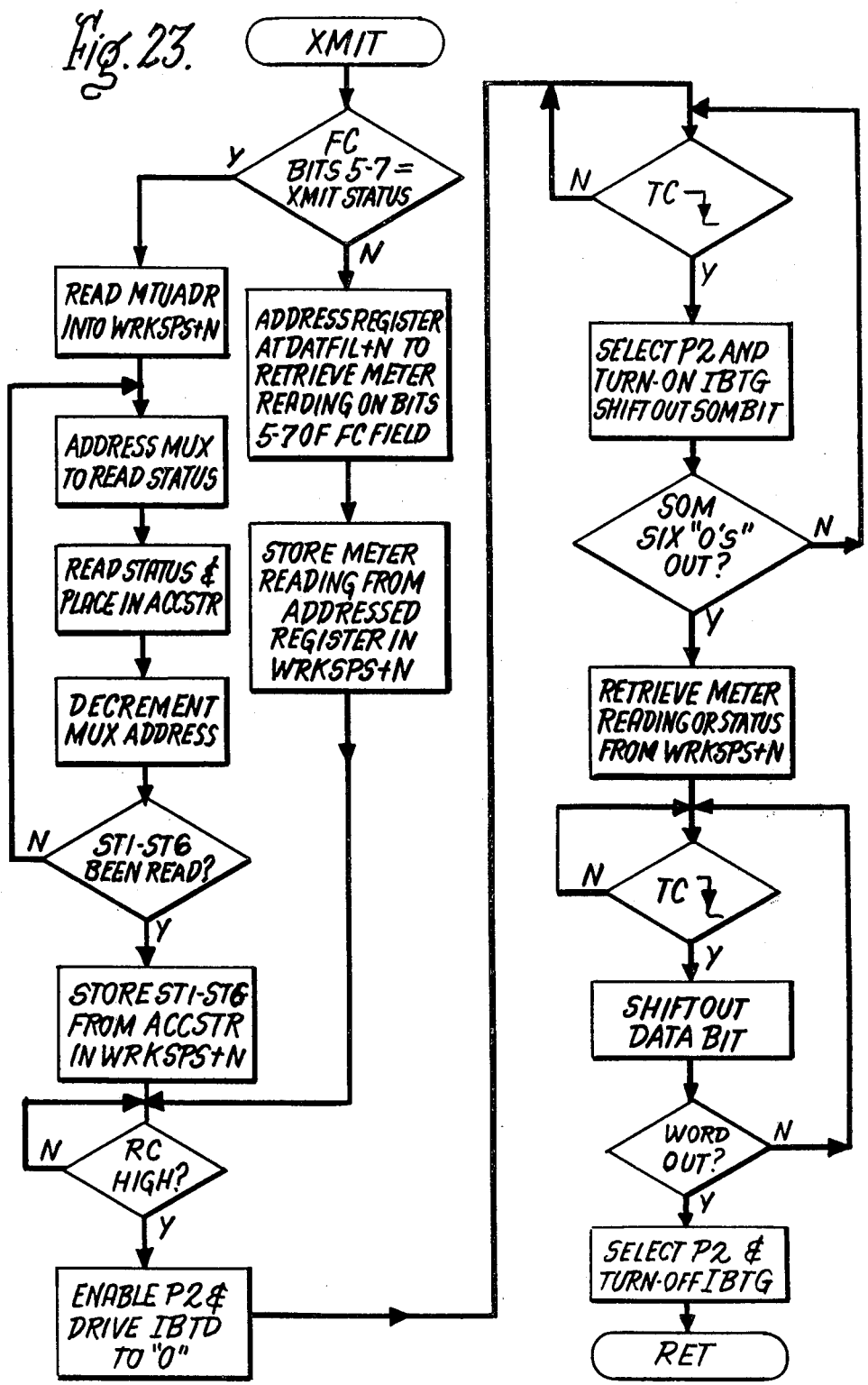

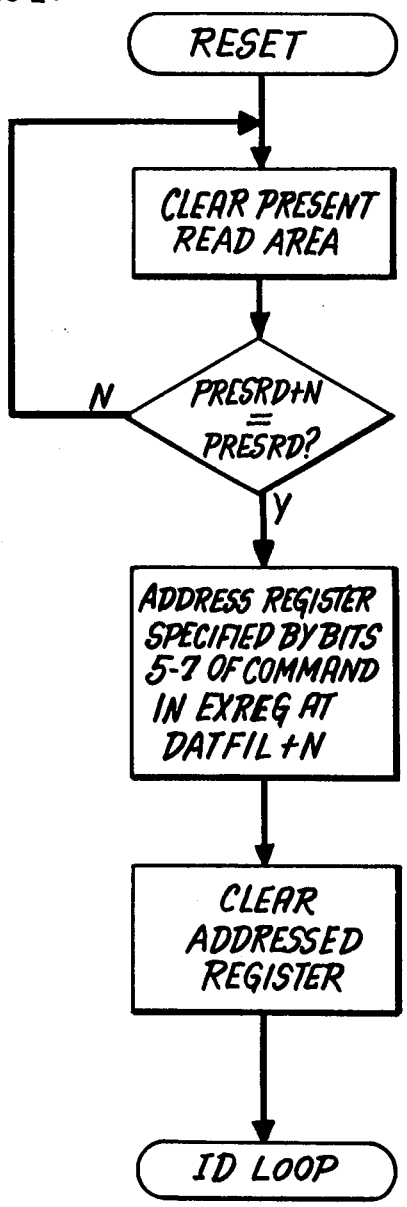

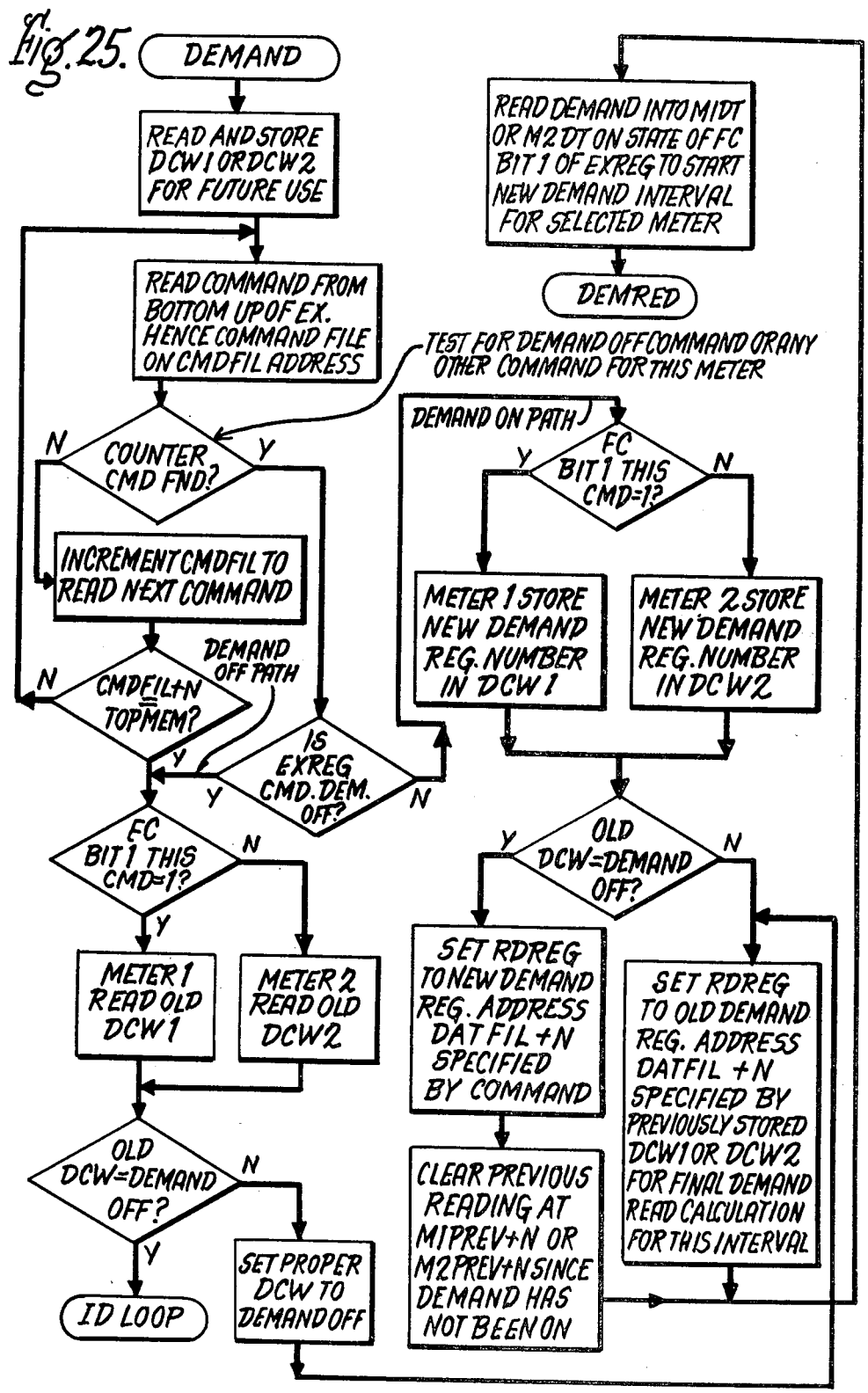

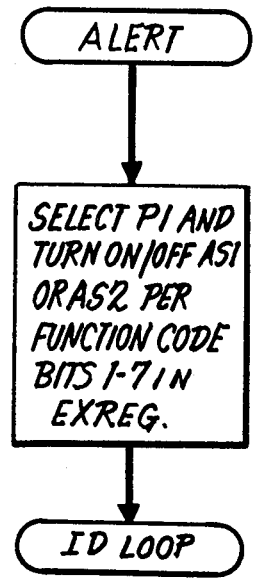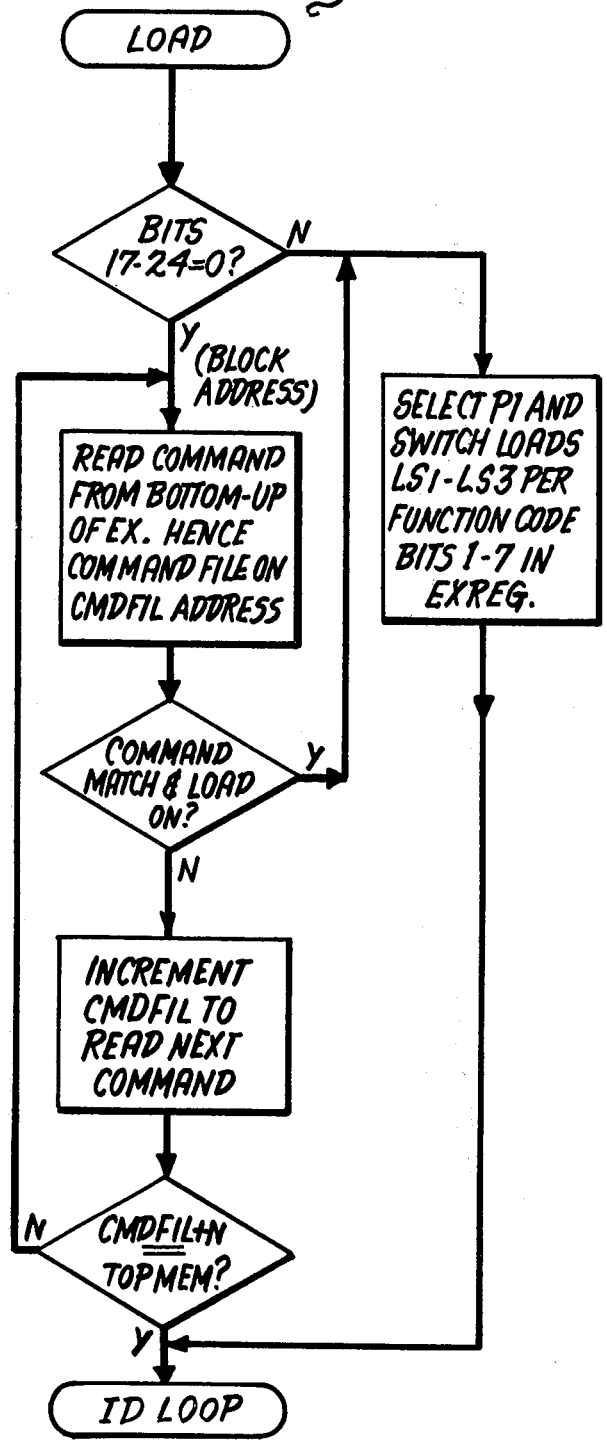
Fig. 26A.
Fig. 26B.

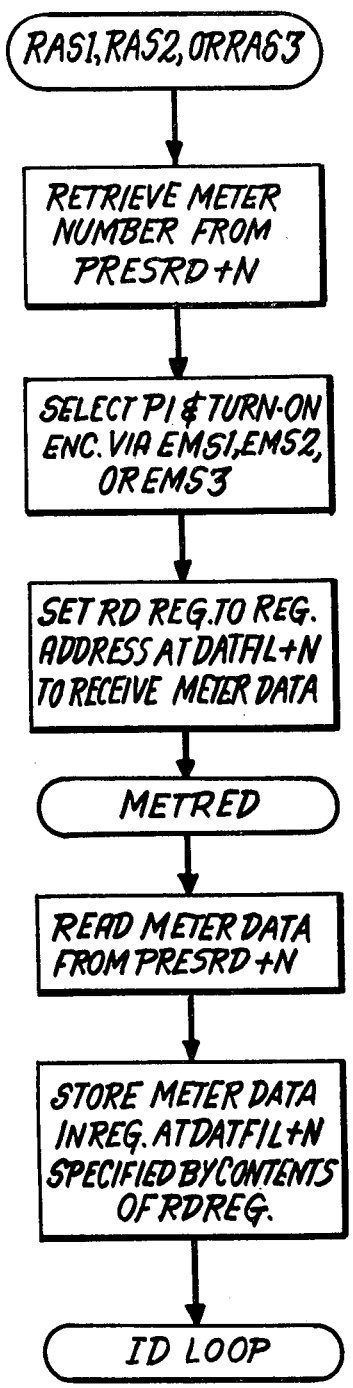

Fig. 33A.

| FLAGS F0-33 |
| ROBWC |
| CNT0 |
| CNT1 |
| OBW1 |
| ⋮ |
| OBW4 |
| OBW5 |
| ⋮ |
| CBW10 |
| OBD5 |
| ⋮ |
| OBD10 |
| IBDW |
| IBXC |
| SACC |
| WORKING REGISTERS R1,R2,ETC. |

8035 MICROCOMPUTER RAM MEMORY MAP

Fig. 33B.

| CONSTANTS TO SET/RESET FLAGS; CONTROL USART & READ SCU LSB'S/MSB'S ADDRESS |
| PROGRAM SUBROUTINES POWO PUIR WAIT OBISR EXOBM OBXR PREIB IBXR IBREC ROBMG ROB2 SCUTA |

2716 EPROM MEMORY MAP

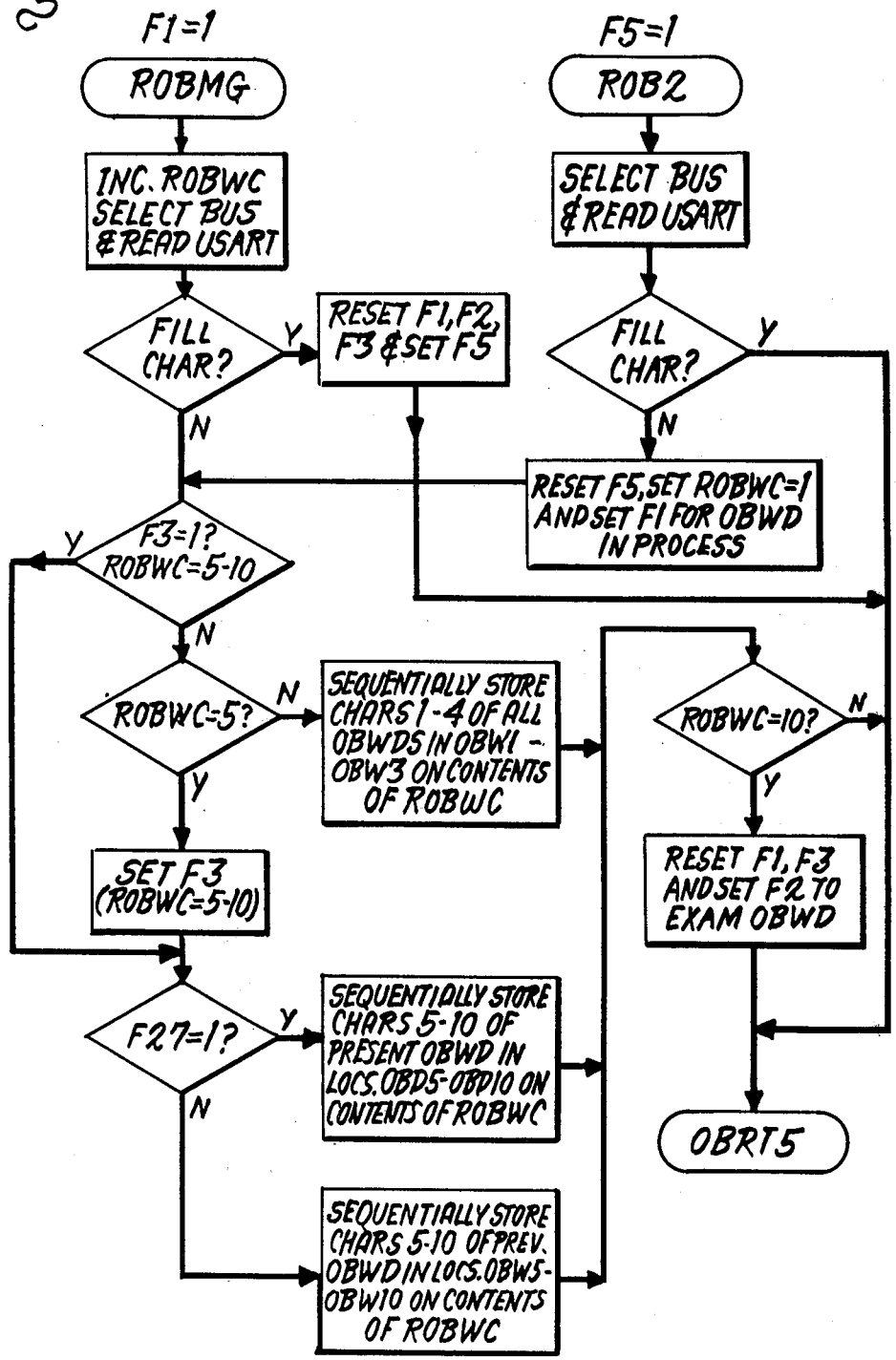

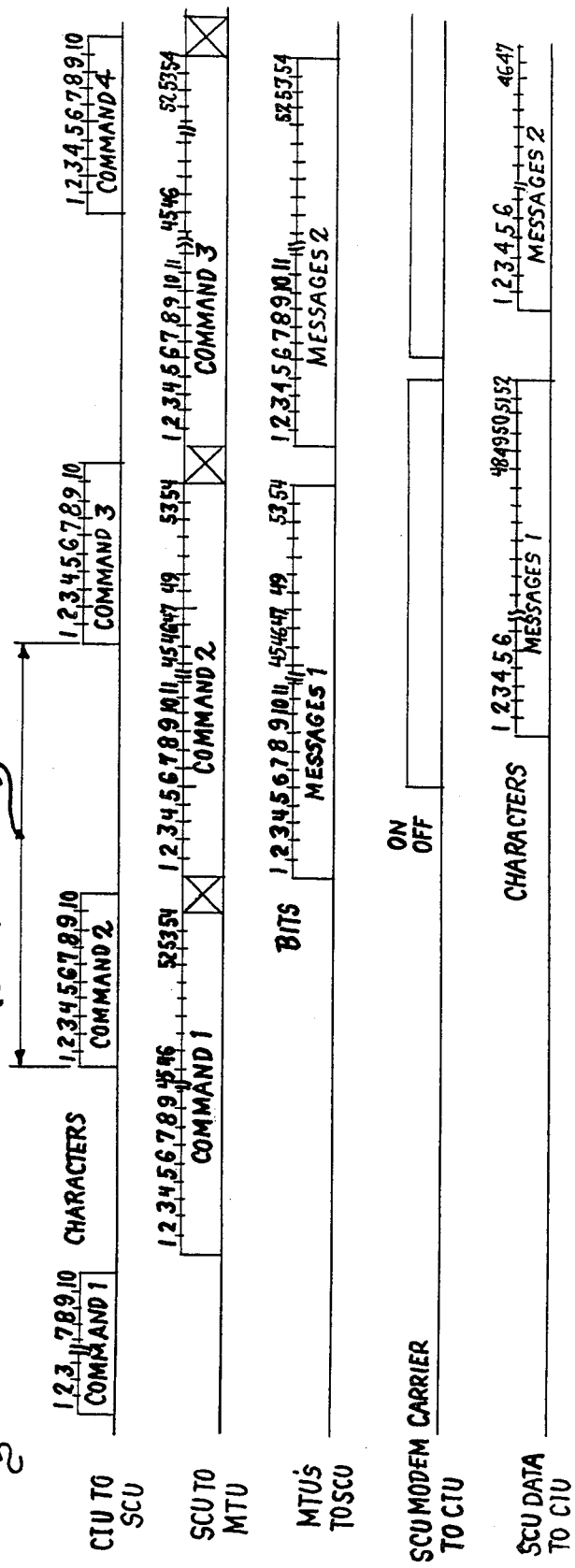

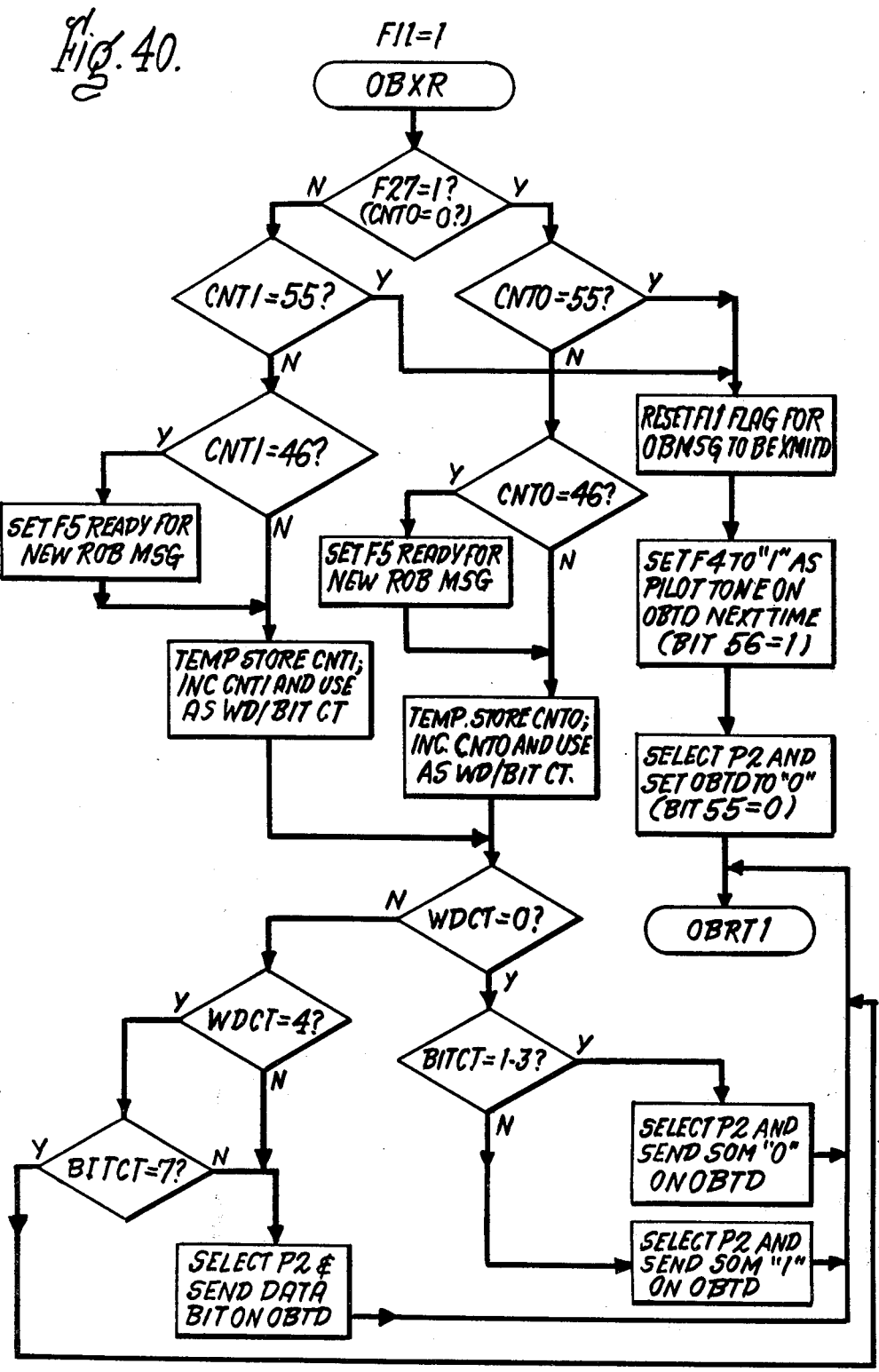

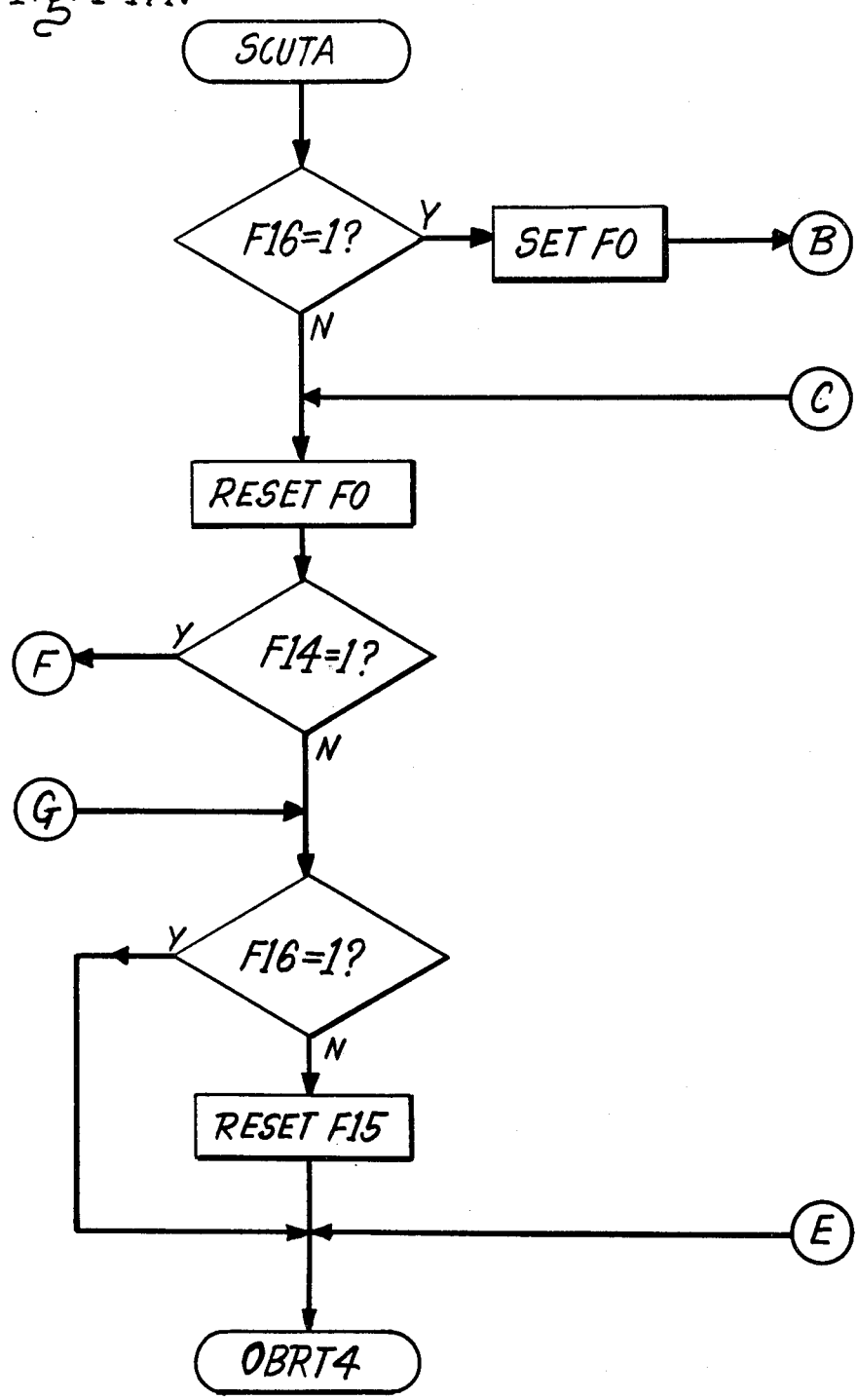

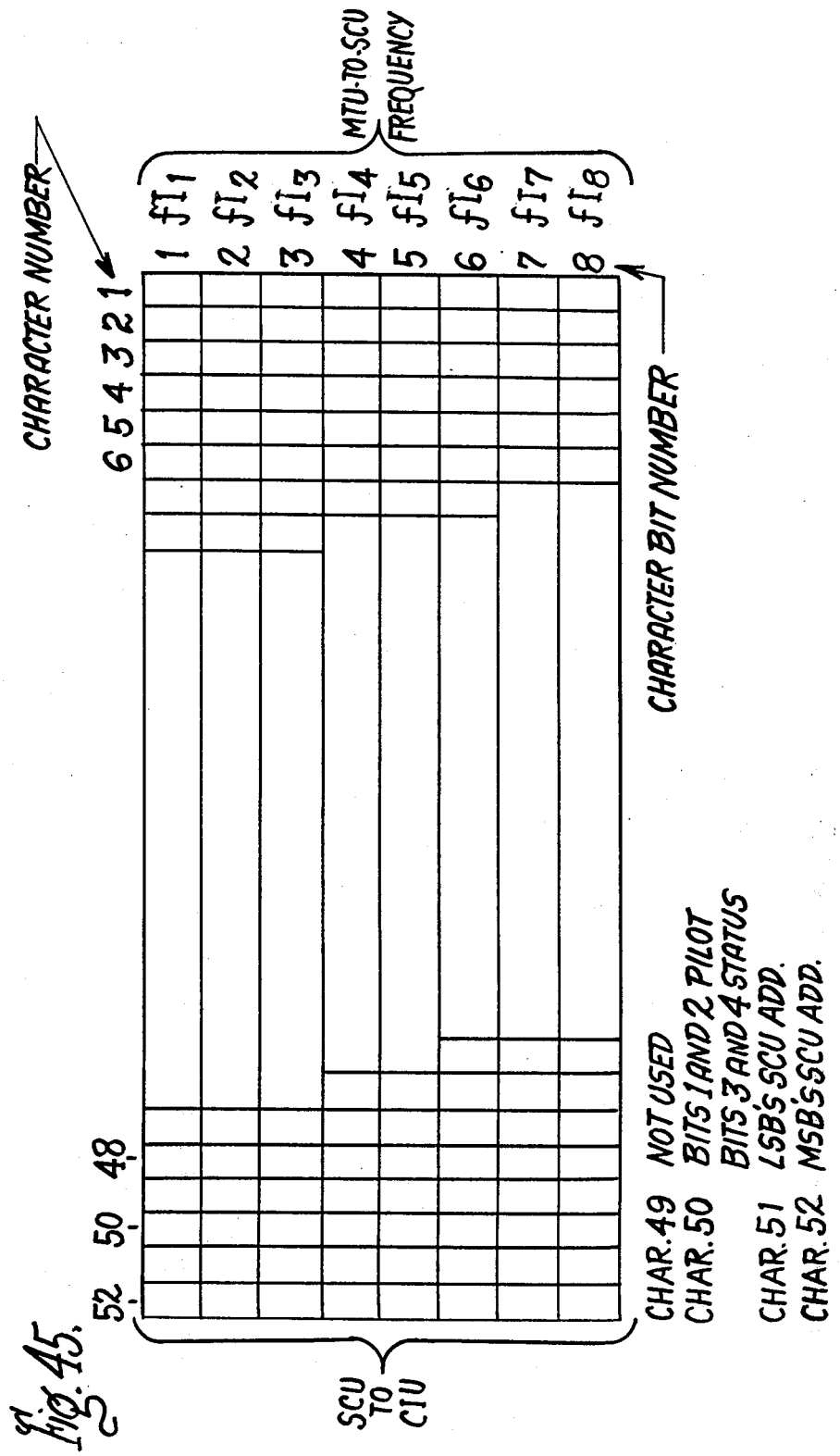

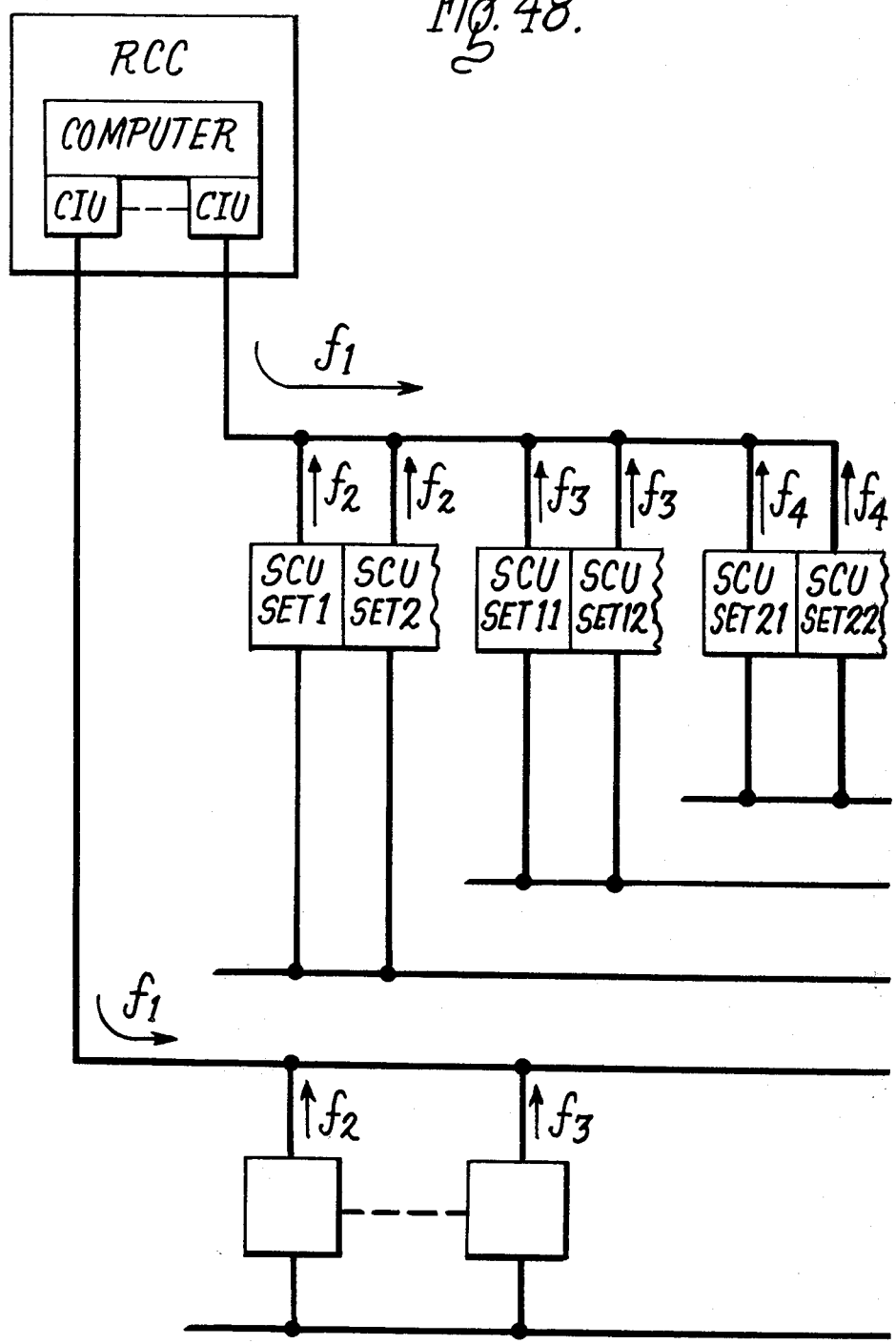

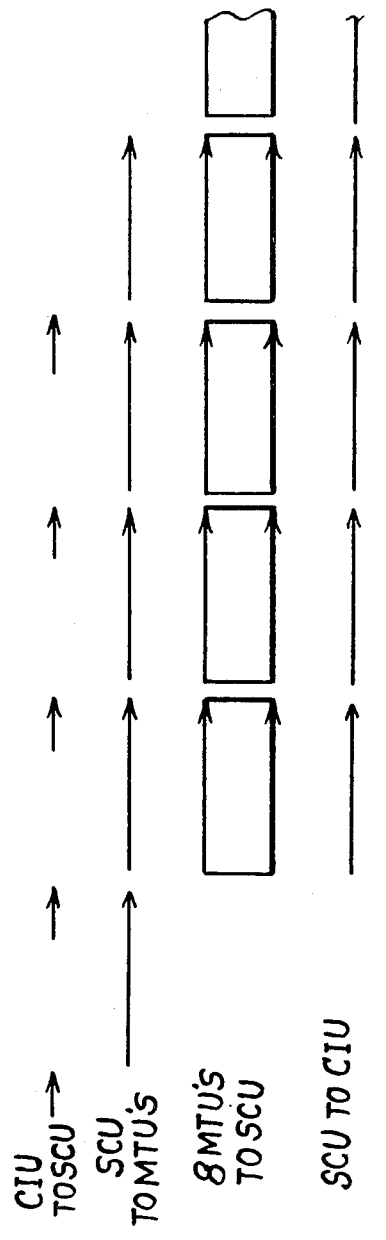

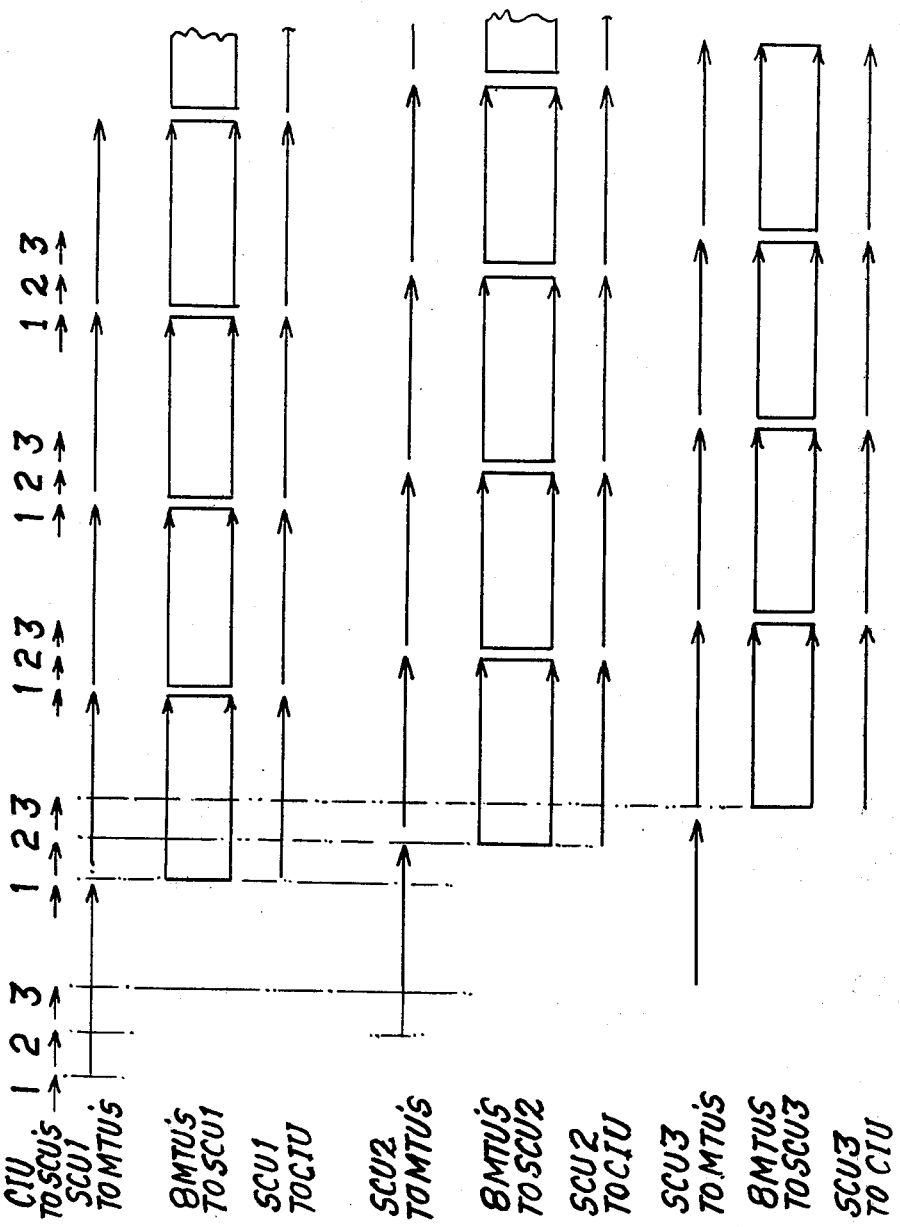

AUTOMATIC METER READING AND CONTROL SYSTEM

BACKGROUND OF THE INVENTION

I. Field of the Invention

This invention relates generally to remote automatic communication systems and more particularly to a reading and control system for reading the measurement of commodities and status switches at remote terminal points along a utility power transmission network, and controlling loads and alerts at the terminal points.

II. Description of the Prior Art

Utility companies have long used meter reading personnel for reading the consumed commodity information provided by utility meters (i.e., gas, water, electricity and the like). However, in recent years significant strides have been made in the development of fully automatic meter reading systems.

Most remote meter reading systems have similarities in their designs. Generally, they comprise some type of encoder device attached to a meter to give an indication of the meter reading, means for storing the meter reading indicated and a transponder for transmitting meter data over a communication link to a central station when interrogated by a signal from the central station. Various types of communication links have been used in transferring the meter data from the individual meters to the central station. One system utilized a mobile van carrying a transmitter for interrogating meter equipment transponders. The interrogated transponders would then return messages to the van, which messages included meter identification and reading. Various other types of systems have been developed which utilize the telephone lines of the subscribers as the communication link to the central station. Also, there are arrangements in which the power lines of the subscriber and the utility company are used as the link between the customer's meter and the central station. One such arrangement is described in U.S. Pat. No. 4,135,181, issued on Jan. 16, 1979 to Bogacki, et al and which is assigned to the assignee of the present invention.

The Bogacki, et al arrangement comprises a central station which includes a computer with input-output equipment for the multiplex generation of commands and the multiplex receipt of data over a plurality of communication lines. A control unit is connected to a communication line and provides signal transmission and coupling of commands and data between the central station and a utility power line. The control unit includes means for recognizing addresses as well as means to decode a function code contained in commands received from the central station. When a control unit recognizes an allowable address in a command, it transfers that command to its connected power line. If the command function code specifies that the control unit is to receive a data message from the power line, the control unit will go into a receive mode after it has transferred the command.

The system also includes a meter terminal unit located at each customer residence. Each meter terminal unit is connected to the power line, and receives commands from and transmits messages to the control unit over the connecting power line. Each meter terminal unit is capable of selectively communicating with a plurality of utility meter encoders for reading a plurality of meters and for selectively driving a plurality of loads at a customer residence. Each meter terminal unit responds to specific commands to either selectively read and store data into one of several storage means from a plurality meters as specified by the command function code; selectively transmit the previously stored meter data from the several storage means to its associated control unit; or selectively control the operation of the residence's loads as specified by the function code.

Although the system of Bogacki, et al was a significant improvement over other prior art systems, it suffered from several disadvantages. These disadvantages include the relatively slow data through-put rate due to the slow bit rate, as well as the wait by the control unit for return messages after transmitting the message request commands. Another disadvantage is related to the number of meter terminal units which can communicate with a control unit. In a geographically widespread area, a meter terminal unit would have difficulty returning messages to the control unit unless a relatively high power, relatively expensive transmitter was included within that particular meter terminal unit. This would not only increase the expense of the system, it could also create the necessity to build more than one model meter terminal unit, depending on the remoteness of the meter terminal unit from its respective control unit.

A further disadvantage concerns the relative insecurity of the system regarding customer load control. This concern is manifested in that assurance must be provided that a load will be restored after being turned off by the system. In addition, assurance must also be provided that premium rate billing for customer consumption during certain predetermined peak periods is performed only during those periods and not at other times.

Consequently, it can be seen that a faster, more reliable system, having relatively few different models of components, which can be tailored in the field to accommodate future changes by the using utility company, is highly desirable.

SUMMARY OF THE INVENTION

The aforementioned advantages are provided by the present invention which provides a remote automatic meter reading, control and alert system, for reading the measurement of a commodity, controlling loads at a consumer or customer residence, and providing predetermined customer alert signals over a network of power lines.

A Reading/Control Center (RCC), includes a computer which is connected to at least one Communications Interface Unit (CIU) for the multiplex generation of commands and the receipt of data over communication lines. The commands generated by the RCC contain at least an address portion and a command message portion.

At least one control unit is connected to each of the RCC communication lines and provides signal transmission as well as, coupling of commands and data between the RCC and a power line. Control units may be grouped into sets, the individual control units being positioned in different geographical locations depending upon the needs of the using utility, as well as the expanse of the power line network. Each individual control unit can be modified or command controlled to receive messages from the power line only, and transmit those messages to the RCC, or both transmit commands onto the power line and receive messages from the power line. The system of the present invention permits simultaneous communication of commands and messages between the RCC, the control units and the power line in order to increase message data through-put.

There is a meter terminal unit located at each customer residence. Each meter terminal unit is capable of selectively communicating with a plurality of utility meter encoders for reading a plurality of meters, for selectively driving a plurality of loads at a customer residence, for monitoring the status of a plurality of external contacts, and for selectively providing a plurality of alert signals to the customer. Each meter terminal unit includes a recever for receiving commands from the control unit over the powerline, as well as a transmitter for transmiting return messages to the control unit over the same power line. In order to increase the through-put capability, the meter terminal units can be placed into groups, with each meter terminal unit within a group having a different transmitting frequency thereby enabling all meter terminal units within a group to transmit return messages simultaneously over the power line.

If required by the geographic distribution of the meter terminal units, a control unit can be provided at a power line location which is relatively close to the remotely located meter terminal units in order to receive messages from those terminal units for retransmission of the messages to the RCC. When control units are connected to the RCC as a set, a transmitter in each control unit transmits at a different frequency such that all control units within the same set can transmit back to the RCC simultaneously in order to increase the return message data through-put In order to further increase data through-put, each control unit can simultaneously receive from the RCC, transmit to the terminal units, receive a plurality of messages simultaneously from the terminal units within a group, and transmit to the RCC.

The terminal units of the present invention can also receive commands to be executed at a specific time in the future. This causes a significant increase in the assurance that system controlled customer loads will be turned on after being commanded off since the terminal unit will only accept a command to turn off if in fact it has previously received a command to turn on at a specified future time. In addition, this feature also greatly enhances the performance of, as well as confidence in, the system with respect to accurate gathering of demand period commodity consumption, since the system will initiate a demand-on period only if it has previously received a command to terminate the demand period at a specified future time. This insures that the consumer is not charged the premium demand rate for erroneously extended periods.

It is therefore an overall object of the present invention to provide a remote automatic meter reading, control and customer alert system having enhanced operating capabilities.

It is another object of the present invention to provide an automatic utility reading system, with enhanced data through-put capability, for reading the measurement of a consumed commodity over utility power lines.

A still further object of the present invention is to provide a remote automatic meter reading, control and customer alert system incorporating controls for improving the reliability of the measurement of customer peak demand usage and billing, as well as assuring that loads which have been commanded off by the system will once again be turned on.

It is yet another object of the present invention to provide an automatic meter reading, control and alert system having improved command and message interlacing whereby the data through-put of the system is enhanced.

Still a further object of the present invention is to provide an automatic meter reading, control and alert system incorporating simplified multi-interpretable command formats in order to enhance the integrity of customer billing information, system operation and increase the speed and consequently the data through-put of the system.

These and other objects of the present invention will become apparent from the following more detailed description.

BRIEF DESCRIPTION OF THE DRAWING

The present invention may be more readily understood by reference to the accompanying drawing in which:

FIG. 1 is a major block diagram of the system of the present invention;

FIG. 2 is a block diagram illustrating the concept of control unit sets of the present invention;

FIG. 3 is a major block diagram of a meter terminal unit of the present invention;

FIG. 4 is a diagrammatic representation of the relationship between a start of message sequence and an idle pilot modulation of a power line carrier;

FIG. 5 is a diagrammatic representation of the preferred pattern of an outbound command from a control unit to a meter terminal unit;

FIG. 6 is a diagrammatic representation of a preferred pattern of an inbound message from a meter terminal unit to a control unit;

FIG. 7 is a diagrammatic representation of the preferred pattern of an outbound command from a reading-/control center to a control unit;

FIG. 8 is a diagrammatic representation of the preferred pattern of an inbound message from a control unit to a reading/control center;

FIG. 9 is a matrix chart showing the relationship of commands to be implemented by an MTU to bit patterns of a function code field in an outbound command;

FIG. 11 is a block diagram depicting the relationship between a meter terminal unit and its associated encoding meters, alerts, controlled loads and status switches;

FIGS. 12a-c depict memory maps of a microprocessor internal random access memory, an address programmable read only memory, and a meter encoder data random access memory, all of which information storage devices are part of a preferred embodiment meter terminal unit;

FIGS. 13a-c depict expanded portions of the microprocessor internal RAM and the meter encoder data RAM as shown in FIG. 10;

FIGS. 14 through 28 are flow charts describing the operation of various subroutines performed by the microcomputer of the meter terminal unit to effect performance of the functions to be carried out by the meter terminal unit;

FIGS. 33a and 33b depict memory maps of a microcomputer random access memory and an addressable electrically programmable read only memory, both of which are part of a preferred embodiment section control unit;

FIGS. 34 through 38 and 40 through 44 are flow charts describing the operation of various subroutines performed by the microcomputer of the section control unit to effect performance of the steps and functions to be carried out by the section control unit;

FIGS. 39 and 49 and 50 are system interlace timing diagrams useful in understanding the flow of commands and messages between the reading control center and meter terminal units via the section control units of the system of the invention;

FIG. 45 is an orthongonally arrayed illustration showing how the section control unit organizes received meter terminal unit messages and section control unit commands for transfer to the reading control center; and FIGS. 46 through 48 illustrating some possible system arrangements utilizing addressable sets of section control units for transmission and reception of commands and messages between the various units of the system as an aspect of preferred embodiments of the invention.

DESCRIPTION OF THE PREFERRED EMBODIMENT

System Description

Figure 10:
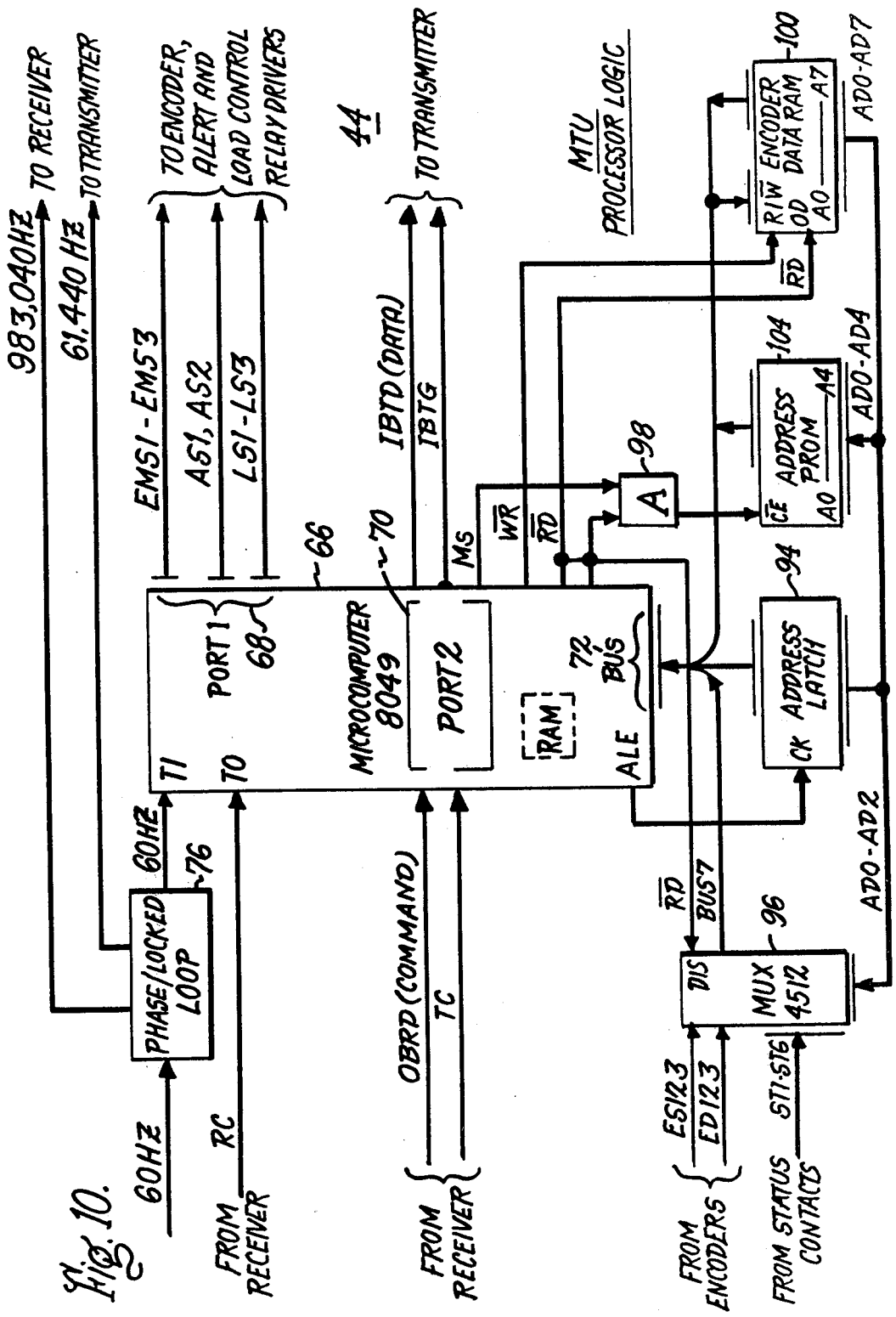
FIG. 10 is a block diagram of a preferred embodiment of the information processor portion of a meter terminal unit.

Referring to FIG. 1 of the drawing, there is shown an overall block diagram of the preferred embodiment of the system of the present invention, generally designated 10. The system 10 comprises a reading/control center (RCC) 12 which communicates with a section control unit (SCU) 14 over a first communication link 16. The SCU communicates with one or more meter terminal units (MTU) 18 as required by the system user, which requirements will be adduceable by those skilled in the art upon further reading of the detailed description herein, over a second communication link 24. Each MTU 18 has the capability of reading a plurality of meter encoders 54; control a plurality of external loads 58 and alerts 56; and reporting the status of a plurality of external contacts (not shown). In the preferred embodiment, one MTU 18 can read three meter encoders 54; control three external loads 58 and two alerts 56; and report the status of six external contacts.

Although there are many meters presently available which can be used in the system of the present invention, in the preferred embodiment, the meters employed should have encoders for transferring consumed commodities such as power, water or gas to the MTU's for storage for subsequent transmission to the RCC. Several types of encoder type meters are known such as contact switch closure types, parallel switch closure types, optical read out types, etc. The present system preferably employs a mechanical non-destructive storage encoder which provides a meter serial data read out as disclosed in U.S. Pat. No. 3,846,789, issued Nov. 5, 1974, entitled, "Remote Reading Register With Error Detecting Capability", to Germer, et al and assigned to the assignee of the present invention, which patent is incorporated in this detailed description as if fully set forth herein.

System control is directed by the RCC which includes a data processor or digital computer 26 which communicates with the rest of the system through one or more communications interface units (CIU) 28. The computer is of a general purpose type having sufficient memory capacity to store data pertaining to the entire system and is programmed to transmit messages or commands throughout the system and to collect data from the system as described hereinbelow. Many such digital computers are commercially available, and the computer selected for the preferred embodiment system is a Hewlett Packard Model 2113E minicomputer.

Each CIU 28 issues commands and receives data, preferably in a multiplex mode, over the first communication link 16, which in the preferred embodiment is a voice grade telephone circuit, the use of which is preferably dedicated to the system. It will be noted that each telephone line used in the first communication link 16 is preferably terminated by a modulator/demodulator circuit (modem) 30 on each end thereof.

It is normally desirable that the SCU 14 be installed in a substation of the using utility and that the SCU communicate with that substation's entire complement of MTU's. However, it is possible that satisfactory operation in some cases can only be obtained with additional SCU's. Although these additional SCU's may be complete SCU's, it might be more economically desirable that they be "receive-only" SCU's since the inbound communication path from the MTU's is less powerful than the outbound communication path from the SCU to the MTU's. Consequently, the system of the present invention includes the concept of SCU sets in which a transmitting SCU acts in concert with a receiving SCU. This concept will be more fully described hereinafter.

The data rate between the CIU 28 and any one SCU set is preferably 300 baud full duplex, therefore enabling the use of, in the preferred embodiment, one subchannel ($f_1$) for permitting the transmission of outbound commands from the RCC to the SCU and three subchannels ($f_2$, $f_3$, $f_4$) for permitting the transmission of inbound messages from the SCU set to the RCC, see FIG. 2. In a system configuration in which there are relatively few MTU's per SCU set, all SCU sets can share a single inbound subchannel since the amount of inbound data is relatively small. In a system configuration having more MTU's and SCU sets, but still with relatively few MTU's per set, the system can be expanded to utilize two or more of the inbound SCU to RCC subchannels ($f_2$, $f_3$ or $f_4$) as is depicted in the block diagram of FIG. 2. Transmission of data between the modems 30 is preferably of the frequency shift keying (FSK) type; however, other types of transmission may also be employed. Each of the modems 30 are preferably of the voice frequency type of a commercially available transmitter/receiver. Typical transmitters and receivers of the type which may be employed in the present system as modems are models G8AT-2F and G8R-2F/3F manufactured by RFL Industries, Inc.

As previously stated, each SCU is connected to a second communications link 24 which, in the preferred embodiment electrical utility application, is an electrical power transmission line. The power transmission line has at least one MTU 18 connected thereto, as shown in FIG. 1. As represented by the dotted line in FIG. 1, the electricl power transmission line 24 may have a plurality of MTU's connected thereto. In the preferred embodiment, the transfer of commands and data between the RCC 12 and the SCU's 14 over the voice grade lines 16 is performed in the format of ASCII asynchronous characters. Commands or messages issued by the RCC 12 are transferred by the SCU's 14 to their corresponding power lines 24 by means of carrier signals which are binary phase modulated at 30 bps.

As previously stated and diagrammatically depicted in FIG. 2, the preferred embodiment outbound commands from the RCC 12 to the SCU's 14 are transmitted over the phone lines 16 using a single tone or carrier frequency $f_1$. In the preferred embodiment $f_1$ equals 660 Hz. As also stated above, the SCU's 14 can transmit inbound data messages to the RCC 12 using one of three preassigned sub-channel frequencies $f_2$, $f_3$ or $f_4$. In the preferred embodiment, $f_2$ equals 1260 Hz (sub-channel 1), $f_3$ equals 1860 Hz (sub-channel 2) and $f_4$ equals 2460 Hz (sub-channel 3). Also depicted in FIG. 2, outbound commands are transmitted at a frequency $f_0$ over each SCU's respective power line 24 to a plurality of meter terminal units 18 (MTU's) connected to each of those power lines. In response to certain commands, the MTU's 18 will respond with data representative of a measured commodity at a specific frequency ($fI_1$-$fI_8$). Table 1 illustrates representative power line transmission or carrier frequencies which are employed in the preferred embodiment of the system of the present invention.

TABLE 1

| CARRIER | | FREQUENCY (Hz) |
|---|---|---|
| $f_0$ | (SCU Outbound) (Inbound) | 5010 |
| $f_{I1}$ | | 6630 |
| $f_{I2}$ | | 6990 |
| $f_{I3}$ | | 7350 |
| $f_{I4}$ | | 7710 |
| $f_{I5}$ | | 8130 |
| $f_{I6}$ | | 8550 |
| $f_{I7}$ | | 9030 |
| $f_{I8}$ | | 9510 |

As noted in Table 1 and depicted on FIG. 2, $f_0$ specifies the frequency of the carrier carrying outbound commands from the SCU 14 to the MTU(s) 18. $f_{I1}$-$f_{I8}$ specifies the power line carrier frequencies transmitted by a group 8 MTU's connected by the power line to the SCU 14 transmitting the $f_0$ carrier whether that SCU be a single SCU or the transmitting SCU in a set.

Referring again to FIG. 1, each of the MTU's 18 is located at metering locations such as household residences, business residences, factories or the like. Each MTU 18 responds to an outbound command originally generated by the RCC 12. Although each command, which is acted upon by the MTU 18, will be discussed in detail subsequently, generally the MTU can be commanded to read and store meter data, perform demand read and calculation on the meter data, transmit previously stored meter or demand data, turn loads off and on, turn customer alerts on and off, and provide the status of external contacts.

An outbound command from the RCC 12 to the MTU's 18 by way of an SCU 14 contains an MTU address portion and a command function code which specifies the particular function to be carried out by the addressed MTU 18, as will be described in detail subsequently. It should be noted that MTU's are individually addressable, group addressable, or block addressable, as will be subsequently described. One MTU 18 is generally addressed when it is desirable to interrogate only one particular residence, for example, during meter survey operations or individual load switching. During normal meter reading operations, however, groups of 8 MTU's are generally addressed for reasons which will become more clear in the ensuing description.

There are situations in a large power system when it is either desirable, or necessary, to quickly remove all loads from the entire system. This would occur, for example, under conditions of a catastrophic power failure which necessitates a mass scramble to shut down an entire system to prevent damage to the power transmission equipment. In this latter situation, the MTU's 18 can be addressed in large blocks or, if desired, all MTU's in an entire system can be simultaneously addressed. The unique addressing scheme of the system of the present invention permits calling on small concentrated groups of MTU's 18 for the transmission of meter data, or for the performance of various functions in large geographically dispersed blocks of MTU's for simultaneous action such as read and store data and load control.

Message Data Formats

Prior to proceeding with the further description of the system, it is considered advantageous at this time to provide a description of the various messages and data formats of the information transferred between the RCC 12 and the SCU's 14 and MTU's 18 of the system. Reference is now made to FIG. 7 which illustrates the format of outbound commands transferred from the RCC 12 to the SCU's 14. It should be noted that the command is in ASCII format, although ASCII codes are not used. Each character includes a start and stop bits (not shown) at the beginning and end respectively of a character. In the preferred embodiment, a parity bit is also set for odd parity. Seven information bits plus the parity bit are included between the start and stop bits of each character. The first two characters received by an SCU from the RCC is the transmitting SCU address field. This field can address all SCU's simultaneously (all zeros contained in the 14 information bits) or can address one of 16,382$_{10}$ individual SCU's. A field containing all ones is not used. The next two characters comprise a receiving SCU address field, having a format which is the same as the transmitting SCU address field described previously. Character 5 includes a seven bit function code field which determines a particular action to be taken by the receiving unit (SCU or MTU) which function shall be subsequently described in detail.

The sixth, seventh, eighth and ninth characters comprise an MTU action field containing 25 bits. The contents of the MTU action field will be subsequently described in detail in conjunction with the detailed description of the MTU itself. Note that character nine contains three fill bits in order to meet formatting requirements. Character ten contains seven bits which establish odd parity with respect to bits one through seven of each of the characters five through nine. The eighth bit of character ten establishes odd parity within that character in the same manner as the parity bits within the other characters. The longitudinal parity character is added to increase the transmission security of that portion of the command that is retransmitted over the power line. Since characters one through four are not retransmitted, as will be subsequently described, longitudinal parity is established only with respect to characters five through nine. It should be noted that when the RCC is not transmitting outbound command characters, it sends idle characters consisting of the usual start and stop bits with eight ones in each idle character. Note that the parity bit is even for the seven one bit fill characters. The SCU's reject these fill characters as information because of the invalid (even) parity, but uses them to maintain synchronism with the RCC.

Reference is now made to FIG. 5 which illustrates the format of outbound commands transmitted from the SCU 14 to its associated MTU's 18 over the power line network. It can been seen that the command format is the same as characters five through ten of the RCC to SCU command but has in addition a start of message (SOM) field comprising six bits. As shown diagrammatically in FIG. 4, the first three bits of the start of message field have the same phase as the bit preceeding, while the last three bits have opposite phase from the first three. The first three bits are defined as logic zero and serve as the phase reference for all subsequent bits in the command work. When not sending outbound commands, the SCU continually modulates its power line carrier at the character rate (30 bps in the preferred embodiment) received from the RCC. This idle modulation (idle pilot) comprises continuous phase reversals at the bit rate as shown in FIG. 4. Upon generation of an outbound command, the carrier is modulated by the start of message bit sequence which is then followed by the command. As seen in FIG. 4, the start of message sequence thus represents a clear break in the alternating phases of the idle pilot. Note that 0 and pi represent relative character phases in radians. The diagram depicted in FIG. 4 would be equally valid if the zeros and pis were interchanged.

Reference is now made to FIG. 6 which shows the format of inbound messages transmitted from an MTU(s) 18 to an SCU(s) 14. This inbound message comprises a total of 54 bits including parity. The message starts out with a start of message (SOM) sequence which comprises six bits of one carrier phase defined as logic zero. The start of message sequence is followed by a message field comprising five characters. Included in the message field is a flag field comprising three bits, and a fill field comprising two bits. The flag code contained in the flag field is a function of the activities at the MTU 18 as will be subsequently described. The final character in the message pattern is used to establish longitudinal parity in the manner as was previously described with respect to the outbound command patterns.

Referring to FIG. 8, there is shown the format of inbound messages transmitted from an SCU to the RCC. As indicated in FIG. 8, each inbound message comprises 52 characters. As previously stated, the data transmitted from the MTU's 18 to an SCU 14 is preferably frequency multiplexed and received from a group of of eight MTU's at a time. In other words, it is preferred that eight MTU's respond to a transmit command and consequently the receiving SCU must accept all eight simultaneously in eight receivers. The SCU 19 transmits to the CIU 28 in asynchronous ASCII character format, though the ASCII codes and parity are not used. The usual start and stop bits are included, with exactly one stop bit per character required. The characters for the messages from the SCU 14 to the RCC 12 are formed in real time as the eight MTU data streams are received by the SCU. The first bit from frequency $f_{f1}$ becomes the first bit in the first character; the first bit from $f_{f2}$ becomes the second bit in the first character and so on with the first bit from $f_{f8}$ becoming the eighth bit in the first character (see FIG. 45). Similarly, as indicated in FIGS. 8 and 45, the second bits from all eight receivers form the second character and so forth through the 48$^{th}$ character which is formed by the 48$^{th}$ bits from all eight receivers. It should be noted that there is no character parity in the usual sense.

The SCU then adds information generated internally in the form of four additional characters, 49 through 52. Character 49 is not used. Character 50 includes carrier and status condition information. Character 51 comprises the seven LSB's of the SCU's address plus odd parity while character 52 comprises the seven MSB's of the SCU's address plus odd parity. Note that in the system of the present invention, it is possible that an outbound command from an SCU 14 to the MTU's 18 requires no concomitant inbound message, as will be subsequently described with respect to the detailed description of the MTU. In this case, the SCU still returns the same 52 characters as described above and with the same timing. Also in this case, the SCU sends an image of its 48 bit receive command onto the MTU's as previously described for FIG. 5. Similarly, if the outbound command received by the SCU requires action to be performed by the SCU itself or a command to the MTU's with no response expected, the SCU will again return an image of its received commands as described above.

Meter Terminal Unit (MTU)

As previously stated, the meter terminal unit (MTU) 18 is intended primarily for location on a residence where it will perform the load management functions of meter reading, both during regular periods as well as specialized peak periods which will be subsequently explained, load control, consumer alerting and status monitoring. The MTU 18 communicates with the section control unit (SCU) 14 over the utility's power distribution network 24. The MTU 18 communicates with the metering, control and alert devices over local hard wire circuits.

Referring now to FIG. 3 there is shown an overall block diagram of a meter terminal unit (MTU) generally designed 18. The MTU 18 comprises a receiver 40, which is electrically connected to the power line 24. Signals are output from the receiver 40 to an information processor 44 over a plurality of lines 46. The information content of signals transferred over the plurality of output lines 46 will be subsequently described in conjunction with the description of the information processor 44. The receiver 40 receives an input clock signal from the information processor 44 over an input line 48. The information processor 44 outputs signals to a transmitter 50 over a plurality of output lines 52. The content of the signals output from the information processor 44 to the transmitter 50 over lines 52 will be described in detail in conjunction with the description of the information processor 44. The transmitter 50 is electrically connected to the power line 24.

The information processor 44 outputs signals to a plurality of encoders 54, alerts 56 and loads 58 over a plurality of output lines 60. The information processor receives signals from the encoders 54 and a plurality of status switches 62 over a plurality of input lines 64. As previously stated, there are three encoding meters 54 in the preferred embodiment, each encoding meter 54 being preferably of the type shown and described in U.S. Pat. No. 3,846,789. In the preferred embodiment, there are two alerts 56 which may be, for example, lights to alert the customer of peak power and/or demand periods. Also in the preferred embodiment, there are three loads 58 each of which comprises an output contact suitable for operating an external power-handling device. In addition, it is preferable that the MTU be able to report status of six external contacts 62 which are monitored by means of a voltage generated within the MTU 18 and applied across each of the six external contacts 62.

In the preferred embodiment, the receiver 40 is a receiver for phase shift modulated carrier signals as shown and described in copending U.S. patent application Ser. No. 106,451, inventor W. C. Hughes, filed Dec. 26, 1979, which receiver preferably incorporates a phase-locked loop stabilized by a crystal oscillator as shown and described in copending U.S. patent application Ser. No. 103,032, inventors W. P. Hackert, et al, filed Dec. 13, 1979, both of which applications are assigned to the assignee of the present invention, and both of which applications are incorporated in this detailed description as if fully set forth herein. The transmitter 50 is preferably of the type shown and described in copending U.S. patent application Ser. No. 106,452, inventor W. C. Hughes, filed Dec. 26, 1979, which application is assigned to the assignee of the present invention and which application is incorporated in this detailed description as if fully set forth herein.

Referring to FIG. 10 there is shown a more detailed block diagram of the information processor 44. The information processor 44 comprises a microcomputer 66 which, in the preferred embodiment, is an Intel Corporation Model 8049 Microcomputer. The microcomputer 66 incorporates a first, 68, eight bit quasi-bidirectional port (P1); a second, 70, eight bit quasi-bidirectional port (P2); an eight bit bidirectional port (BUS) 72; an internal random access memory (RAM) 74; as well as various clock, enable and strobe signals, all of which are shown and described in the Intel Corporation Publication entitled, "MCS-48 TM Family Of Single Chip Microcomputers User's Manual", published July 1978 by the Intel Corporation, 3065 Bowers Avenue, Santa Clara, Ca. 95051. This publication describes the architecture and operation of the type 8048 microcomputer and is incorporated by reference in this detailed description as if fully set forth herein.

A phase locked loop circuit 76, of the type shown and described in U.S. patent application Ser. No. 103,032, previously referenced and incorporated herein, receives a 60 Hz input signal from the power feeder line 42. The output of the phase lock loop circuit 76 is a 60 Hz square wave which is synchronized to the 60 Hz signal present on the power feeder line. The 60 Hz square wave signal is input to the T1 input pin which is designated an event counter input for the microcomputer and is described in the previously referenced "User's Manual ". Input pin (T0) receives a receive clock (RC) strobe from the receiver, which is used by the microprocessor when receiving data from the receiver 40 as will be subsequently described. Note that the phase locked loop circuit 76 also supplies a 61,440 Hz signal to the transmitter 50, as well as a 983,040 Hz signal to the receiver 40.

A first terminal of P1, 68, is electrically connected to an encoding meter enabling input whereby a first encoder message select signal (EMS1), generated by the microcomputer 66, enables the drive motor and lamp of the preferred embodiment first meter encoder 54a as disclosed in previously referenced Pat. No. 3,846,789. Likewise, a second terminal of P1 is electrically connected to the second meter encoder 54b for providing a second enabling signal EMS2 and a third terminal of P1 is electrically connected to a third meter encoder 54c for providing a third enabling signal EMS3, see also FIG. 11. As shown in FIG. 11, each encoder message select signal (EMS1-EMS3) is electrically connected to a respective encoder relay driver 78 which in turn activates a respective encoder relay 80 which then completes a power on circuit to a respective encoder motor and lamp.

The fourth and fifth terminals of P1 are electrically connected to respective alert relay drivers 82 which in turn are electrically connected to respective alert relays 84 (see FIG. 11). The fourth and fifth terminals of P1 output alert signals (AS1 and AS2) which turn on the respective alert relay drivers 82. Each relay driver 82 then activates its respective alert relay 84 for providing a closed circuit path through which the respective alert indicator 56a or 56b is turned on. The sixth, seventh, and eighth terminals of P1 are electrically connected to respective load control relay drivers 88 which in turn are electrically connected to respective load control relays 90 (see FIG. 11). An appropriate load signal (LS1-LS3) appearing at a particular terminal will turn on a respective load control relay driver 88 which in turn will activate a respective load control relay 90. The load control relay 90 causes a respective load 58a, 58b or 58c to turn off or on.

Referring again to FIG. 10, two terminals of P2 are electrically connected to the receiver 40 for enabling the microcomputer 66 to receive an outbound receive data (OBRD) signal and a transmit clock (TC) signal from the receiver 40. Two other terminals of P2 are electrically connected to the transmitter 50 thereby enabling the microcomputer 66 to provide an inbound transmit data (IBTD) signal and an inbound transmit gate (IBTG) signal to the transmitter. The eight terminals of the bidirectional port (BUS) 72, are electrically connected to an address latch circuit 94 which receives and stores address information which is output from the microcomputer 66. The address latch circuit 94 preferably comprises eight flip/flops such as included in a pair of Intel Corp. LS 175's. An address latch enable (ALE) terminal of the microcomputer 66 is electrically connected to a clock input (CK) of the address latch circuit 94 to enable the computer to control the latching of the address latch circuit 94 as will be subsequently described. A read ($\overline{RD}$) terminal of the microcomputer 66 is electrically connected to a DIS input of a multiplexer 96, one input of an and gate 98 and an output data (OD) terminal of an encoder data random access memory (RAM) 100. The multiplexer 96 is preferably an Intel Corp. Model No. 4512 and the encoder RAM 100 is preferably an Intel Corp. Model No. 5101L. The signal appearing on this line ($\overline{RD}$) is an output strobe which is activated during a BUS read and is described in the microcomputer "User's Manual".

The multiplexer 96 receives an encoder strobe signal (ES1, ES2 or ES3) as well as an encoder data signal (ED1, ED2 or ED3) from each of the three meter encoders 54. The multiplexer 96 also receives signals (ST1-ST6) from the six status contacts 102 (see FIG. 11) in the form of switch closures. The multiplexer is addressed by bits zero through two (AD0-AD2) of the address output by the address latch circuit 94. Data is output from the multiplexer 92 into the microcomputer 66 by way of bit 7 (BUS7) of the bidirectional BUS port 72. The encoder data RAM 100 stores data preferably in the locations diagrammatically shown in the memory map depicted in FIG. 12. The data stored in the RAM 100 is addressed by bits zero through seven (AD0-AD7) of the address output by the address latch circuit 94. The encoder data RAM 100 receives a read ($\overline{RD}$) and write ($\overline{WR}$) output strobe from the microcomputer 66 during a respective BUS read or write as described in the microcomputer "User's Manual" previously referenced. The data is read from or written into the encoder data RAM 100 by way of the bidirectional BUS port 72 of the microcomputer 66. An address programmable read only memory (PROM) 104 stores data in locations preferably indicated by the memory map of FIG. 12. The address PROM 104 is preferably an Intel Corp. Model No. 5331. The address PROM 104 receives an enable signal ($\overline{CE}$) from the and gate 98 upon coincidence of the read strobe ($\overline{RD}$) and a memory strobe (MS), at which time the contents of the addressed location of the address PROM 104 is read into the microcomputer 66 through the BUS port 72. The address PROM 104 is addressed by bits zero through four (AD0-AD4) of the address output by the address latch circuit 94.

As described above, each MTU 18 has the capability of reading three meter encoders 54, of controlling three external loads 58 as well as, two external alerts 56, and of reporting the status of six external contacts 62. The MTU 18 exercises its functions in response to commands received from the SCU 14. Although previously described, it is appropriate that the commands received from the SCU 14 be discussed again at this time. As previously stated, the power line carrier transmitted by the SCU 14 is normally constantly modulated at the bit rate, which is 30 bits per second in the preferred embodiment, allowing the MTU 18 to synchronize to it. The start of a command is denoted by the lack of phase reversal characterizing the first start of message (SOM) bit, as shown in FIG. 4.

In the pattern of the outbound command from the SCU 14 to the MTU 18, as shown in FIG. 5, a function code field, comprising seven bits, follows the start of message (SOM) sequence. The function code field determines what type of function an addressed MTU 18 will perform. The different types of functions performable by the MTU of the preferred embodiment will be discussed subsequently. The function code field is followed by an MTU action field comprising 25 bits. The MTU action field is interpreted as an MTU address for all function codes except "action at SCU", in which case the outbound command will be ignored by the MTU. The MTU action field is followed by a fill field comprising three bits which are required for correct formating of the command. These fill bits have no informational content. At the end of each command is a longitudinal parity (LP) field comprising eight bits. The eight bits comprising longitudinal parity are generated by the CIU on the five characters (35 bits) which comprise the MTU message field as shown in FIG. 5. Bits one through seven of the longitudinal parity character establish odd parity with the bits one through seven, respectively, of the five characters contained in the message field. Bit eight of the longitudinal parity character is set to establish odd parity within the LP character itself. The longitudinal parity character is added to increase the transmission security of the command that is transmitted over the power line. Note that this level of security is not needed over the phone line which provides the communication link between the RCC and the SCU.

As previously stated, the MTU will normally receive a continuously modulated carrier to which it synchronizes its internal bit clock. A change in the modulation pattern, which is provided by the start of message sequence, denotes the start of the 54 bit outbound command as shown in FIG. 5, which the MTU then takes in and decodes. Each command must pass four tests before the MTU will act on it. First, the MTU tests for odd transverse parity on each of the five groups of eight bits (or five characters) after the first start of message (SOM) bit sequence. The MTU then tests for odd longitudinal parity as contained in the sixth group of eight bits (or sixth character) as previously described.

Each MTU in the system of the present invention has its own unique 24 bit programmable read-only memory set (PROM-set) main address (THISMTUAD) plus three PROM-set auxiliary addresses (AUXAD 1, 2 and 3, see FIG. 12b). Consequently, the MTU will test the bits in the MTU action field and respond to any of the following five types of addresses. These addresses can be characterized as block addresses, group addresses, or a single MTU address. The block addresses comprise, in the preferred embodiment, three different types of addresses. First, all MTU's having a "1" in the most significant bit of its PROM (MSB) auxiliary address one (AUXAD 1) will be addressed if bits 12 through 25 of the MTU action field in the receive command are all zeros. Second, those MTU's having a "1" in the most significant bit (MSB) location of auxiliary address two (AUXAD 2) and wherein the four least significant bits (LSBs) of AUXAD 2 match bits 13 through 16 of the MTU action field, will respond if bits 17 through 25 of the MTU action field are all zeros. This will be referred to as a 1/16 level block address hereinafter. Third, if bits 17 through 24 of the MTU action field in the receive command are all zeros, bit 25 is a one, those MTU's in which the most significant bit (MSB) of AUXAD 3 is a one and the five least significant bits of AUXAD 3 match bits 12 through 16 of the MTU action field of the receive command will respond to that command. This will be referred to as a 1/32 level block hereinafter.

Groups of eight MTU's are addressed if bit 25 of the MTU action field of the receive command is a zero and bits four through 24 match the main address of the MTU's. Finally, a single MTU is addressed if bit 25 of the received address is a one and bits one through 24 of the MTU action field match the MTU's main address. It should be noted that the block addresses also include an 11 bit time field which will be discussed hereinafter.

Assuming that the MTU has successfully tested parity, longitudinal parity and has received a recognizable address, the MTU must then find an executable seven bit function code. In the system of the present invention, there are a plurality of functions which are executable by the MTU. Referring now to FIG. 9 there is shown a matrix diagram of the command functions possible in the preferred embodiment of the present invention. The particular function to be performed is specified by the information contained in the function code field of the outbound command message (see FIG. 5). The column headings across the top of the matrix O through F, represent the four least significant bits one through four of the function code field in hexadecimal code notation. The row headings at the left of the matrix represent the three most significant bits, five-seven of the function code field in hexadecimal code notation. XMIT A-H, J-L represents a command to the MTU to transmit the contents of a particular register A-H, J-L. XMIT STATUS ADDR represents a transmit address and status command which causes the MTU to read its own 24 bit PROM-set address plus the six external status contacts and to transmit this information to the SCU. RESET, A-H signifies that the MTU is commanded to initialize the designated register A-H.

DEM 1-2, A-C, E-G signifies a demand command for a particular meter and a designated register. In the preferred embodiment, this function applies to one of two meters (1, 2) and to one of six registers (A-C, E-G). For a given meter, this function can represent a new demand-on command, if demand was previously off; a transfer-demand command if demand has previously been on for the same meter but a different register; or a demand-off command. Note that before the MTU executes a demand command affecting a particular meter, the following conditions must exist. First, at least one demand command affecting the same meter must already be stored for execution hence. Second, the next command code to be executed (that is, the shortest time remaining) among those identified in the second condition, must have opposite parity from the one about to be executed. That is, even and odd commands must alternate. This is why, in the preferred embodiment, there are locations in the matrix for two demand on for meter X in register Y functions. Note that meeting the three conditions described above will assure that demand will not be started without the command to end it already in place. If the conditions are not met, the MTU will not execute the demand on command and will terminate demand currently in process, as will be subsequently described. When the MTU meets the conditions above, it turns on its demand feature, then immediately for every demand period thereafter follows the sequence for automatic demand as will be subsequently described.

DEM 1, 2 OFF indicates demand off for meter 1 or 2. This command terminates demand for the specified meter. ALERT 1, 2 ON, OFF represents a command to turn the designated alert on or off. In the preferred embodiment, there are two external alerts and an ON command closes the corresponding alert contact while an OFF command opens the contact. LOAD 1-3, ON-OFF represents a command to turn the designated load on or off. In the preferred embodiment, there are three loads (1-3) and an ON command opens the designated output contact while an OFF command closes the designated output contact. R&S 1-3; A-H, J-L represents a command to read a specified meter encoder (1-3) and store the reading in a particular register (A-H, J-L).

FIG. 12b is a memory map depicting the reserved areas in the MTU address programmable read only memory (PROM) 104. The area designated DEMID, contains the demand time interval specified for the MTU. Above that is an area designated THIS MTU ADR, which area contains the address of the particular MTU. Above that is an area designated L FLAGS which contains certain preprogrammed load control flags, the use of which will be subsequently described. Above that is an area designated L 1, 2, 3, TIME OUT, which area contains time out information for loads 1, 2 and 3 as will be subsequently described. Above that are auxiliary addresses designated AUXAD 1, (ALL); AUXAD 2, (1/16); and AUXAD 3, (1/32), the contents of which addresses determines whether or not the particular MTU will be included in one of the three block addresses as was previously described. Note that the information contained in the MTU address PROM 104 is tailored by the user for each individual MTU. The programming is done by methods well known in the computer art to user requirements.

FIG. 12c depicts areas reserved in the MTU meter encoder data random access memory (RAM) 100. The area designated DCW 1 (M1) is reserved for a demand control word-meter 1, as will be subsequently described. Above that is an area designated DCW 2 (M2) which is for a demand control word-meter 2. Above that, the area designated M1 PREV, contains a pointer address for a file which is designated PREVIOUS READING FOR DEMAND METER 1. Above that is a pointer address, M2 PREV, for a file which is designated PREVIOUS READING FOR DEMAND METER 2. Above that is a pointer address, DATFIL, for a data file area which contains registers designated A through L (REGISTER A-REGISTER L) for storing readings from meters 1, 2, and 3, as well as registers for demand readings from meters 1 and 2 (DEMREG).

Referring now to FIG. 13, there is shown three selected expanded memory maps. The first FIG. 13a is an expanded memory map of the EXECUTE HENCE COMMAND FILE. As shown in FIG. 13a, the bottom of the EXECUTE HENCE COMMAND FILE is a pointer address CMDFIL which is used for ease in referencing the file. Above that are three blocks designated COMMAND 1, TIME 2 & TIME 3. These three blocks comprise one full execute hence command, with the COMMAND block containing the function code portion of the command. The most significant bit F of the command block is an active flag which indicates the existence in memory of an active command ($F=1$), or an empty slot ($F=0$). The two TIME blocks contain the bits which are included in the time field of the command.

The PRESENT READ AREA of the microprocessor internal RAM 74 has been expanded in FIG. 13b to show that above the pointer address, PRESRD, are areas reserved for readings from dials 1 through 5 of the designated meter encoder. Above these areas is an area reserved for status bits M2, M1, F3, F2, and F1. The status of the bits contained in this area signify the following: when F1, F2, and F3 equal all "ones", there is no encoder present (no ES1,2,3,). When F1, F2, $F3=001$, this signifies there is new demand data to M1 or M2, DEMREG at DATFIL plus M, as will be subsequently described. The M1, M2 bits signify which meter the data pertains to, with $M1=0$ and $M2=0$ signifying meter 1; $M1=0$ and $M2=1$ signifying meter 2; $M1=1$ and $M2=0$ signifying meter 3; and $M1=1$ and $M2=1$ code not used. Note also from FIG. 13c that all ones in register DCW2 or DCW1 indicate that the demand is off. Any other bit pattern signifies the demand register (DEMREG) number or meter reading register number for the selected meter encoder.

Figure 14:
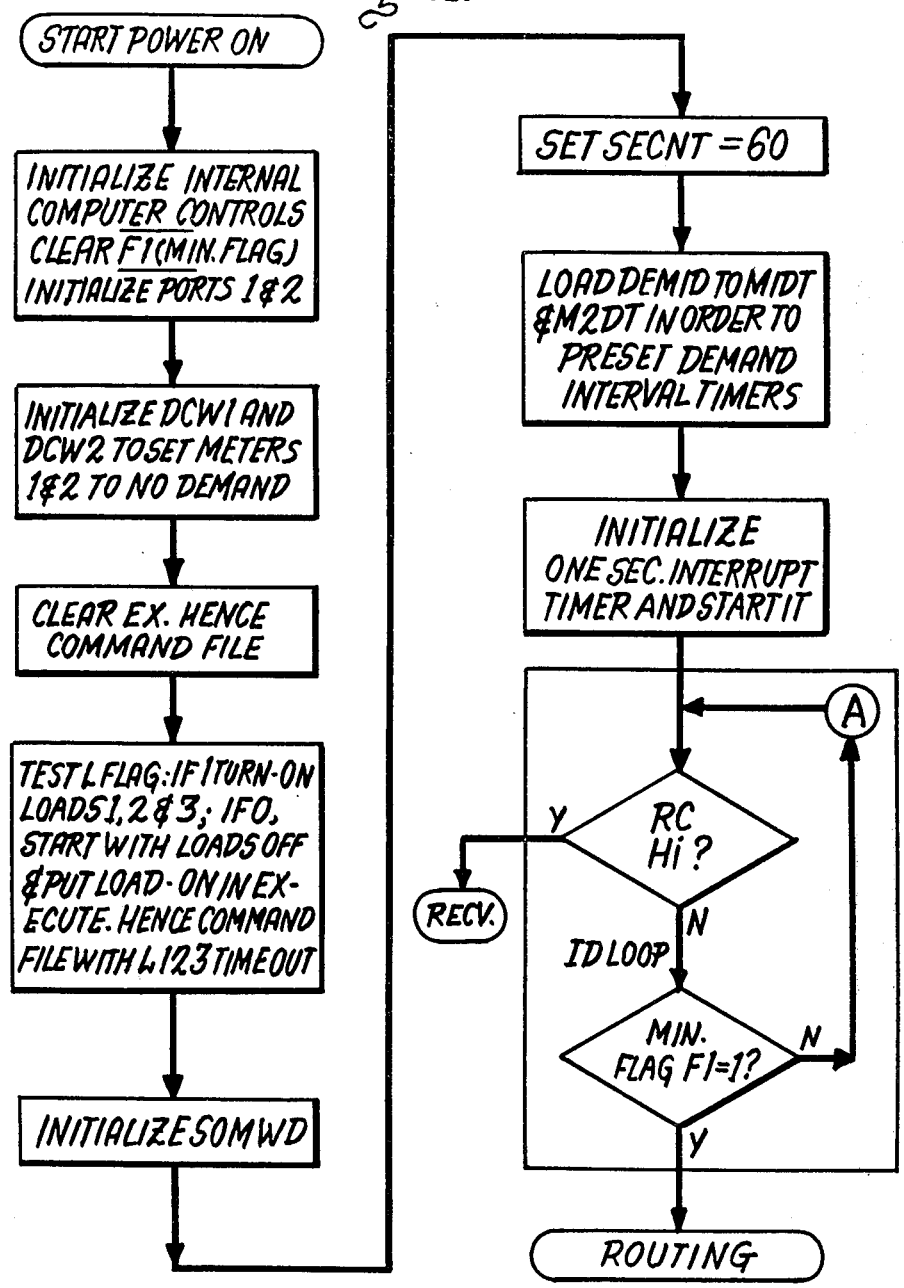

The following description pertaining to the operation of the MTU is made referencing the various flow charts shown in FIGS. 14 through 28. After the MTU has been installed and power is applied, the initializing sequence illustrated by the flow chart of FIG. 14 commences. All internal computer controls are initialized in accordance with standard initializing procedures which are well known in the computer art. A status flag bit F1, which is available for use within the microprocessor, is cleared. In the preferred embodiment, F1 is used as a minute flag as will be subsequently described in conjunction with FIG. 28. Next, computer ports 1 and 2 (P1 and P2) are initialized. Memory locations DCW1 and DCW2 are then initialized by setting all bits in each equal to "one" to indicate demand off, as previously described. Next, the EXECUTE HENCE COMMAND FILE area of the microprocess internal RAM 74 is cleared. The contents of L FLAG in the address PROM is then tested. A one in the L FLAG field signifies that all three loads should be turned on immediately. If the field contains a zero, this indicates that the process will start with all loads off, and a "load on" command is to be placed in the EXECUTE HENCE COMMAND FILE with the particular time out data which is contained in the L123 TIME OUT location of the MTU address PROM. Note that the contents of L FLAG and L123 TIME OUT are specified by the user in accordance with user's requirements as to which loads are to be turned on immediately and which are to be turned on after a specified delay period. Next, the SOMWD register is initialized. Following this, the seconds counter register (SECNT), is set equal to 60. The contents of the demand time interval register (DEMID) are then loaded into the M1DT and M2DT registers to preset the demand interval timers. Note that these timed intervals are also specified by the user and they dicate the length of the demand interval, as previously explained. Normally, each register contains a binary number which is usually about 15 minutes, with each bit representing a minute. Notice that since DEMID is an eight bit register, the demand interval can assume any length from zero minutes through $2^7-1$ minutes.

Next, the one second interrupt timer is initialized and then started. The function of this timer will be described below in conjunction with the flow chart depicted in FIG. 28. Following the initialization and start of the timer, the MTU enters an idle loop (IDLOOP) which is indicated by the rectangle in FIG. 14. In IDLOOP, the receive clock (RC) signal from the receiver 40 (see FIG. 10) is tested. If RC is high (that is, if the receive clock has made a positive transition), the MTU will exit the decision block at Y and go to the receive (RECV) subroutine, the steps of which will be subsequently described in conjunction with FIG. 15. If RC is low, the minute flag F1 is tested. If F1 is equal to one, the MTU exits to the routing (ROUTNG) subroutine, the steps of which will be subsequently described in conjunction with FIG. 18. If the minute flag F1 equals zero, RC is again tested and the subsequent steps are performed as described above. This forms the idle loop which is entered after completion of other functions at the point designated "A". The MTU remains in IDLOOP while awaiting commands as will be subsequently described.

Figure 15:
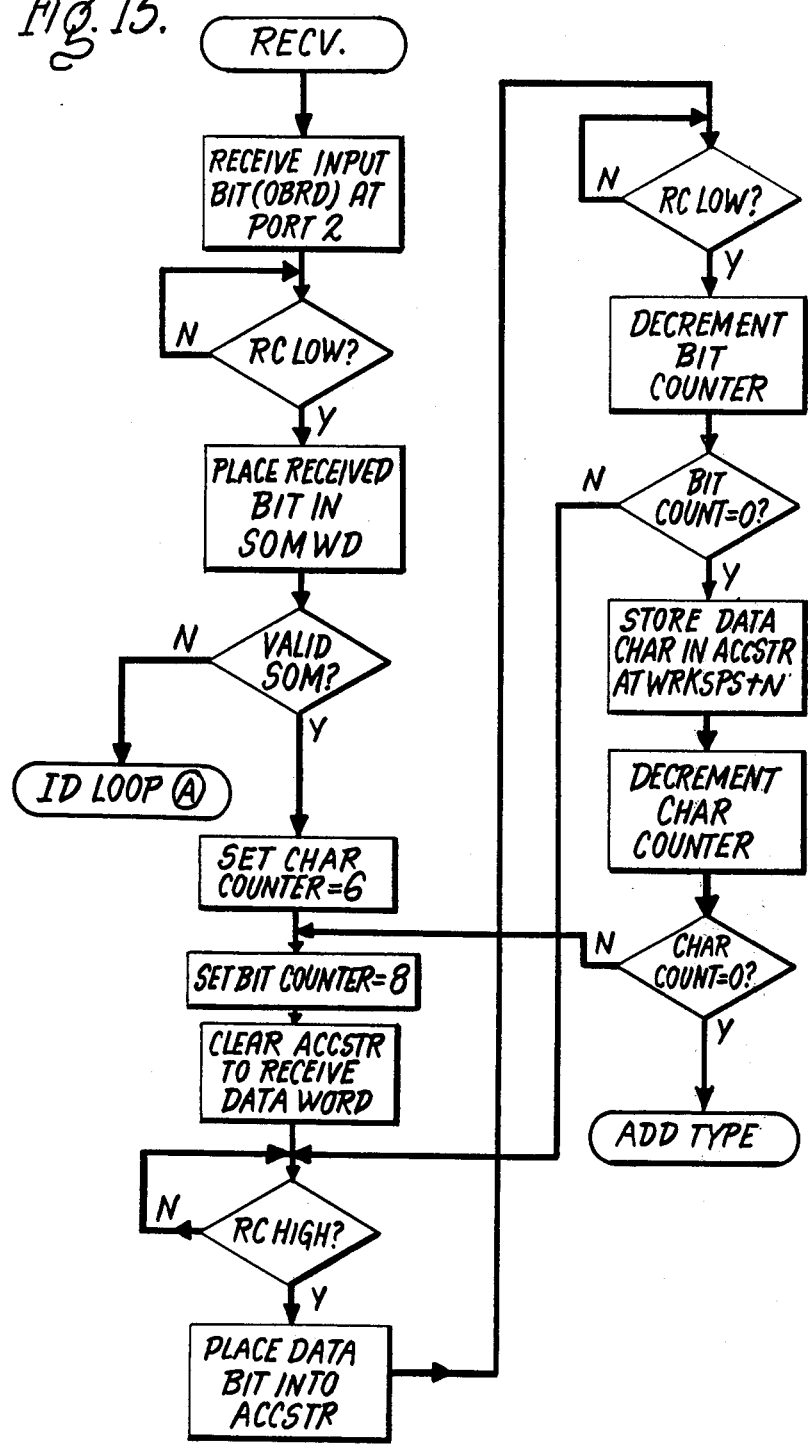

FIG. 15 depicts the steps of the method, designated RECV, by which the MTU obtains and stores the six characters, including parity, of the outbound command. As previously stated, if the receive clock (RC) is high, this indicates that an outbound message is being received; consequently, the MTU will receive the first input bit from the line carrying the outbound receive data (OBRD), at port 2 (P2) of the microprocessor 66 (see FIG. 10). RC is again tested to determine its state. Since the OBRD bits are received serially, the microprocessor 66 uses the RC clock to clock in the bits. Consequently, it will wait until RC returns low at which time it will place the received bit in the SOMWD register. The contents of SOMWD are tested against a pre-stored constant to see if they constitute a valid SOM. If not, the next step is to return to point A of IDLOOP to await RC high in order to clock in the next bit. This process is continued until all six bits of the start of message sequence are stored in SOMWD. Again the contents of SOMWD are tested to determine whether or not a valid start of message sequence was received. Assuming a valid SOM (000111 in the preferred embodiment), the contents of a character counter register are then set equal to six and the contents of a bit counter register are set equal to eight. The accumulator storage register (ACCSTR) is then cleared (the contents are set to all zeros) so that it is ready to accept the receipt of a data word. RC is then tested, to determine whether it is high or low. If low, wait until high at which time, the data bit in the OBRD signal from the receiver 40 (see FIG. 10) is placed into ACCSTR. The microprocessor then waits for RC to go low at which time it decrements the contents of the bit counter register by one. It then tests the bit counter to see if it is equal to zero. If it is not equal to zero, it continues to clock in data bits from OBRD into ACCSTR. When the bit counter is decremented to zero, one entire character of the receive command has been stored in ACCSTR. At this time, the data characters stored in ACCSTR is read into the WORK SPACE file at WRKSPS+N, for example WRKSPS+1 (see FIG. 12). At this time, the microprocessor decrements the contents of the character counter register by one then tests the character counter to see whether or not it equals zero. If the character counter is not equal to zero, the bit counter is reset at eight and the microprocessor inputs bits of the next character into ACCSTR which character is then transferred to WKSPS+2. These steps are repeated until all six characters of the inbound message (see FIG. 6) have been received and stored in locations WRKSPS+1 through WRKSPS+6. At this time, when the character count is tested, it will equal zero and the microprocessor will then perform the steps of address type (ADDTYPE) in order to determine the type of address received.

Figure 16:
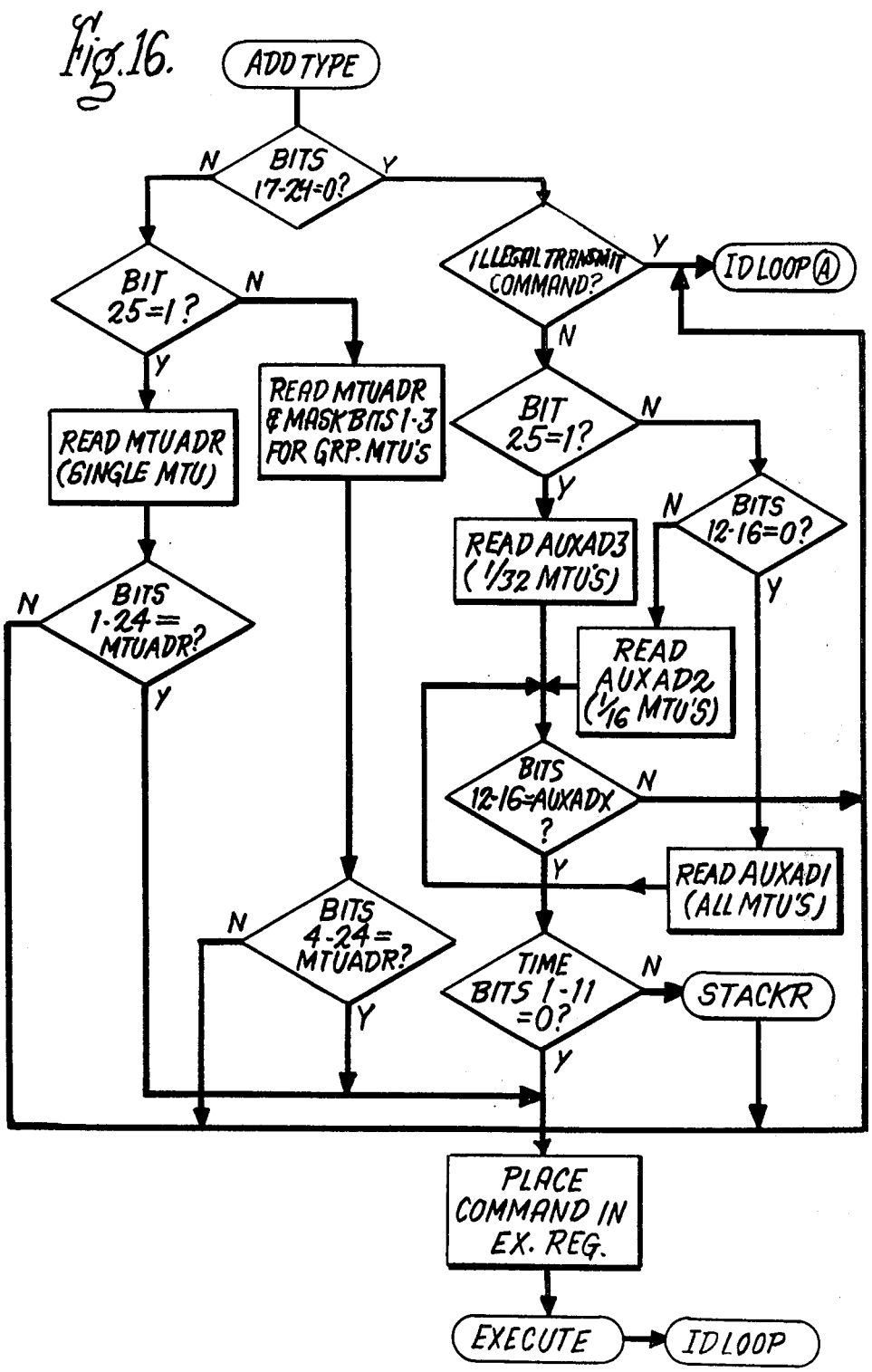

FIG. 16 depicts the steps of the method (ADDTYPE) of determining whether the command is one of the three block types, a group type or a single type, as previously described, and whether the received command is intended for this particular MTU. The microprocessor first tests bits 17 through 24 of the MTU Action Field of the received outbound command (see FIG. 5) which are stored in the (WORKSPACE) file to determine whether or not they are zero. If bits 17 through 24 are zero, this indicates that the received command is a single or group type command. At which time the microprocessor tests bit 25 to determine whether or not it is a "one". If bit 25 is not a "one", bits 1 through 3 are masked, that is, they are ignored, and bits 4 through 24 are compared with the contents of THIS MTU ADR location in the address PROM 104. If there is no match, this particular MTU has not received a valid group address and will return to point A of IDLOOP (see FIG. 14) to await further commands. If there is a match, the command contained in the function code field of the outbound command message (see FIG. 5) will be placed in the EXREG location (see FIG. 12) of the microprocessor internal RAM. The MTU will then execute the command, as will be subsequently described in conjunction with FIG. 22, after which it will return to point A of IDLOOP to await further commands.

Assuming that bit 25 was equal to one, this indicates that the address pertains to a single MTU. Consequently, the microprocessor will test received bits 1 through 24 against the contents of THIS MTU ADR in the address PROM which contains the address of this particular MTU. If bits 1 through 24 of the MTU Action Field match the contents of THIS MTU ADR, the function code portion of the received command will be placed in EXREG for execution as previously described. If there is no match, the microprocessor will return to point A of IDLOOP to await further commands.

Now assuming that bits 17 through 24 of the MTU action field of the received command are equal to zero, this indicates that the received command is a block-type. The microprocessor then tests to see if the received outbound command is legal by comparing the function code portion of the received outbound command with a prestored constant in the PROM representative of all legal function codes. If the received command is illegal, the microprocessor returns to point A of IDLOOP to await further commands.

Assuming a legal command has been received, bit 25 is tested to see if it is a "one". As previously stated, if bit 25 is a one, while bits 17 through 24 are zeros, this indicates a 1/32 level block address. On the other hand, if bits 17 through 24 are zeros and bit 25 is also a zero, this signifies either a 1/16 level MTU address or an all MTU address. Assuming that bit 25 is a zero, the microprocessor then tests to see if bits 12 through 16 are zeros. If bits 12 through 16 are zeros, the microprocessor then reads the information contained in AUXAD1, the contents of which pertain to an all MTU command, as previously described. The microprocessor then tests the contents of AUXAD1, a single bit in the preferred embodiment. If the AUXAD1 bit is zero, the microprocessor returns to point A of IDLOOP, signifying that this command was not meant for this particular MTU. If the AUXAD1 bit is a one, this command is to be executed by this particular MTU and the microprocessor then tests bits 1 through 11 of the MTU Action Field of the received command, which now represents a time as previously explained. If bits 1 through 11 are all zeros, this signifies that the command should be executed now; therefore, the command contained in the function code portion of the received command is placed in EXREG for subsequent execution as previously described. If bits 1 through 11 are not equal to zero, this indicates a command which should be executed at some time in the future (an execute hence command) whereupon the microprocessor will perform the steps of the stacker (STACKR) subroutine. The STACKR subroutine will be subsequently described in conjunction with FIG. 17.

If bits 12 through 16 of the MTU Action Field are not all zeros, the microprocessor will then read the contents of AUXAD2 since this condition is indicative of a 1/16 level MTU address. Bits 13 through 16 are then compared with the contents of AUXAD2 to determine whether or not the received command was intended for this particular MTU. If not, the microprocessor will return to point A of IDLOOP to await another command. If so, it will test the time bits 1–11 and proceed as previously described. If bit 25 was equal to one, this is indicative of a 1/32 level block address and therefore, the microprocessor will read the contents of AUXAD3 and compare it with bits 12 through 16 of the MTU Action Field of the received command to determine whether or not the received command was intended for this particular MTU. If not, the microprocessor will return to point A of IDLOOP to await a further command. If so, this means that this command was designated for this particular MTU whereupon the microprocessor will test time bits 1 through 11 and continue as previously described.

Figure 17:
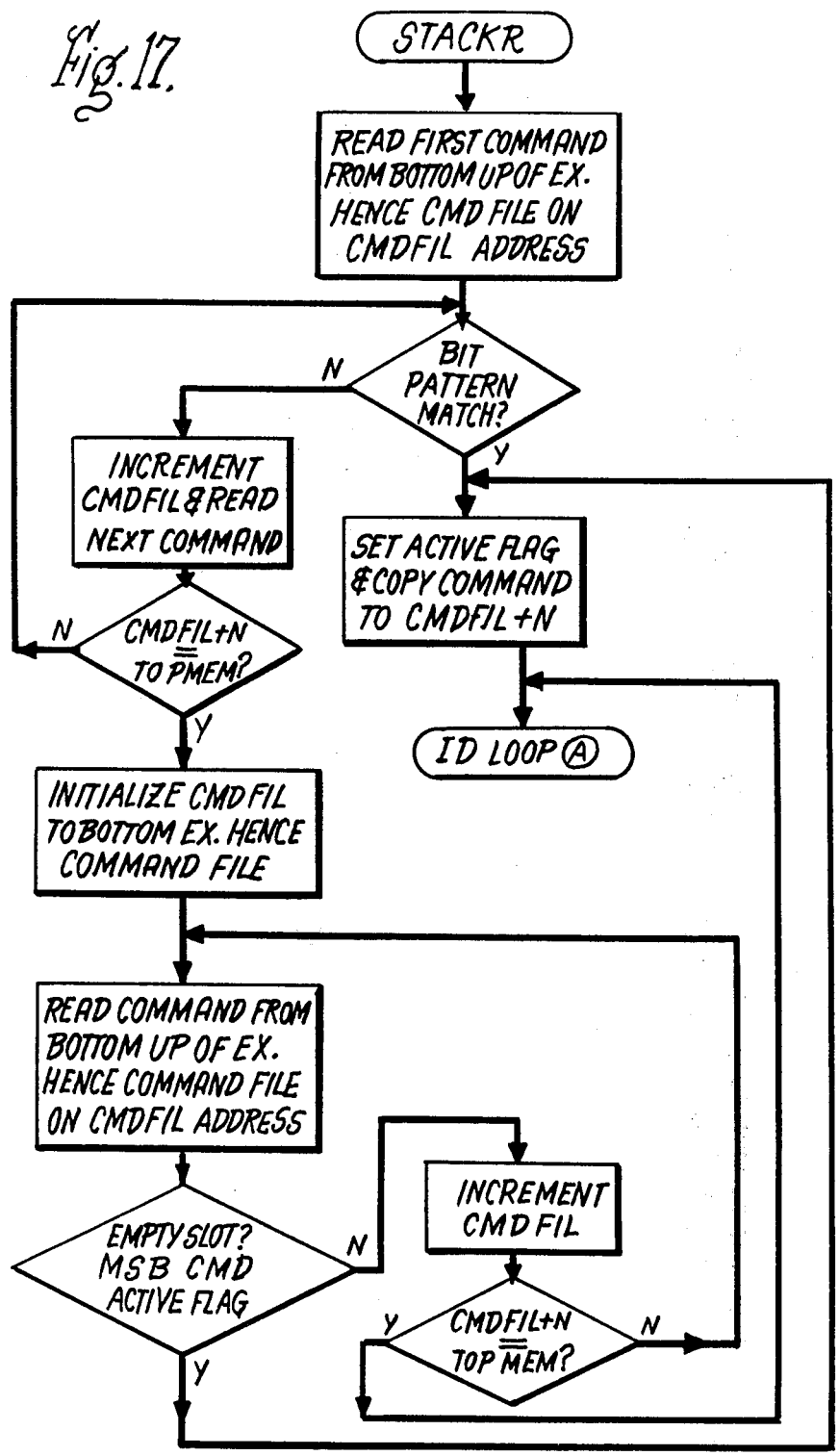

As previously stated, assume that the time bits 1 through 11 of the MTU Action Field of the received command are not equal to zero. This is indicative of an execute hence command and the microprocessor will thereupon carry out the steps of the STACKR method. These steps are shown in FIG. 17. The STACKR method is used to place the received command in the EXECUTE HENCE COMMAND FILE portion of the microprocessor internal RAM while being certain that it does not write over something that is already contained therein. Consequently, this method is used to search the EXECUTE HENCE COMMAND FILE stack to see if a command of the same type is already there. If the command is already on the stack, the new time is substituted for the old. In carrying out this method, the microprocessor will read the first command location up from the bottom of the EXECUTE HENCE COMMAND FILE stack (CMDFIL+1). It then tests the bit pattern contained in the function code field of the received command which has temporarily been placed in a WORKSPACE file register against the bit pattern of the contents of CMDFIL+1 to determine if there is a match. If they match, the active flag F of that particular register is set (see FIG. 13) and the command as well as the time bits 1 through 11 will be copied into the relevant locations of the execute hence command file (in this example CMDFIL+1, 2 & 3). This step is performed in order to write over old execute hence commands where you want to change the time of execution. Note, as previously stated, the status of the active flag bit F indicates whether or not the associated command is an active one. If it is active (F=1), it will be executed at the proper time out, whereupon the active flag will be set to zero, as will be subsequently described. After the active flag bit F has been set=1 and the command has been copied into the appropriate location in the EXECUTE HENCE COMMAND FILE, the microprocessor will return to point A of IDLOOP to await further commands.

If there was no bit pattern match, CMDFIL is incremented and the next command is read. The microprocessor will test CMDFIL+N to see if it equals TOPMEM. If not, it will again perform a bit pattern match and continue as previously described. If CMDFIL+N equals TOPMEM, CMDFIL will be initialized to its previous contents which indicate the bottom of the EXECUTE HENCE COMMAND FILE stack. The microprocessor then again reads the contents of CMDFIL+1 to determine whether or not this location is empty. To do this, the microprocessor tests to see whether the active flag bit is zero. If the active flag is a one, indicating that an active command has been stored therein, CMDFIL will be incremented by one and tested to see whether or not it equals TOPMEM. If CMDFIL+N=TOPMEM, this indicates that the microprocessor has searched the entire EXECUTE HENCE COMMAND FILE stack whereupon it returns to point A of IDLOOP to await a further command. If CMDFIL+N does not equal TOPMEM, the microprocessor will read the next higher location in the EXECUTE HENCE COMMAND FILE stack and check for an empty slot as previously described. If an empty slot is found, the microprocessor will set the active flag bit equal to one and copy the command into the empty slot then return to point A of IDLOOP to wait for the next command.

Figure 28:
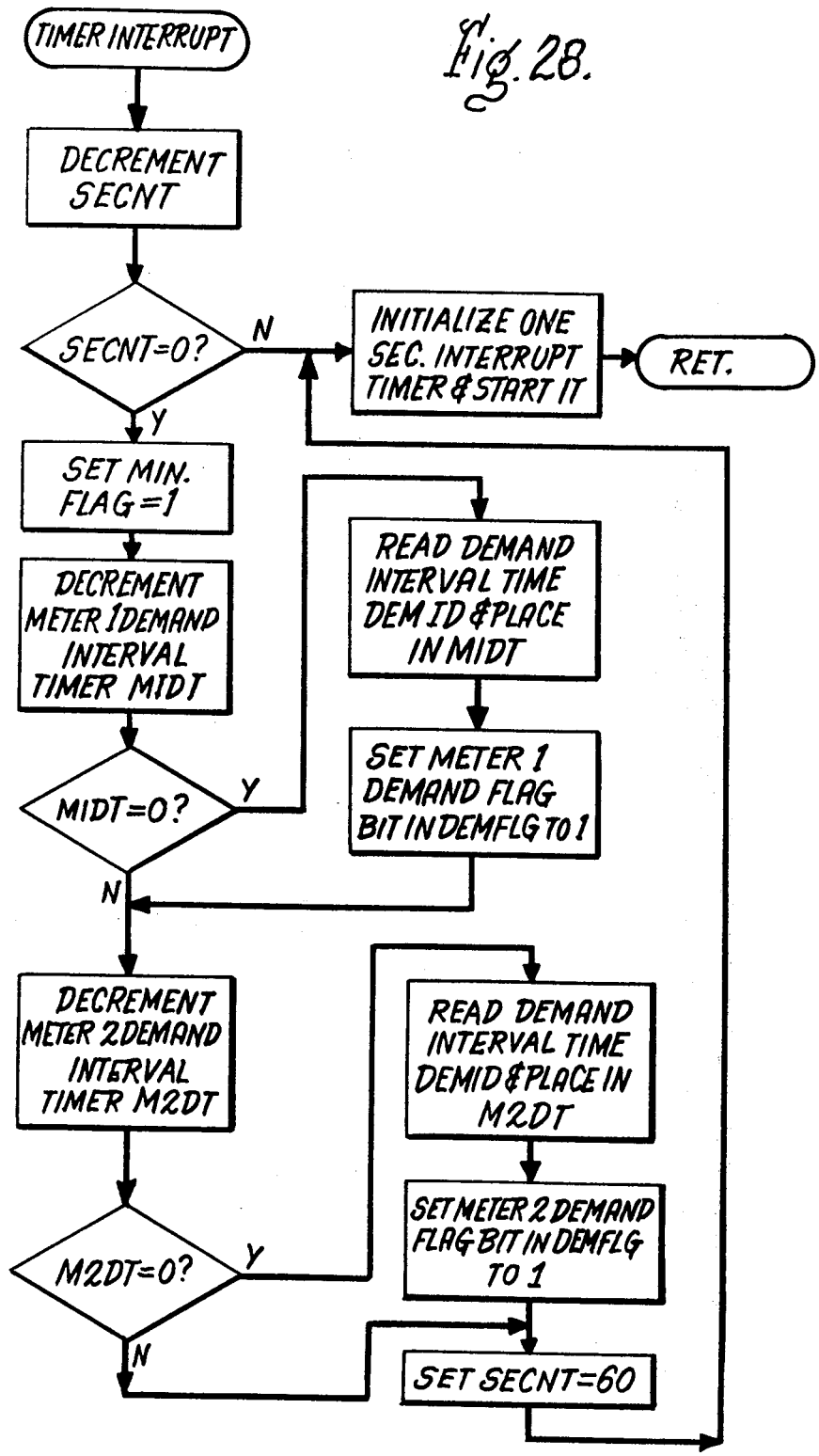

Referring to FIG. 28, there is shown a flow chart depicting the steps of a timer interrupt subroutine (TIMER INTERRUPT) which issues on internal interrupt every second. When this interrupt occurs, the microprocessor ceases what it was doing, goes immediately to the TIMER INTERRUPT subroutine, executes it, then returns to what it was previously doing. The contents of the seconds counter register (SECNT), which was initially set to sixty as previously described, will be decremented by one. The contents will then be tested to see whether or not they are equal to zero. If not equal to zero, the one second interrupt timer will be initialized and started whereupon the microprocessor will return to the method step it had been carring out previously. Assuming that the contents of SECNT have been decremented 60 times, then SECNT will equal zero (this happens once a minute since SECNT is decremented once every second). At this time, the minute flag F1 will be set equal one. The contents of M1DT (meter 1 demand interval timer) will be read, decremented by one and tested to see if the resultant equals zero. If so, the microprocessor will read the contents of DEMID (the programmed demand interval time placed in the address PROM) and place the contents in M1DT. This in effect replaces the zero contents of M1DT by the preprogrammed demand interval time, thereby effectively initializing M1DT for future use. Next, the meter 1 demand flag bit M1 in the DEMFLG register of the internal RAM is set to one (see FIG. 12). Note that when M1 of DEMFLG is set equal to one, this indicates that the end of the demand interval for that meter has occurred.

Next, the contents of M2DT (meter 2 demand interval timer) is decremented by one. The contents of M2DT are then tested to determine whether or not they equal zero. If they equal zero, the demand interval time contained in DEMID is read and placed in M2DT in a manner similar to that described for M1DT. The meter 2 demand flag bit M2 in DEMFLG is then set equal to one. Next, the contents of SECNT is set equal sixty, the one second interrupt timer is initialized and started whereupon the microprocessor returns to its previous duties.

As apparent from the preceeding description, the timer interrupt subroutine causes M1DT and M2DT, which locations contain the remaining time for execute hence commands, to be decremented once a minute. When the contents of these registers equal zero, this means that the time interval has elapsed and the associated command is to be executed as will be subsequently described. At this time, this program causes whichever of these registers which has been decremented to zero to be updated by the demand interval time information which is permanently contained in DEMID of the address PROM. Note also that the minute flag F1 is set equal to one at least once a minute by this subroutine. This indicates, referring to FIG. 14, that you must have at least one time interrupt (F1=1) in order to get out of the idle loop and execute a program instruction. Consequently, if RC is not high, and F1 equals one, indicating a timer interrupt has occurred, the microprocessor can then go to the routing (ROUTNG) subroutine.

Figure 18:
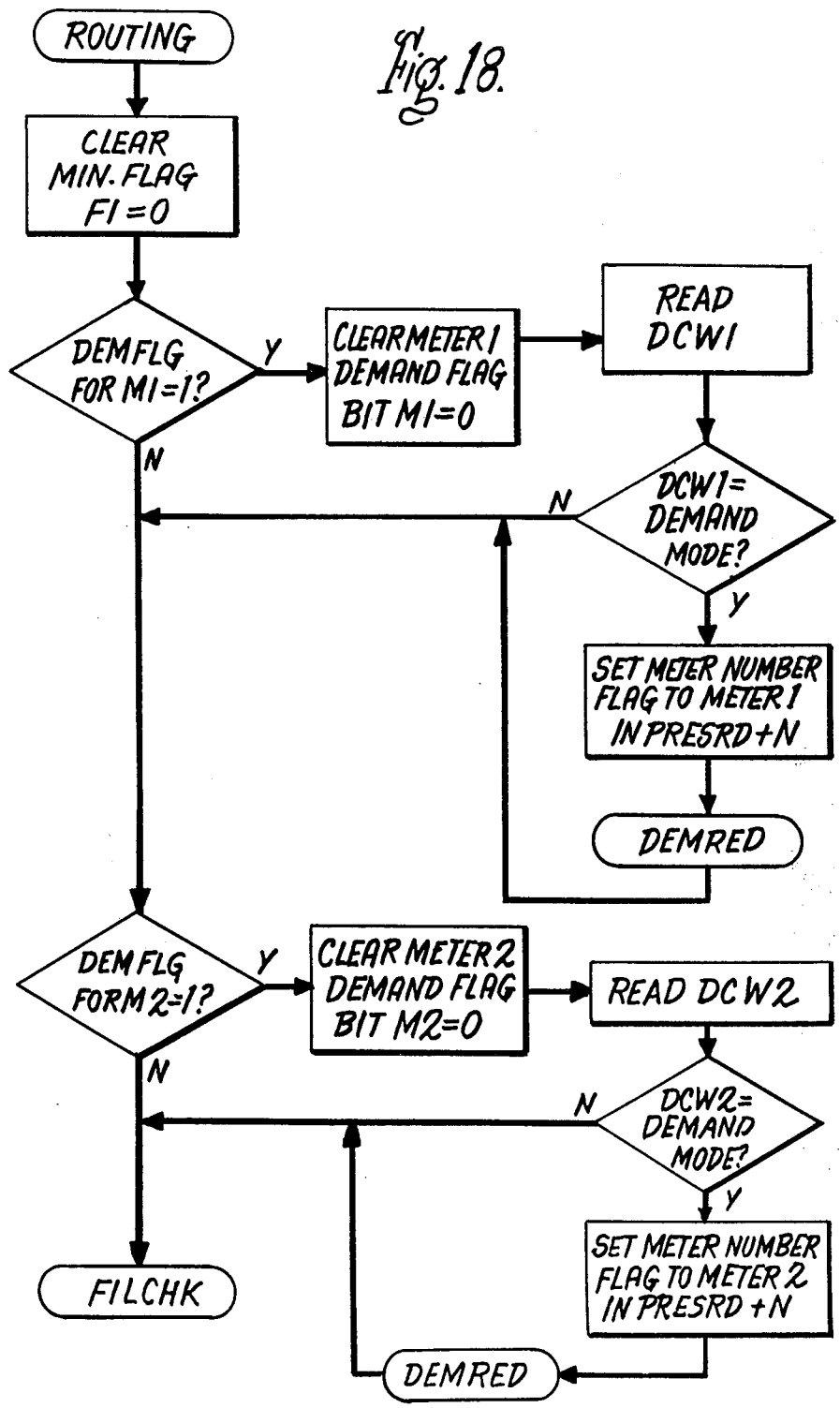

Referring to FIG. 18, it can be seen that upon entering the ROUTNG subroutine, the microprocessor will reset the minute flag F1 equal to zero. Next, the DEMFLG register of the internal RAM will be tested to see whether or not the M1 bit equals one. In the preferred embodiment, bit 0 in the M1 bit and bit 1 is the M2 bit. If M1 equals 1, this indicates the end of a demand interval, as previously stated. Consequently, M1 will be reset to zero, and the microprocessor will read the demand control word #1 located in DCW1 and thereafter test to see whether or not meter 1 is in a demand mode. If DCW1 contains all ones, the demand is off. If the contents are not all ones, then DCW1 contains the address of the demand register (DEMREG) where a previous meter reading has been stored. In other words, if a previous demand reading was performed, DCW1 would contain the address of the DEMREG located in the meter encoder data RAM containing the previous demand reading. If meter 1 is in the demand mode, the meter number flags M1, M2 in the PRESENT READ AREA file (PRESRD+6, in the preferred embodiment as shown in FIG. 13) to meter 1 (that is, M1=0, M2=0). Whereafter, the demand read (DEMRED) subroutine will be performed as will be subsequently described in conjunction with FIG. 18. After performing DEMRED, the microprocessor will then perform the same functions with respect to meter 2 as were described above with respect to meter 1. If both M1 and M2 of DEMREG are not equal to one, this is indicative that the demand interval has not yet expired for either meter 1 or meter 2, since, as previously described, M1 equal one or M2 equal one signifies the end of the demand interval for that particular meter. At this point, the microprocessor is ready to perform the file check (FILCHK) subroutine.

Figure 19:
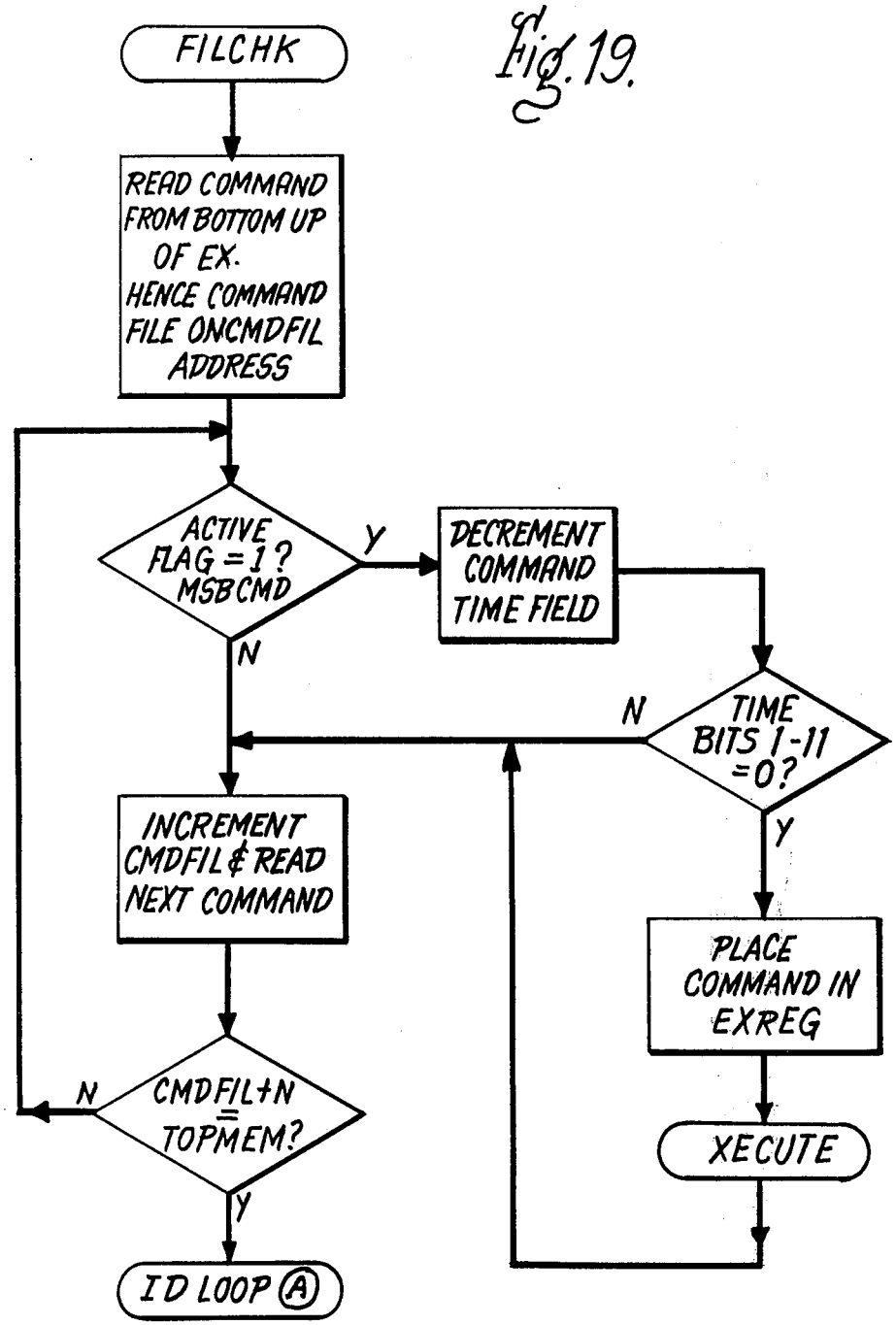

Referring now to FIG. 19, there is shown the steps comprising the FILCHK subroutine. It should be noted that every time FILCHK is entered, the microprocessor executes all active commands (that is, those commands having associated time bits equal to zero); otherwise, the time bit field is decremented by one and the microprocessor returns to point A of IDLOOP. Note that since FILCHK is entered from ROUTNG which in turn is entered when the receive clock (RC) is low and F1 equals one (approximately once a minute), the microprocessor searches for active commands approximately once a minute. To perform this search and execute method, commands are read from the bottom up of the EXECUTE HENCE COMMAND FILE stack on the CMDFIL address pointer. This is performed in a manner similar to that described with respect to the STACKR subroutine. At each command location, the active flag bit F the most significant bit of the particular COMMAND register, in the EXECUTE HENCE COMMAND FILE stack (see FIG. 13), will be tested to see if it is equal to one. If the active flag bit F equals one, the contents of the time field registers (TIME) associated with that command will be decremented by one. At this time, the 11 time bits in these time field registers will be tested to see if they are all zeros. If all are equal to zero, the command is ready for execution. Consequently, the contents of the associated COMMAND register, which contains the previously stored function code portion of properly received outbound command, will be placed in the execution register (EXREG), afterwhich the execute subroutine (XECUTE) will be performed. Upon completion of the XECUTE subroutine, CMDFIL will be incremented by one in order to read the next command. CMDFIL+N will be tested to see if it equals TOPMEM. If so, the entire EXECUTE HENCE COMMAND FILE stack has been read and the microprocessor will return to point A of IDLOOP to await a further command. If not, the microprocessor will then read the next higher command in the EXECUTE HENCE COMMAND FILE stack, test for the active flag bit F status and repeat the steps previously described. Note that in addition to searching for and executing active commands having time bits equal to zero every minute, this subroutine will cause the existing time fields to be decremented by one once a minute, thereby effecting a time field countdown, one minute at a time.

Figure 20:
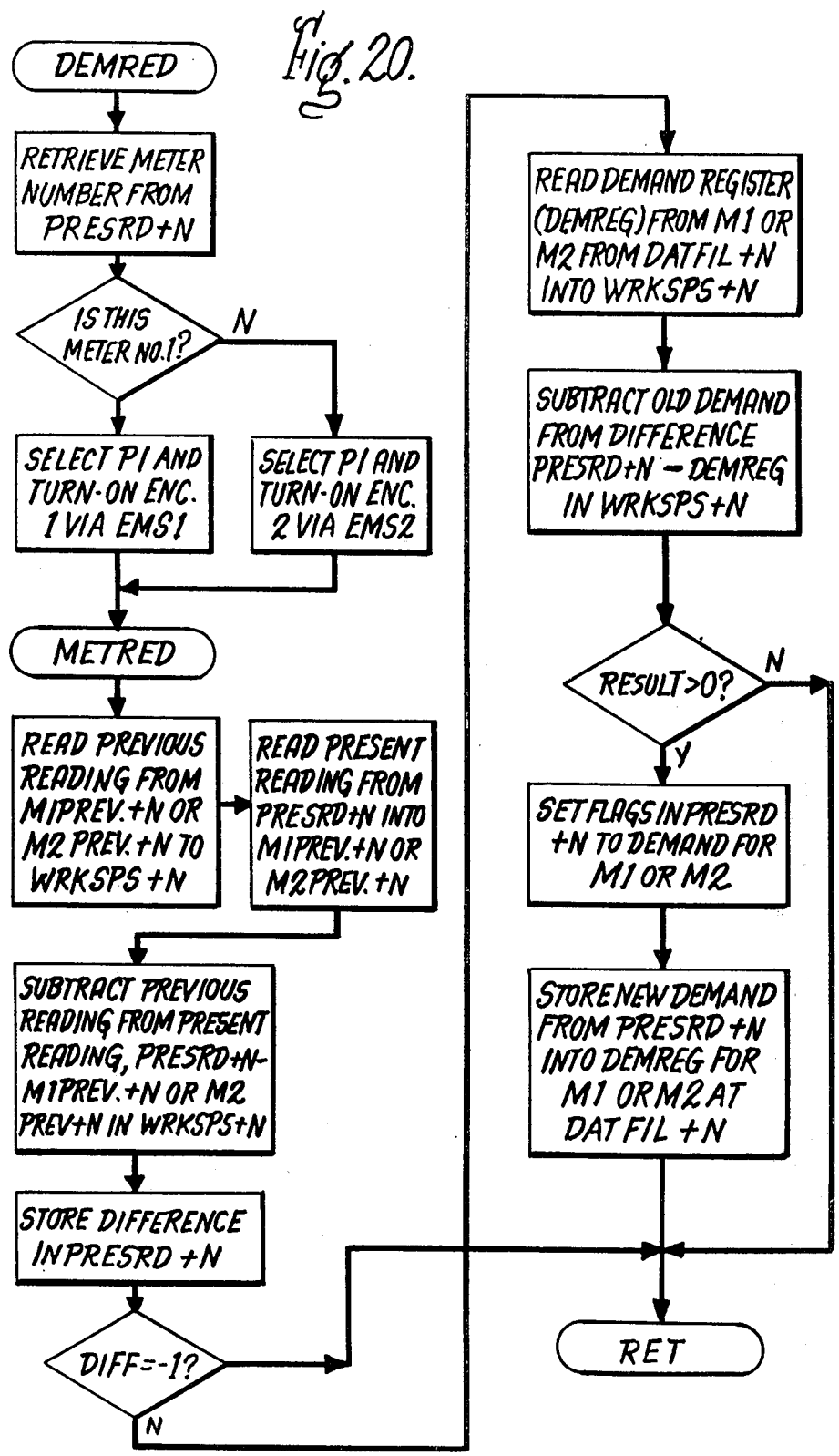

Returning now to FIG. 18, it should be noted that if either DCW1 or DCW2 has been determined to be in a demand mode, it is time to perform the steps of a demand read (DEMRED) subroutine. Referring now to FIG. 20, and assuming, for purposes of simplified explanation, that DCW1 is in a demand mode, and the meter number flags M1, M2 in PRESRD+6 have been set to zeros to indicate meter 1, the steps of DEMRED will be performed for meter 1. Note that under similar circumstances, this would also be performed for meter 2 and if both are indicated, DEMRED will be performed twice, one for each meter.

To perform DEMRED, the meter number (M1, M2 flags) is retrieved from PRESRD+6 (see FIG. 13). A test is made to see if this is meter 1 (M1+M2=0). If not, it is meter 2 and the microprocessor will select port 1 (P1) and turn on the meter 2 encoder by raising a signal on EMS2, as previously described with respect to FIGS. 10 and 11. If meter 1, then the microprocessor will select P1 and turn on the meter 1 encoder by way of a signal on EMS1 (see FIGS. 10 and 11). At this point, the microprocessor would then perform the steps of a meter read (METRED) subroutine, which essentially comprise reading the meter which was selected and storing that meter reading in the present read area of the internal RAM as will be subsequently described in conjunction with FIG. 21. After completing the steps of METRED, the previous reading (if any) is read from M1 PREV+N (or M2 PREV+N in the case of meter 2) in the PREVIOUS READINGS FOR DEMAND METER (1 or 2) stack (see FIG. 12) to WRKSPS+N in the WORKSPACE file of the internal RAM. Next, the present reading is read from PRESRD+N into M1 PREV+N (or M2 PREV+N in the case of meter 2). Next, the previous reading (now contained in WRKSPS+N) is subtracted from the present reading (PRESRD+N) and the difference is stored in PRESRD+N. Next the difference will be tested to see whether or not it equals −1. If the difference is equal to −1, this indicates that there has been no increase in demand (that is, the present reading is smaller than the previous reading), at which time the microprocessor will return to the appropriate point in the ROUTNG subroutine which was previously described.

If the difference is not equal to −1, this indicates that a new demand must be determined because the present reading is greater than the previous reading. Consequently, the contents of the appropriate demand register (DEMREG for meter 1 or meter which contains the old demand value) located at DATFIL+N is read then written into WRKSPS+N. Next, the old demand, which is in WRKSPS+N, is subtracted from the difference, which is in PRESRD+N. The result is then tested to see if it is greater than zero, if it is not greater than zero, the old demand is greater than the new demand; therefore, nothing more need be done and the microprocessor will return to the appropriate location in the ROUTNG subroutine. If the result is greater than zero, the old demand must be updated. Therefore, the flags F1, F2 and F3 in PRESRD+6 (see memory map 2) are set to indicate new demand data (in the preferred embodiment, a bit pattern of 001 for flags F1, F2, and F3 indicates new demand data. As previously stated, a bit pattern of 00 for M1 and M2 indicates meter 1. Next, the new demand, which was located in PRESRD+N will be written into the demand register (DEMREG) for meter 1 (or meter 2 as the case may be) at DATFIL+N. The DEMREG may be any one of registers A-C or E-G of the set of registers A-L. The processor will then return to the appropriate point in the ROUTNG subroutine.

Figure 21A:
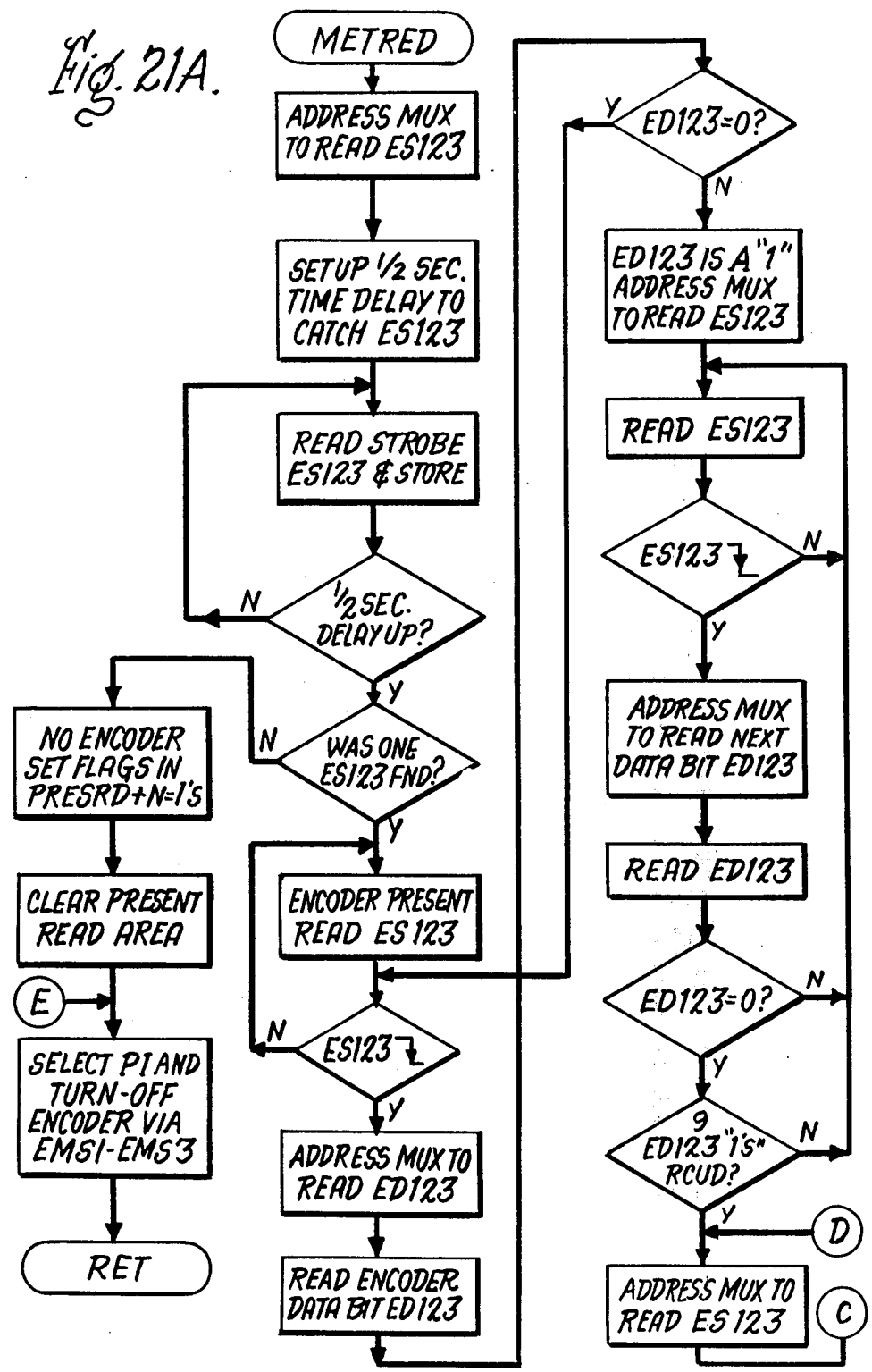
Figure 21B:
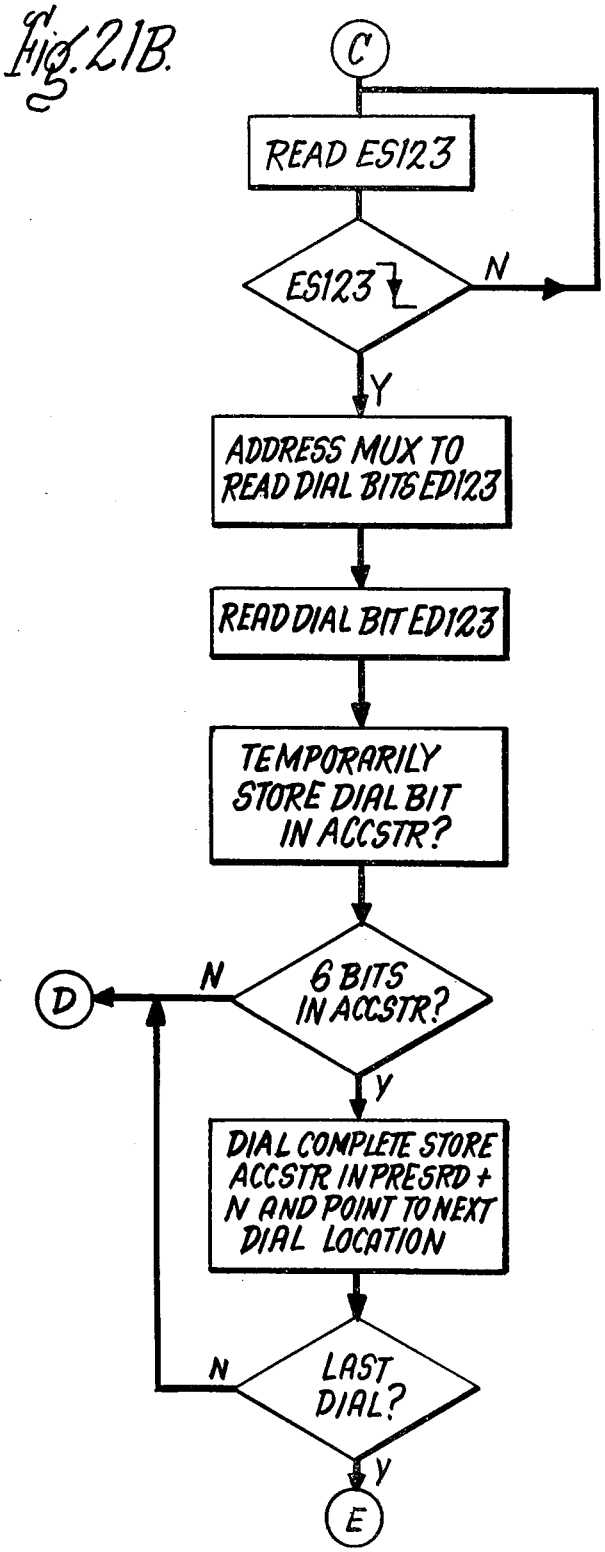

As previously stated, a selected meter encoder is read in accordance with steps of a meter reading (METRED) subroutine, as shown in FIG. 21. First the multiplexer 96 is addressed to read the selected encoder strobe (ES 1, 2, or 3). Next, there is a built in program time delay ($\frac{1}{2}$ second in the preferred embodiment) to allow the encoder motor to get up to speed. The selected encoder strobe (ES1, 2 or 3) is then read and stored in the accumulator. If the program time delay ($\frac{1}{2}$ second) is not up, the encoder strobe is read and stored until the $\frac{1}{2}$ second delay is up at which time the accumulator is tested to determine whether or not one encoder strobe was found. If not, the flags (F1, F2, and F3) in PRESRD+6 are set equal to one which, as previously indicated, designates that there is no encoder present. The present read area is then cleared and port 1 (P1) is selected to turn off the encoder by way of the proper line (EMS1-EMS3). At this time, the microprocessor returns to the program at the point which it was when it was instructed to read the meters.

Assuming one encoder strobe was found, the strobe (ES1, 2 or 3) will be read and continuation of the method will be delayed until the strobe goes from positive to negative. At this time, the multiplexer is addressed to read the encoder data (ED1, 2 or 3). Since the data is coming into the microprocessor serially over the multiplexer data line BUS 7, the bits must be read one at a time; consequently, the encoder data bit is read, and tested to see if it is zero. If it is zero, the microprocessor then waits for the encoder strobe to go from positive to negative again, as shown in FIG. 21. If the encoder data bit is a one, the multiplexer is addressed to read the encoder strobe again and the microprocessor waits until the encoder strobe goes from high to low at which time the multiplexer is addressed to read the next data bit on the appropriate line ED1, 2, or 3. The microprocessor reads that line and tests to see if it is zero. If it is not zero, the encoder strobe is read again and the microprocessor again waits for the strobe to go to zero before addressing the multiplexer as previously stated. If the encoder data bit is a zero, a determination is made as to whether or not the received data bits include nine "1's". If not, the microprocessor will return to read the appropriate strobe and continue searching as previously described. Note that in the preferred embodiment, a sequence of a "0" and nine "1's" signifies the start of meter data. Consequently, if nine ones have been received, the multiplexer is addressed in order to again read the strobe. The strobe is then read and the microprocessor waits for the strobe to go from high to low at which time the multiplexer is addressed to acquire the dial bits from the appropriate encoder data line, ED1, 2, or 3. The multiplexer places the first bit in the serial bit stream on BUS 7 which is then read and temporarily stored in ACCSTR. At this time, the microprocessor will test to see if there are six bits in ACCSTR. If not, the multiplexer will again be addressed to read the encoder strobe in preparation for reading the next dial bit. If all six bits have been read and are in ACCSTR, all the data bits relating to one dial have been acquired and stored in ACCSTR. At this time, the contents of ACCSTR is then read and stored in PRESRD+N. PRESRD is then incremented in order to point to the next dial data storage location. At this time, the microprocessor tests whether or not the last dial has been read, if not, the microprocessor will return to addressing the multiplexer in order to read ES1, 2 or 3 and bring in the next six serial bits relating to the next dial using the steps described above with respect to the first dial. If the last dial has been read, P1 is selected and the encoder is turned off via the appropriate line EMS1—EMS3 after which the microprocessor returns to the point in the processing where it was before it was instructed to read the meter.

Figure 22:
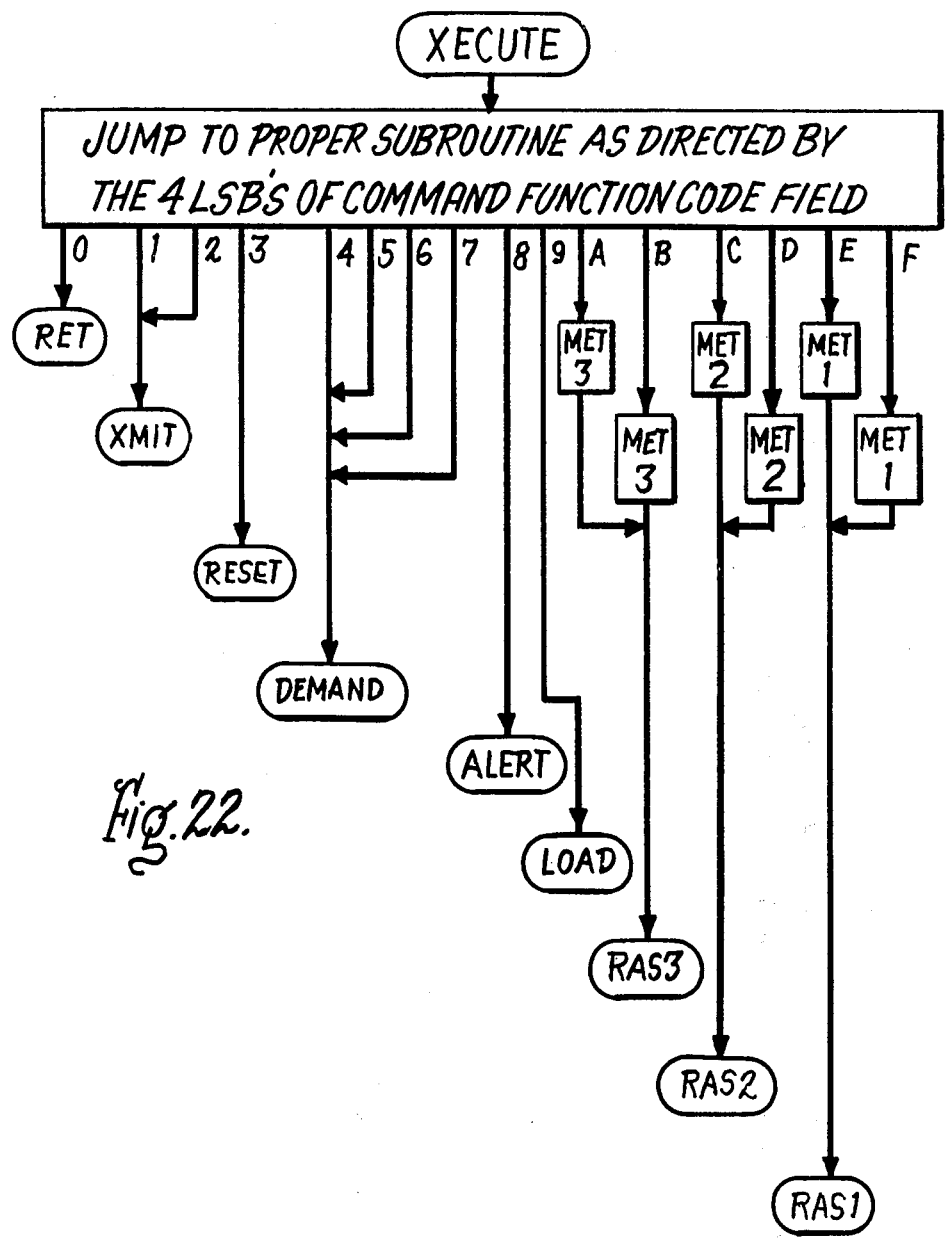

Referring to FIG. 22, there is shown the block diagram comprising the steps to be followed in the preferred embodiment for performing the execute (XECUTE) subroutine. Note that XECUTE can be entered from the ADDTYPE subroutine, if the address type is an execute immediate command which would include execute hence commands having all zeros in the time bit field. XECUTE can also be entered from FILCHK, which would call for the execution of an execute hence command after the time bits relating to that command have been decremented to zero. Note that in both ADDTYPE and FILCHK, the command is placed in EXREG prior to entering XECUTE. As shown in FIG. 22, after entering XECUTE, the microprocessor will jump to the proper subroutine as directed by the four least significant bits of the command function code field in the outbound command received by the MTU. (See FIG. 5). If the microprocessor detects four zeros in the function code field, it will return to the program it was previously executing since, as shown in the function code matrix depicted in FIG. 9, this is not a command which is executable by the MTU. If the microprocessor decodes a one or a two (hexadecimal), it recognizes this as a transmit command and will then proceed to the transmit (XMIT) subroutine. This is also in accord with the matrix as shown in FIG. 9. The steps of XMIT will be subsequently described in conjunction with FIG. 23. If the microprocessor decodes a three (hexadecimal) in the function code field, it will proceed to carry out the steps of the reset subroutine (RESET) which is again in agreement with the matrix shown in FIG. 9. The steps of RESET will be subsequently described in conjunction with FIG. 24.

If the microprocessor decodes a four, five, six or seven (hexadecimal), it will proceed to carry out the steps of the demand subroutine (DEMAND), again in agreement with the matrix shown in FIG. 9. The steps of DEMAND will be subsequently described in conjunction with FIG. 25. If the microprocessor decodes an eight (hexadecimal), it will proceed to the alert (ALERT) subroutine. If the microprocessor decodes a nine (hexadecimal) in the function code field, it will proceed to the load (LOAD) subroutine. The steps of ALERT and LOAD will subsequently be described in conjunction with FIG. 26.

If the microprocessor decodes an A or B (hexadecimal) in the function code field, it will recognize this as a read and store command for meter 3 and as a result will proceed to carry out the steps of the read and store (RAS) subroutine for meter 3. If the microprocessor decodes a C or D (hexadecimal) in the function code field, it will proceed to carry out the steps of the RAS subroutine for meter 2. Finally, if the microprocessor decodes an E or F in the function code field, it will carry out the steps of the RAS subroutine for meter 1. The steps of RAS will subsequently be described in conjunction with FIG. 27.

Proceeding now to FIG. 23, there is shown the steps of the transmit (XMIT) subroutine. The first step is to test to see whether the function code bits five through seven signify transmit status (this would be a decoded seven (hexadecimal) in the preferred embodiment as shown in the matrix of FIG. 9). If bits five to seven equal the transmit status code the MTU has been commanded to transmit the status of the six external contacts as previously described in conjunction with FIGS. 10 and 11. The MTU address contained in MTUADR is then read into WRKSPS+N. Next, the multiplexer is addressed to read status, afterwhich the status appearing on the first status line of the six lines (ST1-ST6) is read from BUS 7 and placed in ACCSTR. The multiplexer address will then be decremented by one and tested to see whether or not all of the status lines have been read. If not, the new multiplexer address will be input to the multiplexer to read the next status line. If all status lines (ST1-ST6) have been read, the stored status bits will be read from ACCSTR into WRKSPS+N.

If, as described above, function code bits five through seven did not signify transmit status, then the command is interpreted as transmit the contents of a designated register at DATFIL+N, determined by bits five through seven of the function code field, to retrieve the reading stored therein. This reading is then stored in WRKSPS+N. Note that in accordance with the steps shown in FIG. 23, WRKSPS+N now contains either a meter reading or status. At this time, the receive clock (RC) will be tested to determine its level. If not high, the microprocessor will wait until RC becomes high at which time it will then enable port 2 (P2) and drive the inbound transmit data line (IBTD) to "zero". Waiting for RC to go high is necessary in order to synchronize the transmission with respect to the first transmit clock (TC) following RC since, as previously described, the SCU expects an immediate receipt of message upon sending to the MTU an execute immediate transmit command.

After driving IBTD to zero, the microprocessor will wait until TC makes a transition from high to low. When TC goes low, the microprocessor then selects port 2 (P2) and turns on the inbound transmit gate (IBTG) in order to shift out the first start of message (SOM) bit. In the preferred embodiment, the inbound SOM sequence comprises six bits, all of which are zero. The microprocessor then tests to see whether or not all six SOM bits have been shifted out. If not, it will continue to shift out bits until all six are out. After all six SOM bits have been shifted out, the microprocessor will retrieve the meter reading or status now contained in WRKSPS+N and will wait for TC to make the transition from high to low. After TC has gone from high to low, the first data bit will be shifted out. The microprocessor will then test to see whether an entire word has been shifted out. If not, it will go back and wait for TC to go from high to low at which time it will shift out the next data bit. This will continue until the entire word has been shifted out at which time P2 is selected and IBTG is turned off. The transmit function has now been completed and the microprocessor will return to IDLOOP.

Upon receiving a reset execute command, the microprocessor will perform the reset (RESET) function as shown in FIG. 24. First, the PRESENT READ AREA of the internal RAM (see FIGS. 12 and 13) is cleared. The microprocessor will then address the register DATFIL+N specified by bits five through seven of the command contained in EXREG. The addressed register is then cleared and the microprocessor returns to point A of IDLOOP to await further commands.

Referring to FIG. 25, there is shown the steps of the DEMAND function. Note that DEMAND is executed when it is desired to either turn the demand feature of the present invention on or off. If demand is turned on, there must be a command in the stack to turn the demand off at some future time as previously stated. The first step is to read and store the contents of DCW1 or DCW2 (depending upon which meter the demand is associated with) in a general purpose register for future use. Next, the EXECUTE HENCE COMMAND FILE stack is searched starting with CMDFIL+1 and continuing in order to find out whether or not a counter command is contained within the file. In other words, the microprocessor is testing to see if a demand off command is in the file or if any other demand for the particular meter under consideration is in the file. If no countercommand is found at the first location, CMDFIL is incremented to read the next command. If CMDFIL+N is not equal to TOPMEM, the microprocessor reads the next command up as shown in FIG. 25. If CMDFIL+N equals TOPMEM, this indicates that the top of the memory has been reached at which time bit 1 of the function code is tested to see if it equals one. This function code bit indicates whether or not the command deals with meter 1 (FC bit 1=1) or meter 2 (FC bit 1=0). If FC bit 1=1, the previous contents of DCW1 will be read, if FC bit 1=0, the previous contents of DCW2 will be read. Next, the previous contents of DCW(1 or 2) is tested to see if it is a demand off. If yes, then the microprocessor returns to point A of IDLOOP to await further commands. If no (meaning that the previous DCW is not a demand off thereby signifying that this particular meter is in a demand interval), the proper DCW is set to demand off by placing all ones in either DCW1 or DCW2 as appropriate. (See FIG. 13).

The read register (RDREG) is set to the previous demand register address (DATFIL+N) specified by the previously stored DCW1 or DCW2 in order to get a final demand calculation for this demand interval. At this point, the contents of DEMID (which is the time interval specified by the customer and programmed into the address PROM) is read into M1DT or M2DT as appropriate. This is performed in order to start a new demand interval for the selected meter. After this, the microprocessor will then perform the function DEMRD as previously described in conjunction with FIG. 20.

Returning to the test for whether or not a countercommand was found, assume a countercommand has been found. The microprocessor then tests to see if the command in EXREG is a demand off command. If it is, the microprocessor then tests to see whether bit 1 of the function code (FC) is equal to 1 as previously described. If the command in EXREG is not a demand off, the microprocessor follows the demand on path. Next, after testing to see if it is dealing with meter 1 or meter 2 by testing FC bit 1 to see if it is equal to 1, the microprocessor stores the new demand register number in DCW1 (if dealing with meter 1) or DCW2 (if dealing with meter 2). Note that DCW (1 or 2) now stores the new demand register number which was in the command just received. The microprocessor now tests to see whether or not the old demand control word (DCW) is a demand off (contents of DCW=all "1's"). If not, RDREG is set to the old demand register address DATFIL+N specified by the previously stored DCW1 or DCW2 in order to preserve this information for a demand read calculation. After this, the microprocessor then reads DEMID into M1DT or M2DT as previously described before going to the DEMRED subroutine. If the old command is a demand off, this indicates that a new command interval should be started by turning demand on. Consequently, RDREG is set to the new demand register address DATFIL+N as specified by the command. This in effect is specifying a specific one of the demand registers (DEMREG) as shown in the memory map of FIG. 12. Next the previous reading stored in M1PREV+N or M2PREV+N is cleared since the demand has not been on. The microprocessor then reads DEMID into M1DT or M2DT as previously stated before going into the DEMRED subroutine. At this point, the correct contents of DCW (1 or 2) have been established.

Referring now to FIG. 26a there is shown the alert (ALERT) function which comprises selecting port 1 (P1) and turning on or off the alert signal lines (AS1 or AS2) in accordance with the contents of the function code field in EXREG. The preferred decoding is shown in the matrix of FIG. 9.

Referring to FIG. 26b, there is also shown the steps of the load (LOAD) function. This function causes the MTU 18 to turn the loads 58 on or off. First, bits 17 through 24 of the MTU Action Field received outbound command (see FIG. 5) are tested to see if they are equal to zero. This specifies whether or not the received command contains a block address (bits 17 through 24 equals 0) as previously described. If the received command contains a block address, it is an execute hence command; if not a block address, then it is an execute immediate command, as previously described. Assuming that the received command is an execute immediate command (bits 17 through 24 not equal to 0) P1 is selected and the loads are switched in accordance with signals placed on the load signal lines (LS1-LS3) per the function code bits one through seven contained in EXREG. Refer to the matrix shown in FIG. 9 to determine the particular command associated with bits one through seven in the function code field. Note that a command such as this might be used in a situation where it is desired that the loads connected with a particular MTU be turned off indefinitely. After performing the commanded load switching, the microprocessor will then return to point A of IDLOOP and wait for the next command.

If bits 17 through 24 are equal to zero, this indicates a block address, whereupon the microprocessor will search the EXECUTE HENCE COMMAND FILE stack from the bottom up to see if there is a "load on" command in file for the load or loads which have been commanded to be turned off. This is accomplished as previously described with respect to the DEMAND function, by reading CMDFIL+1 to determine whether or not there is a command match and load on. That is, the microprocessor will test to see if the command that was just read is matched by a command already in the file and also to see whether or not it is a command on. If there is a match, this indicates that there is a command present to turn the load on at some further point in time. Consequently, the microprocessor will then execute the load off command by selecting port 1 and switching the loads as previously described. If there is no command match and load on command, CMDFIL+1 will be incremented in order to read the next command. At this time, CMDFIL+N will be tested to see if it equals the top of memory. If so, the microprocessor will return to point A of IDLOOP and await the next command. If not, it will continue to search the command file to see whether or not there is a command match and load on. Note that if the microprocessor does not find a matching load on command, then it will be unable to execute a load off and will simply return to point A of IDLOOP to await a further command.

Referring now to FIG. 27 there is shown the steps for performing the read and store functions (RAS) for meters 1, 2 or 3. As stated previously, in connection with the XECUTE function, the four least significant bits of the function code field are decoded in order to determine whether meter 1, 2 or 3 is to be read (see FIG. 9). Keeping this in mind, the meter number is retrieved from location PRESRD+6, as shown in FIG. 13. The M1, M2 locations are decoded in order to find which meter is concerned. For example: 00 indicates meter 1; M1=0, M2=1 indicates meter 2; and M1=1, M2=0 indicates meter 3. Port 1 (P1) is then selected and the relevant meter encoder motor is turned on by way of the appropriate line EMS1, EMS2 or EMS3 (see FIG. 11). Next, RDREG is set to the register address of DATFIL+N in order to receive meter data. Note, M1, M2 of PRESRD+6 is used to indicate which meter is being dealt with. Bits 5-7 of the function code determine which register the meter data will go into. Next the METRED function will be performed whereupon the microprocessor will read the meter data from PRESRD+N. This meter data will then be stored in the appropriate register at DATFIL+N which was specified by the contents of RDREG (which specifies to the microprocessor which register, (A-H, J-L) the data will be placed into). After this, the microprocessor returns to point A of IDLOOP to await the next command.

SECTION CONTROL UNIT (SCU)

Figure 29:
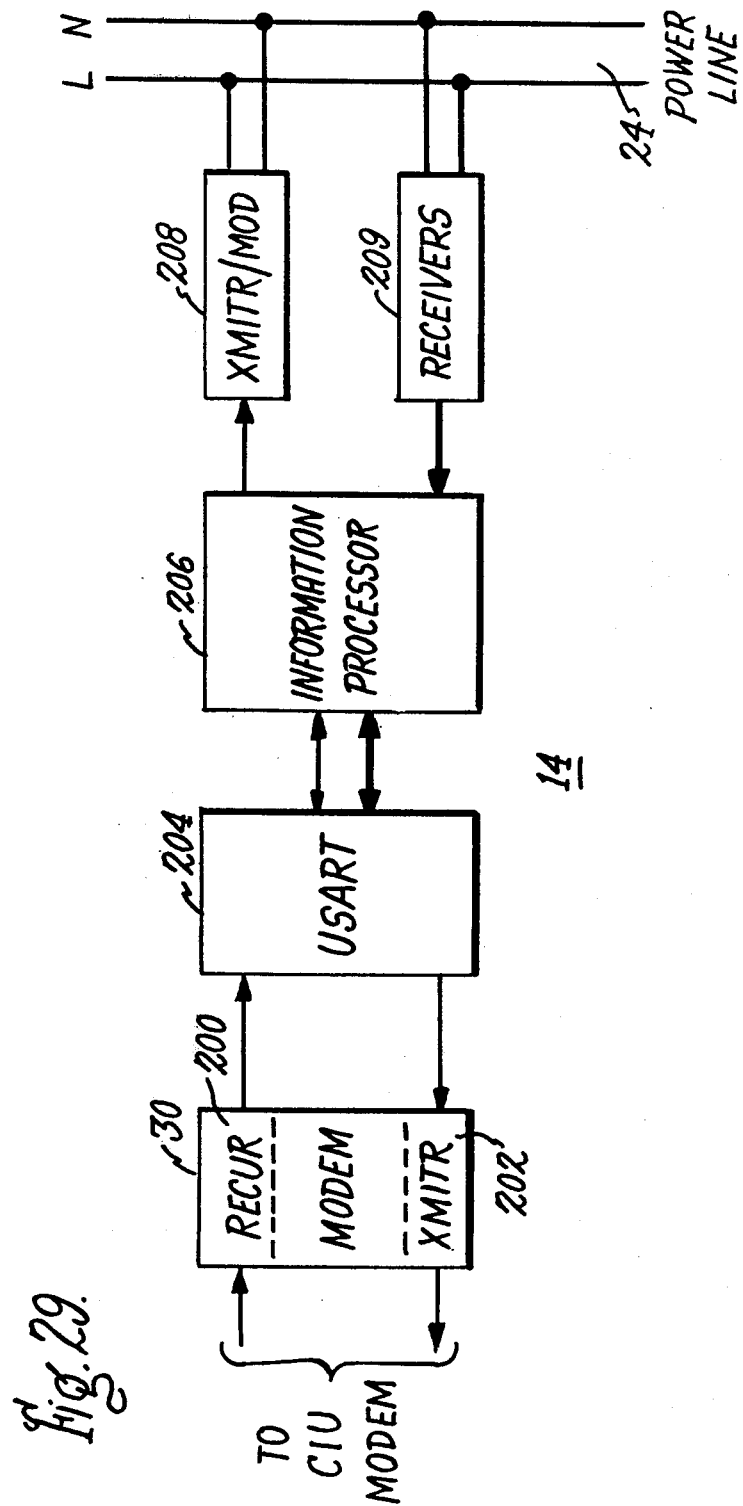
FIG. 29 is a major block diagram of a section control unit of the present invention.

The SCU 14 has been briefly described in the system description of the invention in connection with FIG. 1. In that description it was pointed out that the SCU communicates with the RCC over a conventional telephone line connecting the RCC to the SCU through two matching telephone modem transmitter receivers. Reference is now made to FIG. 29, which is a major block diagram of a typical SCU 14 showing its modem 30 which communicates with the RCC or the CIU and its modem as shown in FIG. 1. In essence, there are two lines connecting the SCU modem with the CIU modem wherein the SCU modem receiver 200 senses the tone or carrier signal transmitted by a matching transmitter in the modem at the RCC. In a similar fashion, the SCU modem transmitter 202 transmits a carrier signal back to a matching modem receiver in the RCC.

Still referring to FIG. 29, the SCU modem 30 communicates in serial form with a conventional universal synchronous asynchrouous receiver transmitter circuit shown as a USART 204. The USART is a conventional integrated circuit chip such as an 8251 A manufactured by Intel Corporation. The primary purpose of the URSART is to receive outbound commands from the modem receiver 200 in serial form and assemble those commands into parallel format for transmission or transfer to an information processor 206. The USART also receives message information from the information processor in parallel form and converts that information to serial form for subsequent transfer to the RCC via the SCU modem transmitter 202. As will subsequently be described, the USART IS program controlled from the information processor which may comprise, for example, a conventional microcomputer such as in Intel 8035.

The information processor, in response to outbound commands from the RCC, is designed to react to those commands to transmit information or commands via a transmitter modulator (XMITR/MOD) 208 onto the powerline feeder 34 and out to the MTU's 18. The information processor 206 also responds to outbound commands from the RCC 12 to receive information from the MTU's 18 via receivers 209 when an outbound command requests the MTU's to transmit information. Additionally, as will subsequently be described, the SCU 14 is also capable of providing status information back to the RCC when the information processor decodes such a command for status transfer.

Figure 30:
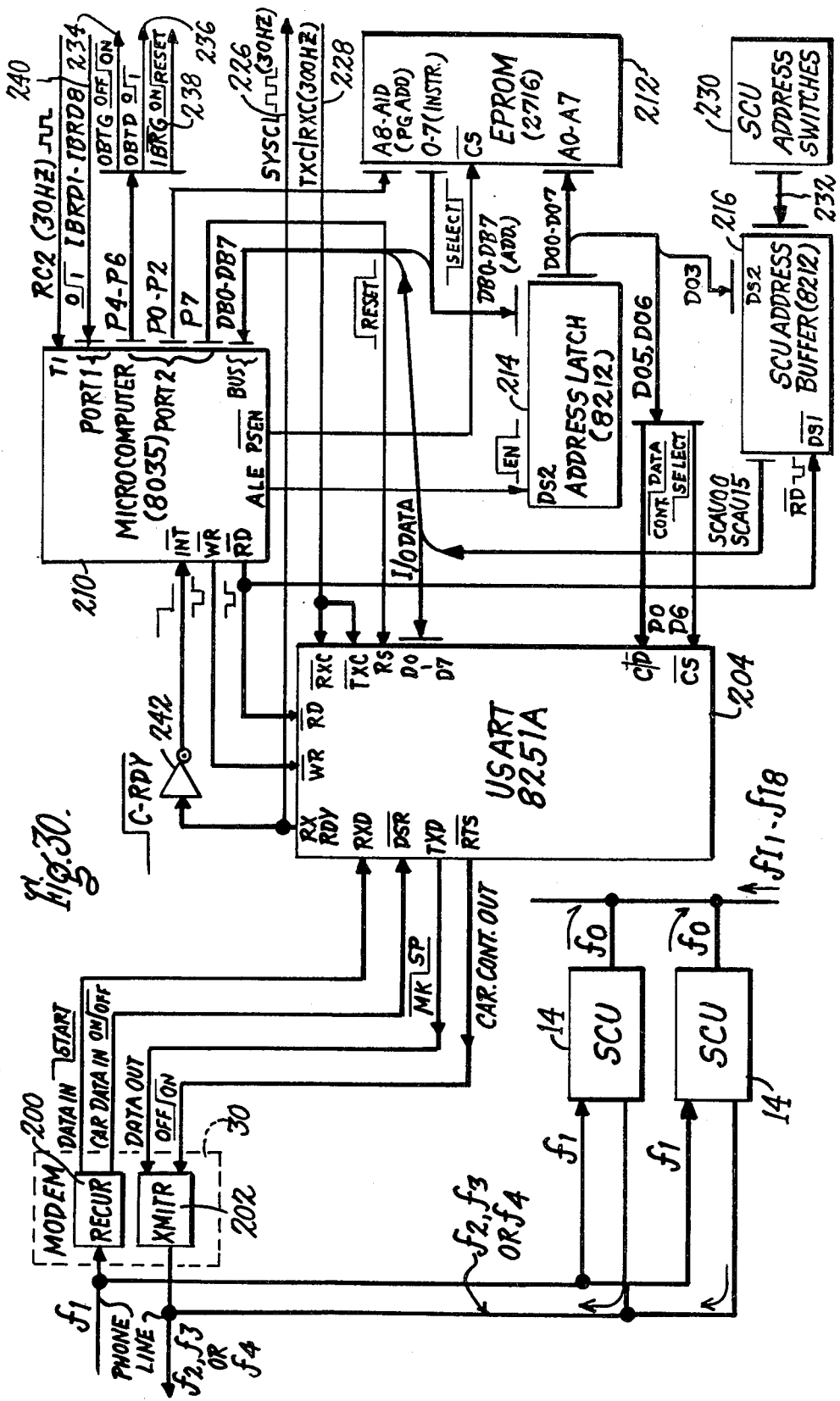
FIGS. 30 and 31 comprise an elementary logic schematic block diagram of the section control unit of FIG. 29.
Figure 31:
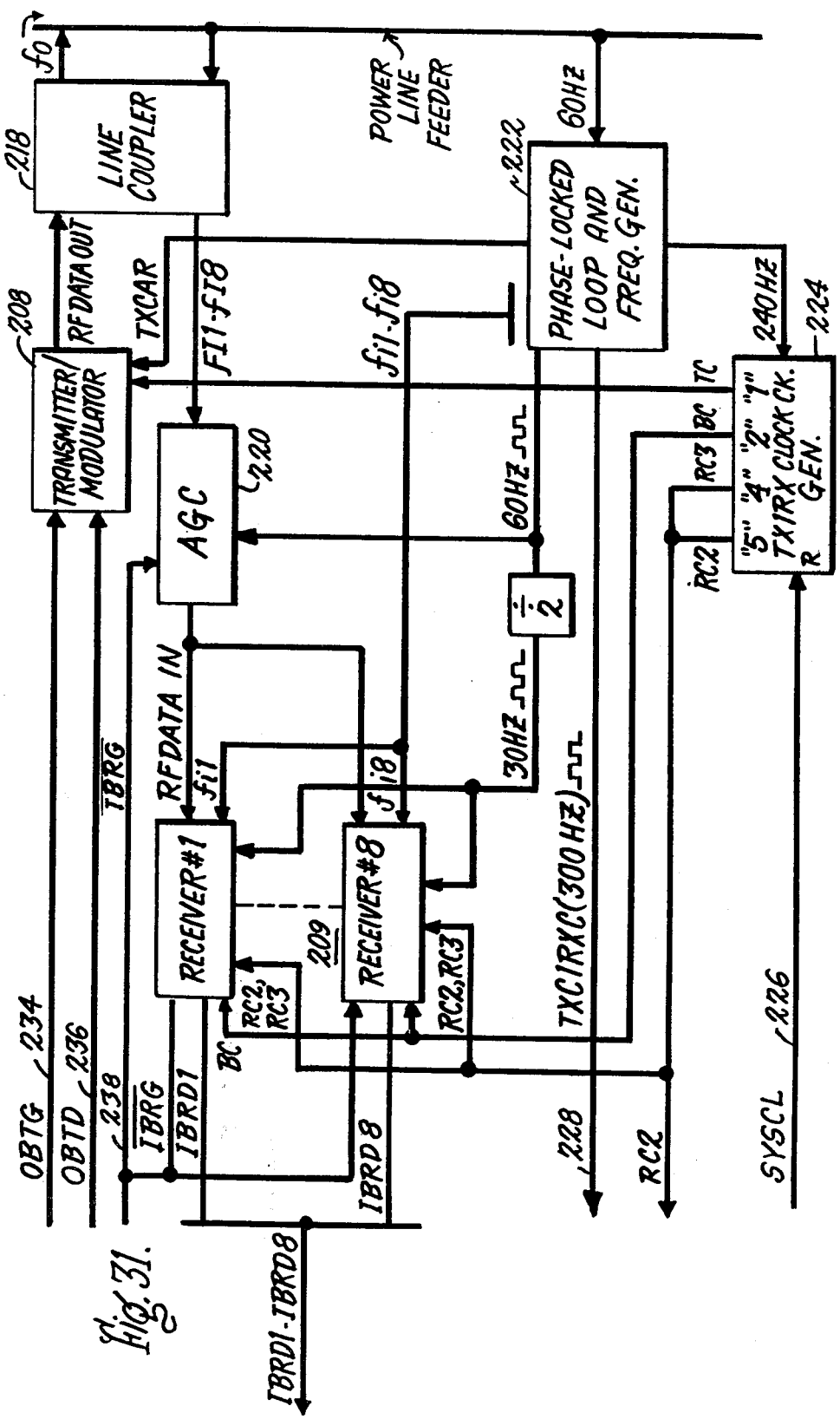

Reference is now made to FIGS. 30 and 31 which show the SCU 14 in more detailed block diagram form. The information processor is shown in FIG. 30 as a microcomputer 210 Intel 8035 including an electrically programmable READ only memory 212 (EPROM) such as an Intel 2716, an address latch circuit 214 such as an Intel 8212 and an SCU Address Buffer 216 also an Intel 8212. The transmitter modulator 208 of FIG. 29 is also shown as a block in FIG. 31 and in the preferred embodiment is of the type disclosed in copending application of Hughes, having Ser. No. 106,452, filed Dec. 26, 1979, entitled, "Method and Apparatus For Synthesizing A Modulated Carrier To Reduce Interchannel Interference In A Digital Communication System" and assigned to the assignee of the present invention. That application also discloses a line coupler 218 such as that shown in block diagram form in FIG. 31. The receivers 209 shown in FIG. 29 are also shown as blocks in FIG. 31 as receivers #1 through #8. These receivers in the preferred embodiment are the type disclosed in a patent application to Hughes, Ser. No. 106,451, filed Dec. 26, 1979, entitled, "Reciver For Phase Shift Modulated Carrier Signals" assigned to the assignee of the present invention. An AGC circuit 220, also shown as a block in FIG. 31, is disclosed in the aforementioned patent application Ser. No. 106,451. Also shown in FIG. 31, is a phase locked loop and frequency generator 222 which provides a 240 hertz signal to a TX/RX clock generator 224. These two blocks 222 and 224 generate output signals in a manner to subsequently be described for controlling the operation of the SCU 14 and the circuits contained within those blocks are disclosed in patent application Ser. No. 103,032, filed Dec. 13, 1979, entitled, "Phase Locked Loop Stabilized By A Crystal Oscillator" to P. Hackett and Hughes and assigned to the assignee of the present invention.

Figure 32:
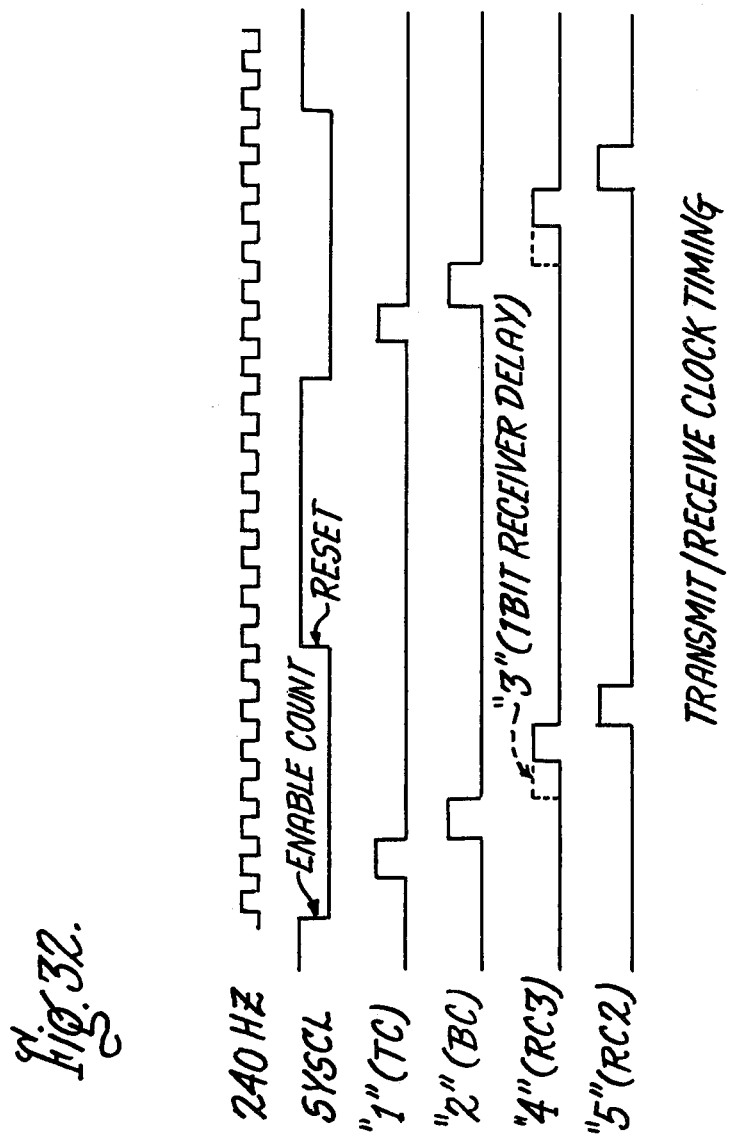
FIG. 32 is a timing diagram showing the phase relationship of various timing signals generated in the section control unit.

Reference to now made back to FIG. 30 to the SCU MODEM 30 wherein, the MODEM receiver 200 senses a continuously on tone or carrier signal having a frequency $f_1$, which as previously described has a frequency of 660 hertz. The tone $f_1$ is always modulated by FSK, thus conveying a continuous stream of asynchronous ACII characters at 30 characters per second or 300 band. As long as the carrier is on, the MODEM receivers 200 generates a carrier detect IN signal to a $\overline{DSR}$ input terminal of the USART. Also, the modulated carrier is applied on a Data In line to an RXD input terminal of the USART. As each character, such as characters 1 through 10 of FIG. 7, is received, the USART generates a C READY or character ready signal at an RXRDY output terminal. As shown in FIG. 30, the C READY signal is inverted and applied to an INT input terminal of the microcomputer 20 to cause an external interrupt to the computer to effect program execution by the latter. It is also significant to note that the C READY signal is utilized as the system clock shown as a signal SYSCL at 30 hertz on a conductor 226 provided to a reset R input terminal of the TX/RX clock generator 224. As will subsequently be described, all SCU operators are slaved to the SYSCL signal. By so slaving all operations in the SCU to this signal, the SCU is thus held in synchronism with the RCC and MTU's As shown in FIGS. 31 and 32, various clock signals such at TC, BC, RC2 and RC3 are generated by the block generator 224. These signals have the phase relationships as shown in FIG. 32 and they are asynchronous with SYSCL.

As previously mentioned, the RCC always modulates the tone $f_1$ by sending ASCII characters. As shown in FIG. 7, if a command is not being transmitted from the RCC to the SCU, these characters will be idle characters merely serving to synchronize the SCU and MTU's with the RCC. When a command is transmitted by the RCC, ten characters will be taken in by the USART and transferred to the microcomputer. As each of the ten characters is received, the C READY signal will cause an interrupt ($C_1$RDY) to the microcomputer, which in turn will execute a command placing a specific bit configuration on its BUS output on lines DBO through DB7. This bit configuration is applied as an address to an address latch 214 having output lines D05 and D06 connected as control/data and select lines D5 and D6 to the C/$\overline{D}$ input terminals of the USART. To latch the address into the address latch 214 an enable EN signal is also applied to the latch from the microcomputer output terminal ALE. In the particular instances being described, the input signal to the C/$\overline{D}$ input of the USART will be a binary 0 for data as shown and the $\overline{CS}$ input terminal will be a binary 0 to select the USART. To now read the information or character from the USART into the microcomputer, the computer will execute a read instruction causing a negative going pulse to be applied to the $\overline{RD}$ input terminal of the USART from a like output terminal ($\overline{RD}$) of the computer. The read pulse will then cause the character to be transferred from the USART via its output terminals D0 through D7 on an I/O data BUS into the computer bus input port on lines DB0 through DB7. For each character to be transferred into the microcomputer, the above mentioned process will be repeated.

The USART can also be controlled from the computer to transfer data from the computer back to the RCC. This is accomplished by the computer first executing a command to select the USART in the manner just described, while causing the C/$\overline{D}$ input terminal to go to a binary 1 for control. With the USART now selected the computer can transfer, via the BUS DB0 through DB7, a control word into the USART at terminals D0 through D7 with the application of a WRITE pulse at the output of the $\overline{SR}$ terminal of the computer to a like input terminal ($\overline{WR}$) of the USART. This control word will now allow the USART to receive subsequent data words from the computer with the generation of each WRITE pulse.

When the USART is commanded to transfer information from the SCU to the RCC, the USART will turn on the Modem transmitter carrier by applying a binary 1 output signal (carrier control out) from its RTS terminal to the MODEM transmitter 202. The information is then shifted out of the USART from its TXD output terminal as data OUT to the transmitter by the TXC/RXC 300 Hertz Signal on line 228 from the frequency generator 222.

As shown in FIG. 3 and as briefly described under the system description, the output carrier from the MODEM transmitter 202 can be one of three frequencies f2, f3 or f4. These frequencies represent separate subchannel frequencies to allow more than one SCU to simultaneously communicate with a single CIU channel in the RCC. As previously described, frequency f2 equals 1260 hertz, f3 equals 1860 hertz, and f4 equals 2460 hertz. The purpose and use of these three subchannel frequencies will be described in more detail later. However, for clarification at this time, as can be seen in FIG. 30, more than one SCU 14 can be connected to a single CIU telephone channel as shown by two additional SCU's 14 connected to the phone line. Depending upon the system configuration, as will be described, each of the SCU's can generate one of the frequencies f2, f3 or f4.

Still referring to FIG. 30, the entire program for the computer is contained in the EPROM 212. The EPROM is addressed from the address latch 214 via its output lines D00–D07 applied to the EPROM input terminals A0–A7. When it is desirable to select a particular address location in the EPROM during program execution, an address is placed on the computer BUS DB0–DB7 and latched into the address latch 214 via the ALE output terminal applying the EN signal on terminal DS2 of the address latch. To now read the addressed location out of the EPROM, the computer can execute an instruction which causes its $\overline{PSEN}$ output terminal to provide a binary 0 select signal to a $\overline{CS}$ input terminal of the EPROM. This causes the addressed word in the EPROM 212 to be read out and transferred via the BUS DB0 through DB7 into the computer for execution of the retrieved instruction. While not significant to the operation of the invention, an output port P2 is also shown connecting lines P0 through P2 to address input lines A8 through A10 of the EPROM for page addressing of that memory as required by the system. It should also be noted that the port 2 P7 output line is provided to a reset RS input terminal of the USART. By the execution of a proper instruction by the microcomputer the USART can be reset at a system start up in preparation to receiving and transmitting information between the SCU and the RCC.

Once a command has been received from the RCC to the SCU, the command must be examined to see if it contains the proper address from the SCU receiving that command. The SCU accomplishes this testing by comparing its own address which is set by a plurality of SCU address switches 230 as shown in FIG. 30. These switches are set to a specific address for the desired SCU, while settings provide input signals via lines 232 to the SCU address buffer 216. When the computer executes an instruction to read the SCU address buffer into its internal memory, it first selects line D03 to enable terminal DS2 of the SCU address buffer via the address latch in the manner as previously described. The computer then generates a read pulse on its $\overline{RD}$ output terminal to enable the $\overline{DS1}$ input of the SCU address buffer. This causes the SCU address buffer to thus provide the SCU address as bits SCAU00 through SCAU15 over the I/O data BUS as bits DB0 through DB7 into the microcomputer.

This retrieved address can then be compared by the computer with the received address in the command as shown in FIG. 7. If the compared addresses match, the computer will then continue on to carry out its operations as specified by the function code bits in character 5 of the outbound command as shown in FIG. 7. Under normal conditions, the SCU will transmit the command onto the power line in the format as shown in the outbound command of FIG. 5. To accomplish this, the microcomputer executes instructions which first turn on an outbound transmit gate OBTG on line 234 and then proceeds to sequentially execute instructions to transmit the outbound command out, in serial fashion, via its port 2 on outbound transmit data (OBTD) line 236. The outbound transmit data which will be either a binary 0 or binary 1 depending upon the polarity of the bit at the time it is transmitted by the computer.

As shown in FIG. 31, the OBTG and OBTD lines 234 and 236 are applied to the transmitter modulator 208. The outbound transmit gate OBTG enables the transmitter modulator to transmit an RF data output signal in accordance with the OBTD transmit data which modulates a transmit carrier signal TXCAR applied to the transmitter/modulator from the phase-locked loop and frequency generator 222.

As previously mentioned, the SCU output carrier signal is a 5010 hertz shown at the output of the line coupler 218 as $f_0$. The actual data bit rate of transmission is controlled by a transmit clock TC of 30 hertz applied to the modulator 208 from the TX/RX clock generator 224. When the entire command has been transmitted out to the MTU's as shown in FIG. 5, the computer turns off the outbound transmit gate OBTG disabling the transmitter/modulator.

If the function code bits of the outbound command, as shown in FIG. 7 are decoded by the microcomputer to expect a response from an addressed MTU, the computer will generate an $\overline{IBRG}$ ON signal on lines 238 via its output port to enable the receivers 209 and the AGC circuit 220 shown in FIG. 31. The MTU message, at frequencies $f_1$ through $f_{18}$ is simultaneously applied to the receivers 209 as RF data IN via the AGC circuit 220 and the line coupler 218. The receivers will respond to their individually tuned frequency by combining corresponding frequencies $FI_1$-$fI_8$ from the phase-locked loop and frequency generator 222.

It should also be noted that the phase-lock loop and frequency generator generates a 60 Hz output signal which is applied to the AGC circuit for gain control purposes. The 60 Hz signal is also divided by two to provide a 30 Hz gating signal for gating the received bits from the receivers into port 1 of the computer via inbound receive data signal lines IBRD1-IDRD8 on conductors 240.

Three additional timing signals are also applied to the receivers 209 from the TX/RX clock generator 224. These signals are all 30 Hz and have the timing relationship as shown in FIG. 32. The BC signal is a baud clock, whereas, signals RC2 and RC3 are receive clocks utilized by the receivers to enable the receivers to clock the inbound read data IBRD1-IBRD8 into the computer at the proper time. As can be seen, the four signals TC, BC, RC3 and RC2 are all generated during one clock period of SYSCL. As shown in FIG. 32, the TX/RX clock generator 224 is reset on the falling edge of the SYSCL pulse to enable the clock generator to count the 240 Hz input signal from the phase-locked loop 222. As the clock generator 224 is counted up by the 240 Hz pulse, it will generate these four pulses and apply those pulses to the receivers to thus clock out the information to the microcomputer at the proper time. At the end of the SYSCL cycle, SYSCL will go positive to thus reset the TX/RX clock generator 224 as shown in FIG. 32.

During operation of the SCU, when the RC2 signal goes high the inbound received data IBRD1-IBRD8 is actually available at port 1 of the computer. During that time, the RC2 signal, which if applied to the T1 input of the computer for sampling, will cause the inbound received data to be transferred and stored into the microcomputer memory.

SCU Operational Description

Prior to proceeding with the operation description of the SCU, reference is first made to FIGS. 33a and 33b. FIG. 33a is a memory map of the random access memory (RAM) contained within the microcomputer 210 of the present invention. As shown in that memory map, certain locations are designated as flags F0-F33. These flags are described in Table 2 having four columns, from left to right, the first column designated the flag, the second column a description of that flag, and the third and fourth columns showing a subroutine in which each flag is either set or reset. During the execution of the program by the SCU microcomputer these various flags are set and reset and then tested by the program to control subroutine program execution. As the ensuing description proceeds, each of these flags will be described at the time it is necessary to do so.

TABLE 2

| | SCU FLAGS | | |
|---|---|---|---|
| FLAG | DESCRIPTION | SET IN SUB- ROUTINE | RESET IN SUB- ROUTINE |
| F0 | Counting ON CNT0 IN SCUTA | SCUTA | SCUTA |
| F1 | Receive outbound message in progress | ROBMG | ROBMG |
| F2 | Receive outbound message ready to examine | ROBMG | EXOBM ROBMG |
| F3 | ROBWC is between 5-10 | ROBMG | ROBMG |
| F4 | Next pilot tone = 1 | OBXR OBISR | OBISR |
| F5 | Ready for new receive outbound message | PUIR ROBMG EXOBM OBXR SCUTA | ROBMG |

TABLE 2-continued

SCU FLAGS

| FLAG | DESCRIPTION | SET IN SUB-ROUTINE | RESET IN SUB-ROUTINE |
|---|---|---|---|
| | | PREIB | |
| F7 | Inbound response to be read next receive clock | PREIB | IBREC |
| F10 | Inbound transmit (any type) | SCUTA IBREC | IBXR |
| F11 | Outbound message to be transmitted | EXOBM EXOBM | |
| | | | OBXR |
| F12 | Inbound response expected after outbound transmit | EXOBM | OBISR EXOBM |
| F14 | Counting in SCUTA on CNT1 | EXOBM | SCUTA |
| F15 | Counting from SCUTA or STAT | EXOBM | SCUTA |
| F16 | Counting in SCUTA on CNT0 | EXOBM | SCUTA |
| F17 | Inbound response after SOM | OBISR | RREIB |
| F20 | Read inbound data on receive clock | IBREC PREIB | WAIT |
| F21 | Counting on CNT0 in IBREC | PREIB | PREIB |
| F23 | Transmit inbound message from SCUTA on CNT0 | SCUTA | SCUTA |
| F24 | Transmit inbound message from SCUTA on CNT1 | SCUTA | SCUTA |
| F25 | Transmit inbound message characters 49-52 | IBXR | IBXR |
| F27 | CNT0 CNT1 | EXOBM | EXOBM |
| F30 | Counting on CNT0 | PREIB | PREIB |
| F31 | Counting on CNT1 | PREIB | PREIB |
| F32 | Pilot OFF at CNT0 = 64 | EXOBM | SCUTA |
| F33 | Pilot OFF at CNT1 = 64 | EXOBM | SCUTA |

Other locations used in the RAM comprise various counters which are used during program execution and also locations for the storage of outbound words or commands and inbound data words or message received from the MTU's. Further, as shown in FIG. 33a, certain working registers designated R1, R2 etc. are utilized during program execution for the temporary storage of various required information.

FIG. 33b is a memory map of the EPROM 212 containing the actual program utilized by the SCU microcomputer. A portion of this memory contains constants which are used to set and reset the aforementioned flag F0-F33. Also, certain constant information such as control words for the USART are contained within this portion. Additionally, commands are contained within this portion for reading the SCU least significant bits (LSB's) and the most significant bits (MSB's) from the SCU address switches 230 of FIG. 30 for comparison with the transmitting and receiving SCU address bits as shown in FIG. 7. The remainder of the EPROM 212 contains the various program subroutines for controlling the method of operation of the SCU and the system. These various subroutines are tabulated in the memory map and each of those subroutines will subsequently be described.

While it is not necesary to a thorough understanding of the operation of the SCU of the present invention, for those interested in how the microcomputer actually executes intructions to carry out the various functions to be described, reference is made of the MCS-48 Microcomputer User's Manual, Copyright 1978 by Intel Corporation. That manual contains a complete description of the 8035 microcomputer as well as the 2716 EPROM and the latches 8212. The USART 8251A is also shown in that same manual. A complete operational description is provided in that manual interconnecting all of the various integrated circuits as shown in FIG. 30.

Figure 34:
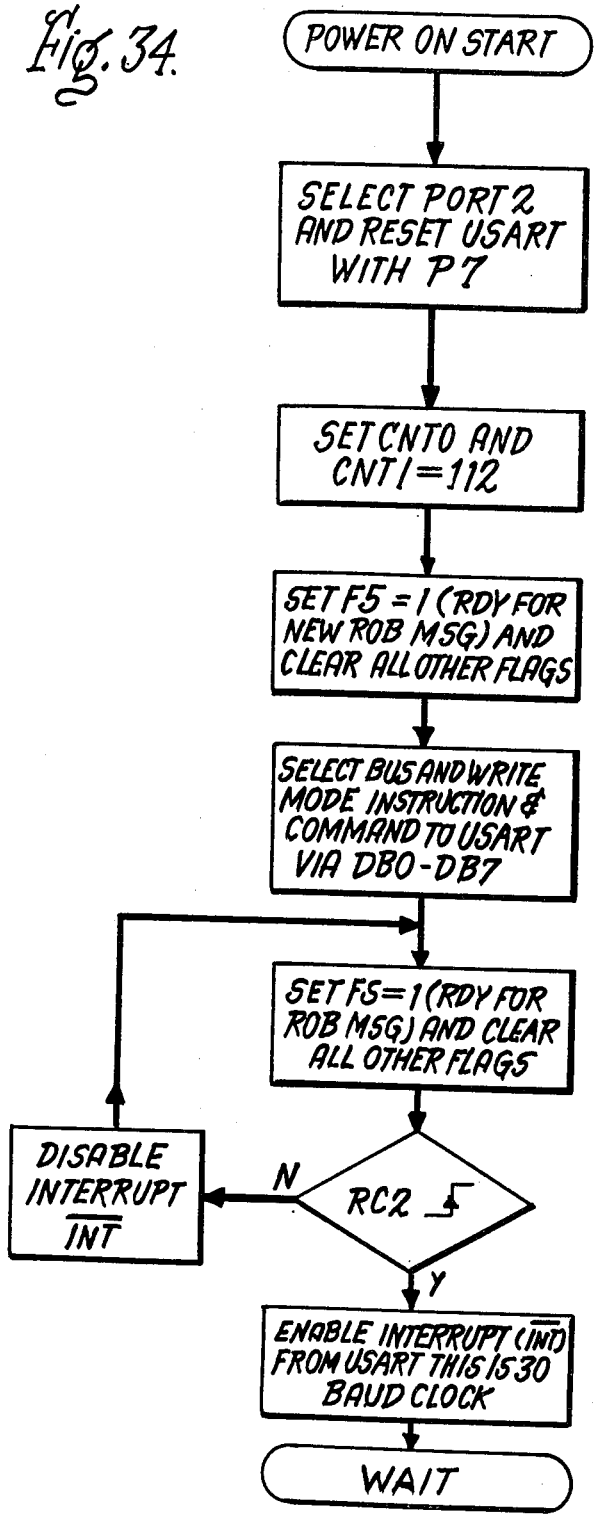

Reference is now made to FIG. 34, which is a method flow chart showing the power on start up sequence of the SCU. Let is first be assumed that power has just been applied to the SCU. The computer will first retrieve an instruction from the EPROM to select port 2 which resets the USART via port 2 outpout line P7 as shown in FIG. 30 by applying a reset signal to the RS input terminal of the USART. It will then proceed to set two counters CNT0 and CNT1 equal to 112 in the RAM as shown in FIG. 33a.

Next, the computer will retrieve a constant from the EPROM of FIG. 33b to set a flag F5=1. Flag F5, as described in Table 2, is a flag indicating that the SCU is ready for a new receive outbound message from the RCC. Also, in this same step, all other flags F0-F33 except F5, will be reset or cleared to zero. The computer will then proceed to retrieve from the EPROM instructions to write a mode instruction and a command to the USART Via its BUS BD0-DB7 to command the USART to prepare to receive an outbound message from the RCC (see the "User's Manual" for how to operate the USART). For security purposes, the computer will again set F5 and clear all the other flags in the RAM.

Figure 35:
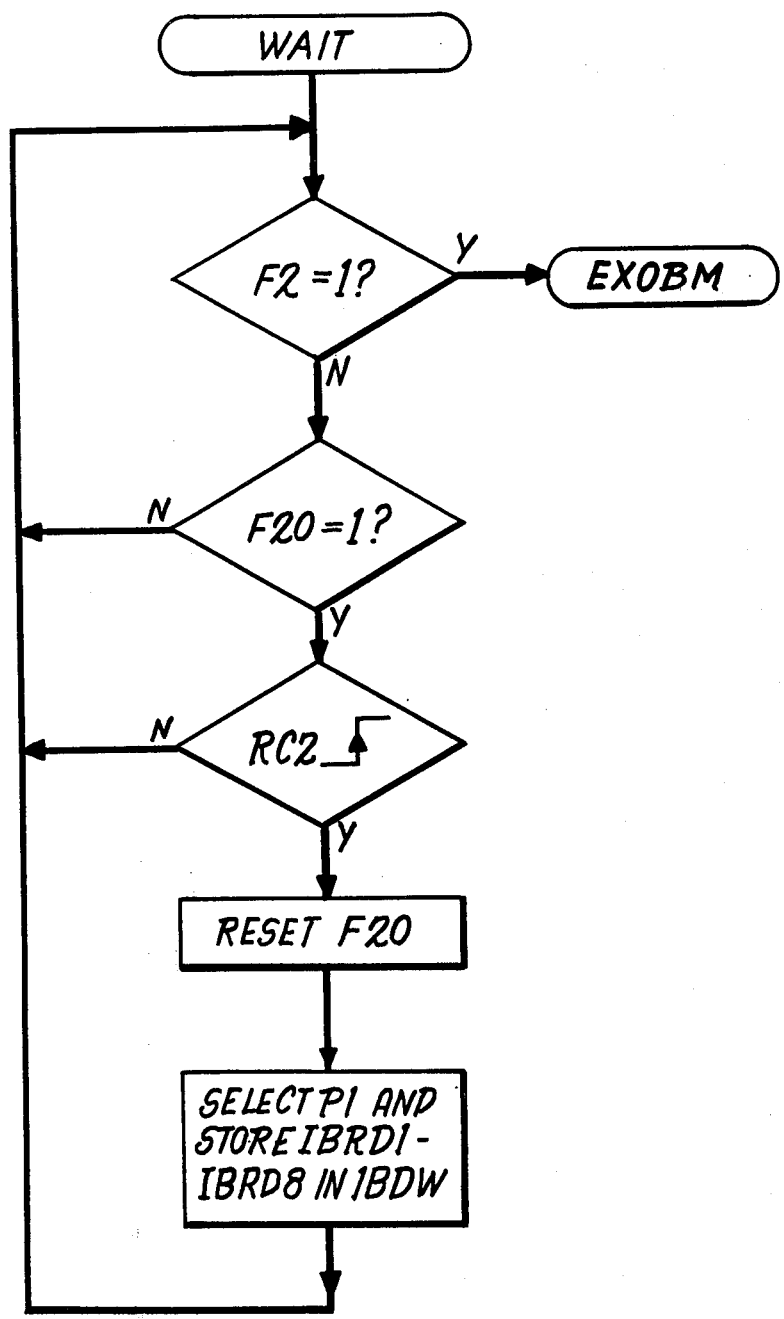

The computer will then test to see if the receive clock RC2 at its T1 input terminal has gone from a binary 0 to a binary 1 as shown by the transitional arrow in the RC2 decision block. As previously described, RC2 is a 30 Hz clock and as long as that clock is low, the computer will loop out of the N branch continuing to disable its interrupt input $\overline{INT}$ and loop back to continue to set F5 and clear the memory flags. As soon as the computer detects that RC2 has gone high, it will exit through the Y branch and enable the interrupt ($\overline{INT}$) input from the USART allowing the computer to now read the CRDY input signal out of amplifier inverter 242. It should also be noted the CRDY is the 30 baud clock SYSCL utilized to clock the entire SCU for synchronization purposes as previously described. Thus, it can be seen that the CRDY signal applied to the INT input of the microcomputer has a 30 baud rate. The computer will now go into a wait subroutine as shown in FIG. 35.

Figure 36:
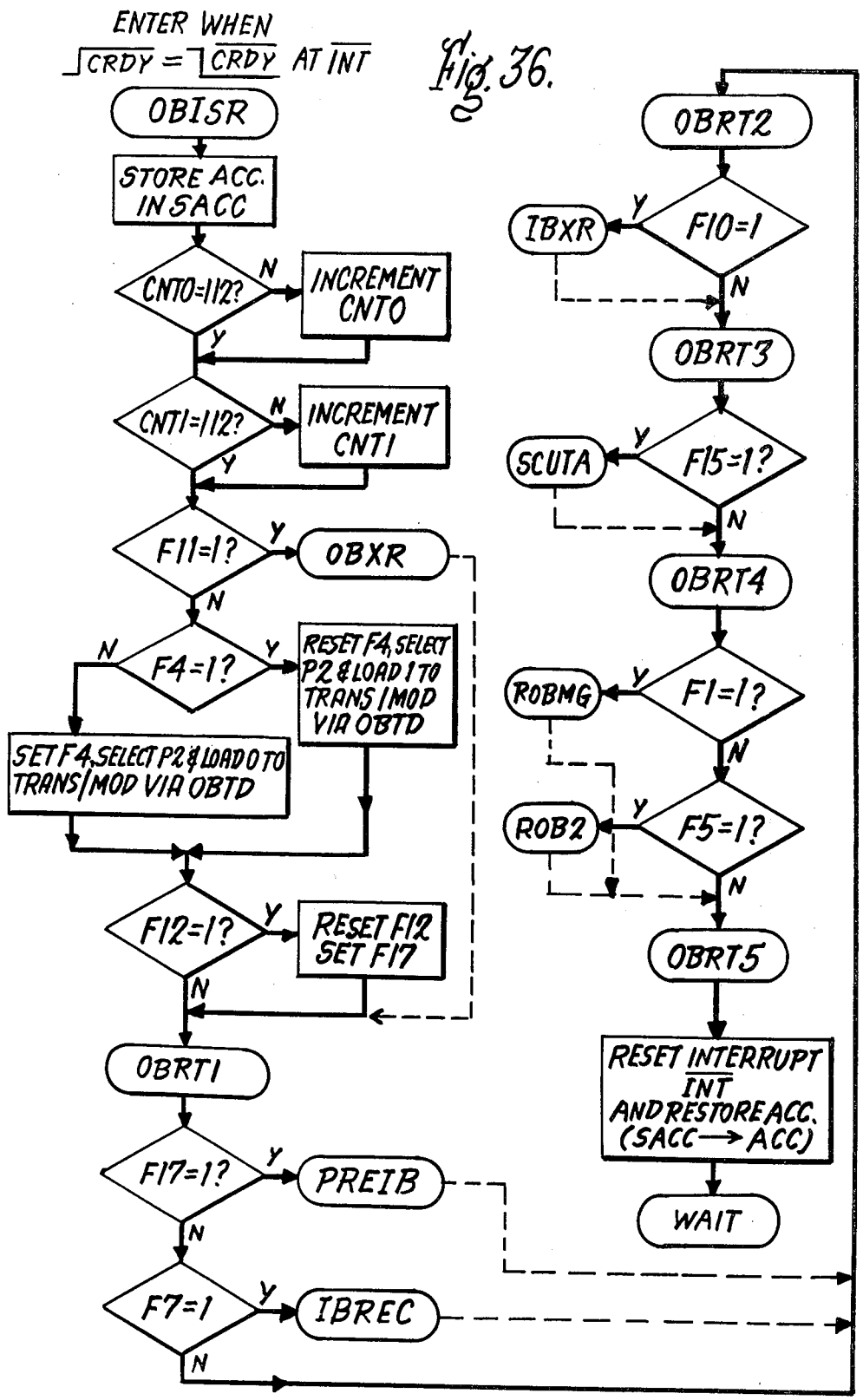

While the computer is in this subroutine, the USART will, of itself, now begin to take in bits to form characters from the RCC via MODEM 30 as shown in FIG. 30. As previusly described in connection with FIG. 7, these input characters may be either idle characters or the beginning of an outbound command. Since this is the first time the computer has entered into the WAIT subroutine, all flags in the computer RAM are reset, thus the computer will continue to loop through the N branches of F2=1? and F20=1? decision block back to the input of the F2=1? decision block until a character has been assembled by the USART. Once a complete character has been taken in by the USART, it will generate the C RDY signal at its RXRDY output terminal. When this occurs, an external interrupt wil be applied to the INT input terminal of the computer causing the computer to now enter into an outbound interrupt subroutine OBISR as shown in FIG. 36.

It should be pointed out that the OBISR subroutine is entered from the WAIT loop each time that the USART generates an interrupt to the processor via the character READY signal. Let it now be assumed that the first character of an outbound message or command has been received by the USART, thus generating an interrupt causing the computer to enter into the OBISR subroutine of FIG. 36. In this subroutine, the computer first stores its accumulator in a store accumulator location called SACC of the RAM (FIG. 33a) in order to be able to return back to the point in the program where it leaves off. The computer will now proceed to check to see if the two counters CNT0 and CNT1 are equal to 112. In the present instance, since this is the first time into OBISR, these two counters will be at 112 as originally initialized, thus the computer will drop through the Y branches and test to see if a flag F11 is equal to 1. Flag F11 at this time will likewise be reset, thus it will exit through the N branch where the computer will test to see if a flag F4 is equal to 1.

Flag F4 is a flag which is either set or reset to determine the bit pattern of the pilot code or idle carrier being transmitted from the SCU to the MTU over the powerline. It will be recalled from the earlier system description that when a command is not being transmitted from the SCU to an MTU that the SCU continuously transmits a 01010 etc. phase modulated pattern. In this instance, since it's the first time into OBISR, F4 is reset the computer will exit through an N branch wherein the flag F4 will be set and the computer will select port 2 of FIG. 30 and load a 0 to the transmitter/modulator 208 of FIG. 31 via the outbound transmit data line OBTD. FIG. 4 is set at this time so that the next time entry is made into OBISR a 1 will be transmitted out on OBTD.

The program will now enter into a F12=1 decision block, which is also reset at this time. Thus exit is through an N branch via an OBT1 connector entering into a flag F17=1? decision block. At this time all flags are still reset, thus the program will continue on through the N branches of the F17=1? and F7=1? steps of an OBRT2 connector into an F10=1? decision block. From there, exit is into an OBRT3 connector to an F15=1? decision block through an OBRT4 connector to an F1=1? decision block and into an F5=1? decision block.

It will be recalled during the initialization or power up routine, that the flag F5 was set to a binary 1. Since flag F5 is now set, it indicated that the SCU is ready to receive a new outbound command or message from the RCC. Thus, the computer will exit the F5=1? decision block through the Y branch and enter into a subroutine to receive the command.

Reference is now made to FIG. 37, which is a flow chart of the ROB2 subroutine in combination with an ROBMG subroutine, the latter to subsequently be described. As noted in FIG. 37, subroutine ROB2 is entered when the flag F5=1, thus the program now comes into an action block wherein the computer selects the BUS output lines DB0-DB7 and reads in parallel the presently assembled data character from the USART Via the 0 data BUS lines DB0-DB7. The computer now tests to see if the character just received is a fill or idle character (see FIG. 7). If that character is a fill character, the program will exit through the Y branch entering back into OBISR of FIG. 36 at OBRT5. Upon entering into OBRT5, the computer now resets the interrupt enable INT to the computer and restored the accumulator by storing SACC back into the accumulator for return back into the program and exits back to the WAIT subroutine of FIG. 35.

Reference is now made back to FIG. 37. Let it be assumed in ROB2 that the character just received by the computer is not a fill character, but rather the first character of an outbound command. In this case, the program will exit through the N branch of the fill char? decision block and reset F5 to prevent receiving a new outbound command until this entire command has been received. It will also set a receive outbound word counter (ROBEC) equal to 1 (FIG. 33a) of the computer RAM and also set a flag F1 to indicate that an outbound word (OBWD) or message is in progress.

The program will now enter into an F3=1? decision block where it will test to see if the receive outbound word counter ROBWC is equal to 5 through 10. In this instance, since it is not, the program will now exit through the N branch testing to see if ROBWC is equal to 5. Again, in this instance since it is not, exit is through the N branch where the first received character (See FIG. 7) of the outbound command is stored at location OBW1 of the RAM (See FIG. 33A) based on the address or contents of ROBWC.

With the first character now stored, the program will enter into another decision block to determine if ROBWC is equal to 10. Assuming at this time that the entire 10 character outbound command has not been received, the program will exit through the N branch returning back to OBRT5 of the OBISR subroutine in FIG. 36, wherein the interrupt $(\overline{INT})$ will again be reset, the accumulator restored and exit is back to the WAIT subroutine.

The program will now continue to loop in the WAIT subroutine of FIG. 35 until another character is assembled by the USART. When the character is again received, another interrupt will be applied to the computer at the INT input causing the program to again enter into the OBISR subroutine of FIG. 36. The program in OBISR will now continue down the path in the manner as just described to the F4=1 decision block. In this instance, since F4 is now set, exit is through the Y branch where F4 is reset and port 2 (P2) is selected to load a 1 to the transmit modulator via the computer output OBTD. In this manner, a 1 is now written to the MTU from the transmitter modulator. Program will now continue in the manner as just described finally entering into the F1=1? decision block. It will be recalled that flag F1 was set in ROB2 to indicate that an outbound word or command was in progress. In this instance, since F1 is set, exit is through the Y branch entering into a subroutine ROBMG of FIG. 37.

Referring to FIG. 37 at ROBMG, the program will not increment ROBWC and the computer will select the BUS to read the second assembled word from the USART into the computer memory. The computer will then again check to see if a fill character is present. If a fill character is present, it will exit to the Y branch, thus resetting F1, F2, and F3 and setting F5 in preparation to receive a new outbound command. The program will now exit back to OBRT5 of the OBISR subroutine as previously described.

Let it be assumed, however, in ROBMG, a fill character is not present, but rather the second character of the outbound command is present (See FIG. 7). In this instance, the program will exit through the N branch of the fill character test block entering into an F3=1? decision block. As previously described, if F3 set, it indicates that ROBWC is between 5 and 10. Assuming it is not, the program will again enter into ROBWC=5?. It should be noted that so long as ROBWC is less than 5, that the characters received by the USART are assembled sequentially into outbound word locations OBW1 through OBW3 upon each entry into ROBMG. This is what is meant in the action block for sequentially storing characters 1 through 4 of all outbound words or commands in OBW1 through OBW3. Referring to FIG. 7, it can be seen that these first four characters are representative of the transmit and receive SCU address bits. Until ROBWC equals 5, the computer will continue to store each of the received characters in the manner as just described by looping back to ORBT5 of OBISR and then back to WAIT wherein an interrupt will be entered and, at which time the program will re-enter ROBMG via OBISR.

Let it now be assumed that four characters have just been assembled into OBWL through OBW3. Upon entering the ROBMG (FIG. 37), ROBWC will again be incremented and when the program enters into the ROBWC=5? decision block ROBWC will be equal to 5. Thus, the program will exit through the Y branch, wherein, Flag F3 will be set to indicate that the next time through ROBMG that ROBWC will be equal to 5 through 10.

The program will now enter into a decision block F27=1. The purpose of F27 will subsequently be described, however, in the present instance it is not set, therefore the program will exit through the N branch wherein character 5 through 10 of the outbound word or command will be sequentially stored in locations OBW5 through OBW10 on the contents of ROBWC as shown in FIG. 33a. This sequential storing of those characters is done in the manner as just described for characters 1 through 4. That is, each time ROBMG is entered the previously received character will be stored away in its proper location in acordance with the count or address of ROBWC. Referring to FIG. 7, it can be seen that characters 5 through 10 of the outbound command represent the function code, the MTU action field, plus 3 field fill bits and the longitudinal parity which is 8 bits. After each of the characters is stored, the program will enter into the ROBWC=10? decision block as before. Let it now be assumed that ROBWC is equal to 10, indicating that the last character of the outbound command has been stored in the RAM of FIG. 33a. With the entire outbound command now stored, the program will exit through the Y branch wherein flags F1 and F3 will be reset and flag F2 will be set in preparation to examine the present received outbound command. The program will now exit back to OBRT5 of OBISR, wherein the interrupt (INT) will be reset, the accumulator will be restored and the program will enter back to the WAIT subroutine.

Reference is now made back to FIG. 35 to the WAIT subroutine. As can be seen, upon entry back into the WAIT subroutine to the F2=1? decision block, F2 is now set as previously described in ROBMG of FIG. 37. Since F2 is now set, the program will exit through the Y branch and enter into a subroutine EXOBM to examine the outbound message or command.

Figure 38A:
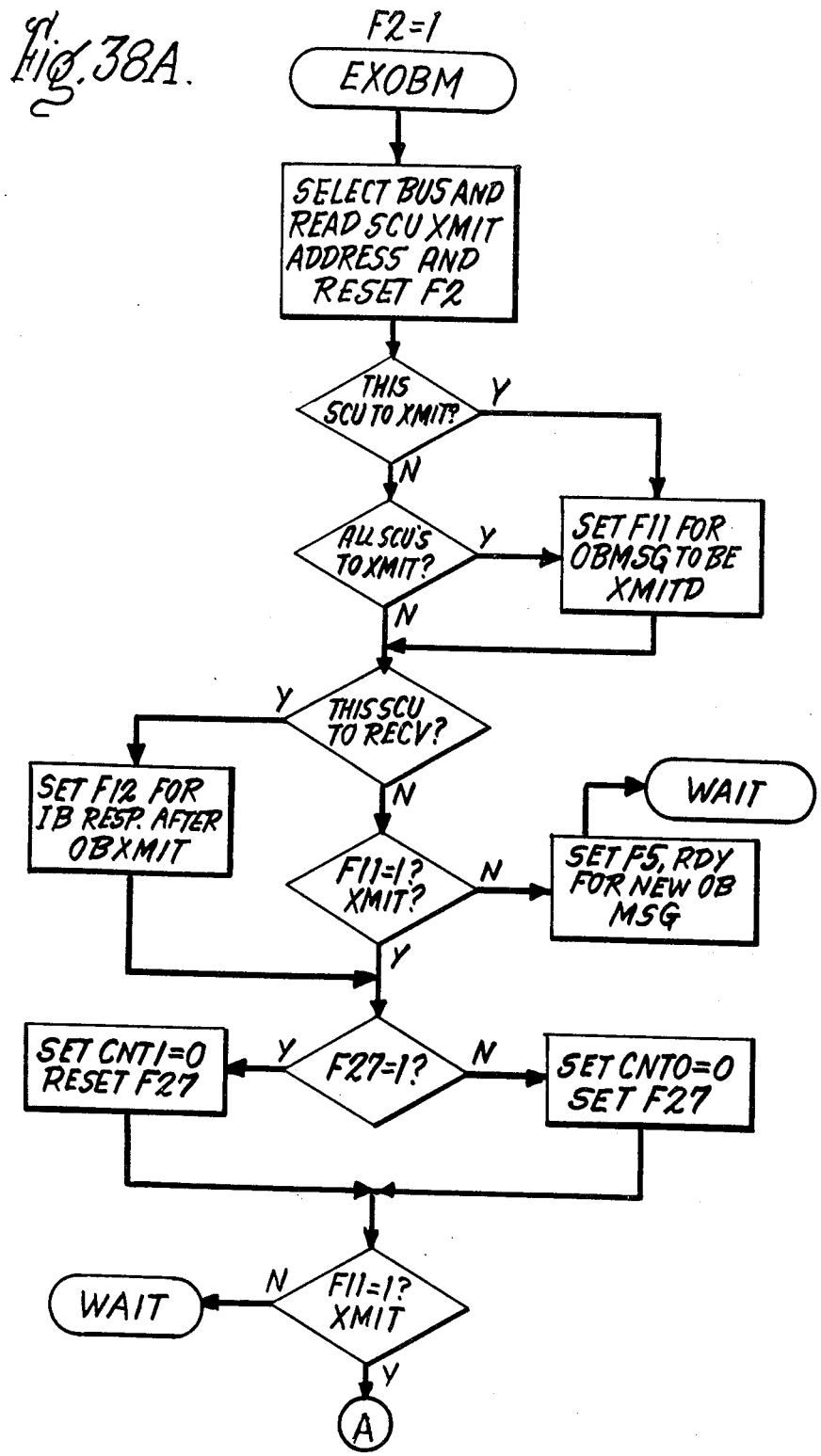
Figure 38B:
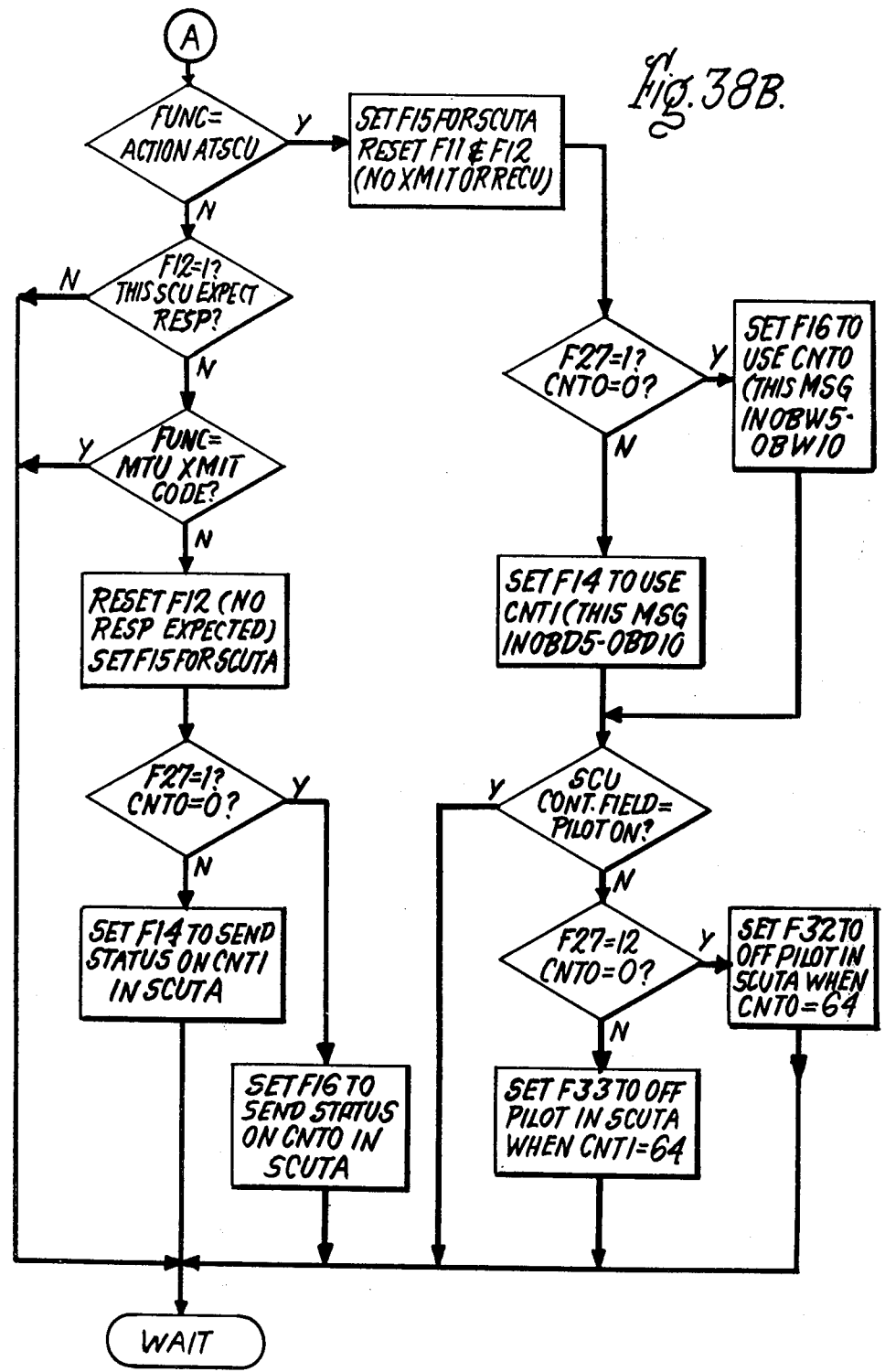

The EXOBM subroutine is shown in FIGS. 38a and 38b. The program will enter into EXOBM, wherein the computer will first select the BUS lines DB0 through DB7 and read the SCU transmit address (switches 230 of FIG. 30) via the SCU address buffer 216. Also at this time, the computer will reset flag F2 so that this message will not be re-examined again. The program will now enter into a decision block to test to see if this SCU is to transmit. This test is performed by the SCU comparing the received SCU transmit address as stored in RAM locations OBW1 and OBW2 with the SCU's address as read from the SCU switches 230. If the two addresses are the same, exit will be via the Y branch wherein F11 will be set flagging the computer that an outbound message is to be transmitted to an MTU. However, if this SCU is not to transmit, the program will exit through an N branch, wherein a test of the SCU address code field will again be tested against a constant to see if all SCU's connected to the RCC on this CIU channel are to transmit. If all SCU's are to transmit, the program will exit the Y branch and again set F11 for the outbound message to be transmitted. However, if this SCU is not to transmit, the program will exit through the N branch entering into a decision block. This SCU to Receive?. If the address code bits of the outbound command, when compared with this SUC's address specify that this SCU is to receive a message from an MTU, the program will exit through a Y branch entering into an action block wherein a flag F12 is set, indicating to the computer that an inbound response message is expected after the outbound command has been transmitted to the MTU. However, if this SCU is not to receive, an F11=1? decision block is entered, wherein F11 is tested to see if this outbound message is to be transmitted. If F11 was not previously set in this subroutine, the program will exit through the N branch, wherein F5 will be set to get ready to receive a new outbound command by the USART. The program will then exit back to the WAIT subroutine having determined that this message was not addressed to this SCU.

However, assume at this time that F11 is set, indicating that this message is to be transmitted, the program will exit through a Y branch entering into F27=1? decision block. F27 is a flag which is tested in this subroutine and either set or reset in accordance with its state to specify to the computer upon the receipt of a subsequent outbound command where to store characters 5 through 10 of that command in the memory of 33a. Referring to FIG. 33a, it can be seen that there are two series of locations designated OBW5 through OBW10 and OBD5 through OBD10. As previously described in connection with FIG. 37, characters 5-10 of the first received outbound command were stored in locations OBW5 through OBW10 because at that time F27 was not set. In order that the SCU be able to successively or rapidly transmit one outbound command after another, it is necessary for it to be able to buffer more than one command. Thus, one message which is received is stored in OBW5 through OBW10 and subsequent or next message that follows that is stored in OBD5 through OBD10. Flag F27 determines which of these memory locations OBW3 through OBW10 or OBD5 through OBD10 is to receive characters 5 through 10 of the received outbound commands. Referring to FIG. 37, it can now be seen in the F27=1? decision block, if F27 is not set that characters 5 through 10 of the present outbound word or command will be stored in OBD5 through OBD10 based on the contents of ROBWC upon entry into ROBMG.

Reference is now made back to FIG. 38a. Let it be assumed at this time that only the first outbound message has been received from the RCC, thus F27 will be reset upon entry into the F27=1? decision block. In this case, the program will exit through the N branch entering into an action block wherein the counter CNT0 will be set equal to zero and F27 will be set. With F27 now set, it will flag the program upon the next entry into ROBMG to store the characters 5 through 10 of the immediately next received outbound command into location OBD5 through OBD10.

Prior to proceeding with a further discussion of the operation of the SCU, it is considered advantageous to now explain the purpose of the two counters CNT0 and CNT1 in the RAM of FIG. 33a and how those counters function to control the proper storage of outbound commands in locations OBW5 through OBW10 and OBD5 through OBD10, and further how those commands from those locations to the MTU's. The operation of CNT0 and CNT1 can best be understood by reference to the interlace timing diagram of FIG. 39. This timing diagram illustrates how eight sequentially issued outbound commands from the CIU to the SCU are transmitted to the MTU's while eight messages, in response to those eight commands, are all transferred simultaneously in an interlacing timing technique, whereby the commands and messages are simultaneously being transmitted and received between the RCC and the MTU's via the SCU. This interlacing, or overlapping of commands and messages is accomplished in part in the SCU by the use of the two counters CNT0 and CNT1. It will be recalled in the very beginning of this discussion during the Power ON Start subroutine, that the counters CNT0 and CNT1 were set equal to 112. Referring to FIG. 39 to the CIU to the SCU line, showing command 1 coming into the SCU, CNT0 and CNT1 will both be at a count of 112 at that time. It will further be recalled, that the first outbound command was stored in the memory of FIG. 33a in locations OBW1-OBW10. Each of these locations OBW1 through OBW10 corresponds to one of the characters 1 through 10, as shown in command 1.

Reference is now made to FIG. 36 in conjunction with FIG. 39. It will also be recalled that the OBISR subroutine is entered each time a character is received by the USART. Observing the two decision blocks in FIG. 36 CNT0=112 and CNT1=112, it will be noted that neither of those counters will be incremented via their N branches if they are equal to 112. If either of these counters is equal to any number other than 112, they will be incremented each time the program goes through OBISR. Thus, it can be seen that counters CNT0 and CNT1 cannot be incremented until at least the first command from the RCC has been received by the SCU. It will also be recalled, after the command is received, that the computer branches from WAIT (FIG. 35) to the EXOBM subroutine of FIG. 38 based on flag F2 being set.

Reference is now made back to FIG. 38a along with FIG. 39. It will be noted in FIG. 38a in the F27=1 decision block, that CNT0 or CNT1 will be set to zero depending upon the state of F27 when the program enters the F27=1? decision block. Referring to FIG. 39, when the very first command is completely stored into the computer RAM and EXOBM is entered, F27 will be a binary 0 since it was reset during Power On start. Thus, CNT0 will be set to 0 and F27 will be set to 1 so that CNT1 can be set to 0 when the second command is received. It is significant to note that F27 is always set or reset when the last character of an outbound command is received in the SCU. CNT0 and CNT1 are also set to 0 at the end of a command based on the previous state of F27. In FIG. 38a, after CNT0 or CNT1 is set to 0 and F27 is either set or reset, the program will then exit through F11=1? decision block N branch back to the WAIT subroutine, if the command is not to be transmitted to the MUT's or to connector A if this is a transmit command.

It is now possible to understand how CNT0 and CNT1 get incremented. It will be recalled that the SCU will idle in the WAIT loop of FIG. 35 until a character has been assembled into the USART. When the character is assembled, OBISR will be entered on a program interrupt. Referring now to FIG. 36 to the OBISR subroutine, it will be noted that as soon as the last character of command 1 (FIG. 39) is loaded into RAM, EXOBM (FIG. 38a) is entered wherein CNT0 will be set to zero (FIG. 38A). Further, it is significant to note that the character following the first command received by the SCU from the CIU is a fill character which does not get stored in the computer RAM. As a matter of fact, as shown in FIG. 39, the spacing between commands, for example between commands 1 and 2 is made up of fill characters transmitted by the CIU to the SCU. Thus, it can be seen that an interrupt to the computer will occur each time a fill character is assembled by the USART. It is this assembling of characters by the USART which causes CNT0 and CNT1 to be incremented by 1 with each time OBISR is entered on an interrupt from the USART. Thus, it can be seen that CNT0 will begin to count from 0 up to some predetermined count as will subsequently be described with each interrupt to the computer from the USART CNT1 will also count from 0 after command 2 is received.

As shown in FIG. 39, two character times or delays exist between the termination of a command such as COMMAND 1 from the CIU to SCU and the beginning of the transmission of that same command from the SCU to the MTU. It is significant to note that the commands coming over from the CIU to the SCU are transmitted at 30 characters per second, whereas, the commands transmitted from the SCU to the MTU are transmitted at 30 bits per second.

It is also significant to note that the spacing between the beginning of one command from the CIU to the SCU to the beginning of the next command is 56 bits at 30 bits per second. This coincides with the length of the entire command going to the MTU from the SCU. In this context, it will be noted that the command from the SCU to the MTU is 54 bits in length, plus the two delay bits, which make up bits 55 and 56. It is now possible to see how the count in CNT0 and CNT1 can be utilized to direct the computer as to which characters to store in locations OBW5 through OBW10 and OBD5 and OBD10 respectively and which characters in those locations are to be retrieved for transmittal to the MTU from the SCU.

The computer in essence, continuously interrogates the counts in CNT0 and CNT1 to make a determination as to what actions are to be performed at any given instant in time in order to carry out the message interlacing technique of the present invention. For example, when CNT0 equals 46, a flag can be set in the computer telling the computer that it is now time to receive a new outbound command from the CIU. This, for example, would occur at the beginning of COMMAND 2 from the CIU to the SCU. It should be noted that while COMMAND 2 is being received from the CIU, that the previous COMMAND 1 is being transferred from the SCU to the MTU based on the character or bit count of CNT0. While, of course, the COMMAND 2 would be sequentially stored in locations OBD5 through OBD10 based on the count of CNT1. At the termination of COMMAND 2, then CNT1 would then be set to zero as shown in FIG. 38A to thus allow COMMAND 2 to be transferred out to the SCU based on the count of CNT1. This procedure would thus alternate with COMMAND 3 being placed into RAM and transmitted based on CNT0, COMMAND 4 being placed into RAM and transmitted based on CNT1, etc.

Still referring to FIG. 39, it will also be noted that there is an overlapping or interlacing of the messages and commands flowing between the CIU and the MTU's via the SCU. The time of transfer of the messages from the MTU's to the SCU and from the SCU to the CIU is also controlled by CNT0 and CNT1. For example, let it be assumed that messages 1 from the MTU's to the SCU and as a result of COMMAND 1 directing the MTU's to transmit. Since CNT0 was used to transmit COMMAND 1 out to the MTU's, CNT0 is also utilized to clock the message bits from the MTU's into the SCU and on to the CIU. In a similar fashion, messages 2 from the MTU's, as a result of COMMAND 2, would be under control of CNT1. The manner of usage of the counters CNT0 and CNT1 will become more readily understandable as the description proceeds.

Reference is now made back to FIG. 38A to the F11=1 decision block. Let it now be assumed that F11 is set, indicating that the command just received by the SCU is to be outbound transmit command to the MTU. In this case, the program will exit the Y branch through connector A entering into FIG. 38B into a function-=action at SCU decision block. In this decision block the computer tests the function code bits (See FIG. 7) of the command and since it is assumed that this is a transmit command and not a function at SCU command the program will exit the N branch entering into an F12=1 decision block. F12 is a flag which is set back in FIG. 38B of the EXOBM subroutine, if the function code field is identified as expecting an inbound message response after the outbound message has been transmitted to the MTU. If an inbound message is not expected, the program will exit through the N branch back to WAIT for subsequent action in a manner to be described. However, if F12 is set, indicating that a message response is expected back from the MTU's, the program will exit the Y branch entering into a function=MTU transmit code? decision block. The SCU tests in that latter block, the MTU action field bits (See FIG. 7) to see if the MTU action field specifies that an MTU is to transmit information from the MTU into the SCU. If this is an MTU transmit code, the program will exit through the Y branch returning back to the WAIT subroutine in preparation for receiving the information from the MTU.

If however, the function does not specify an MTU transmit function, the program will exit the N branch entering an action block wherein flag F12 will be reset, indicating to the program that no inbound response message is expected after the outbound command has been transmitted. Also, F15 is set in preparation to sending the outbound command from the CIU back to the CIU in an SCU turnaround (SCUTA) subroutine to subsequently be described. The program then enters into an F27=1 decision block to test to see if CNT0 is equal to 0. If it is, the program exits through a Y branch, wherein flag F16 is set to indicate that status information is to be sent back to the CIU during the SCUTA subroutine based on counter CNT0. If F27 is not set, then F14 is set to send the status back to the CIU from the locations specified by the counter CNT1. The program will then go back to the WAIT subroutine pending another interrupt from the USART.

Reference is made back to FIG. 38A to the connector point A. When the program enters into the function-=action at SCU decision block, if the function code bits of the outbound command specify an action to take place at the SCU, the computer will branch through the Y branch into an action block, wherein flag F15 is set for use in the SCUTA subroutine to be subsequently described.

Flags F11 and F12 are also reset indicating that not outbound message is to be transmitted and that no inbound response is expected. F27 is then tested to see if CNT0 is equal to 0. If F27 is set, then the program exits through the Y branch wherein F16 is set, to use CNT0 in the SCUTA subroutine to transmit the outbound command from OBW5 through OBW10 back to the CIU. On the other hand, if F27 is not set, the program will exit the N branch wherein flag F14 will be set to use counter CNT1 to transfer the outbound command from locations OBD5 through OBD10 back to the CIU. The computer now enters an SCU control field=pilot ON? decision block. Referring to FIG. 7, the SCU tests the code bits in the MTU action field of the outbound command to determine if the bit configuration of that command specifies that the pilot or power line carrier from the SCU is to be turned OFF. If the pilot is to be ON, the program exits the Y branch going back to the WAIT subroutine. However, if the SCU control field specifies that the pilot is to be turned OFF, it exits through the N branch and enters into an F27=1 decision block. Again the program tests to see if CNT0=0. If it does, then the program exits through the Y branch, wherein the flag F32 is set to turn off the pilot at the proper time during the SCUTA subroutine when CNT0=64. In a similar manner, if F27 is not set, the program exits through the N branch wherein F33 is set to turn off the pilot in the SCUTA subroutine when CNT1=64. The program will now go back to the WAIT subroutine.

Let it now be assumed that COMMAND 1, as shown in FIG. 39, has just been received and stored in locations OBW1 through OBW10 of FIG. 33A. Further, let it be assumed that that command has been decoded as an outbound transmit command in FIG. 38a when F11 was set to transmit the outbound command to the MTU's. Upon the next program interrupt from the WAIT subroutine, the OBISR subroutine of FIG. 36 will be entered. Referring to FIG. 36, the program now test CNT0 to see if it is equal to 112. Since CNT0 is not equal to 112, it will be incremented. CNT1 will also be tested in a manner as previously described. Let it be assumed at this time, that a second command such as COMMAND 2 has not been received by the SCU, thus CNT1 will still be equal to 112. As a result, the program will exit through the Y branch of CNT1=112? decision block entering into the aforementioned F11=1? decision block. In this instance, F11 is now equal to a 1 indicating that the COMMAND 1 now located in memory locations OBW5-OBW10 of FIG. 33A is to be transmitted to the MTU. Thus, the program now exits the Y branch entering into the outbound transmit subroutine OBXR shown in FIG. 40.

Referring now to FIG. 40, it will be noted that OBXR is entered when F11=1. Upon entry into OBXR, the first test performed is to see if F27 is equal to 1. If F27 is set, the program exits through the Y branch into a decision block wherein CNT0 is tested to see if it is equal to 55. The reason for testing CNT0=55 can best be understood by reference to FIG. 39. Referring to the end of COMMAND 2 from the CIU to the SCU, it will be noted that counter CNT0 will have counted to 55. If CNT0 is equal to 55, it indicates that the entire COMMAND 1 has been transmitted from the SCU to the MTU, thus the program would exit through the Y branch and reset the F11 flag indicating that the outbound command has been transmitted. The program will then proceed to set F4 as "1" pilot tone to be transmitted out to the MTU via OBTD output of the computer the next time the subroutine OBXR is entered. This will occur when bit 56 of the SCU MTU command is to be transmitted at the time that CNT0=56. The program will now select P2 at the output of the computer and set OBTD to a "0" to thus transmit a binary 0 in bits 55 of the SCU-MTU command. The program will now exit back to OBRT1 of FIG. 36 where it will ultimately return to the WAIT subroutine, pending another interrupt.

Reference is now made back to FIG. 36 to OBISR. Let it be assumed now that another interrupt has occurred, at which time CNT0 will be incremented and the program will continue on down into the F4=1? decision block. It will be recalled that F4 was just set in the OBXR subroutine of FIG. 40. Since F4 is set, it will exit through the Y branch resetting F4 and selecting port 2 at the output of the computer to load a binary 1 to the transmitter/modulator via the OBTD output line. It can now be seen that the entire output message or command 1 from the SCU to the MTU as shown in FIG. 39 has been transmitted with the 54 bits being transmitted followed by 0 and a 1 idle characters between commands 1 and 2.

Reference is now made back to the OBXR subroutine in FIG. 40. Referring to the CNT0=55? decision, let it be assumed that CNT0 is not=to 55. This indicates that the COMMAND 1 has not yet been fully transmitted from the SCU to the MTU, thus the program will exit the N branch entering into a CNT0=46? decision block. Referring to FIG. 39, it can be seen that if CNT0 is equal to 46, it is time to receive a new command, such as COMMAND 2 from the CIU. If CNT0 is equal to 46, the program will exit through the Y branch and set F5 ready to receive a new outbound command.

However, if CNT0 is not equal to 46, the program will exit through the N branch in preparation to transmitting the COMMAND 1 out to the MTU's from the SCU.

To accomplish this transmission, the computer first temporarily stores CNT0 in one of the working registers of FIG. 33A in the computer RAM and increments CNT0 to use it as a word and bit counter (WD/BITCT) for the transfer of COMMAND 1 from the SCU to the MTU's. In this case, WDCT will be equal to 0, thus the subprogram will go into a decision block to test the least significant bits of the WD/BITCT to see if they are between 1 and 3. The bit count is tested to see if the SOM (start of message) character has to be transmitted to the MTU. Since at the beginning of the message, the bit count will be equal to 1-3, the program will exit through the Y branch and select P2 at the output of the computer to send an SOM "0" bit on the outbound transmit date (OBTD) line and return back to OBRT1 of FIG. 36.

Let it now be assumed that another interrupt has occurred causing subroutine OBISR to again be entered in FIG. 36. CNT0 will again be incremented, and the program will continue back into OBXR of FIG. 40. Since CNT0 is not equal to 55 or 46, the program will again temporarily store CNT0 and increment CNT0 as the WD/BITCT in the manner as just described. WDCT will then again be tested. Let it be assumed that the word count is still equal to zero, thus the bit count will again be tested to transfer out another SOM bit. The program will continue through the loop just described, re-entering back into OBXR whereby CNT0 is incremented each time it comes through OBISR until the bit count is not equal to 1-3. When the bit count is not equal to 1-3, it indicates that 3 SOM 0's have been shifted out to the MTU from the SCU, thus the program will exit through the N branch and select P2 to now send out the first start of message "1" bit on OBTD. The program will now return back to OBRT1 in the manner as just described whereby, upon the next interrupt, OBISR will be 2 entered and CNT0 again incremented. Upon entry at this time into OBXR of FIG. 40, the word count WDCT will not be equal to 0, thus the program will exit through the N branch and enter into a decision block WDCT=4? where the word count is tested to see if it is equal to 4. Upon the first entry in the WDCT=4? decision block, the word count will not be equal to 4, thus the program will then exit through the N branch where P2 is selected to send the first data bit out on OBTD to the MTU. This first data bit, as shown in FIG. 5, is the first bit of the function code of the outbound command going to the MTU's from the SCU. The program will now exit back to OBRT1 where CNT0 will again be incremented and the program will exit back into OBXR in the manner just described.

The process of transmitting out the MTU outbound command will continue until the word count WDCT=4. When WDCT does equal 4, exit will be through the Y branch entering into a bit count equals 7 (BITCT=7?) decision block. Until the bit is equal to 7, the program will continue to exit through the N branch back to OBRT1 re-entering back into OBXR in the manner just described. When the bit count is equal to 7, it exits the Y branch and returns back to OBRT1. When the entire outbound command 1 (through WDCT=4 and BITCT=7) has been transmitted to the MTU, the next entry into OBXR will find CNT0 will be equal to 55, thus exit is through the Y branch wherein F11 is reset and F4 is set to a 1 for the pilot tone and P2 is selected to transmit out a binary 0 in a manner as previously described. The program will now return back to OBRT1 in FIG. 36 of the subroutine.

Reference is now made back to FIG. 39. Let it now be assumed that while COMMAND 1 is being transmitted to the MTU from the SCU in the manner as just described, that a second command, COMMAND 2 is transferred from the CIU to the SCU. It will be recalled in the discussion of FIG. 38, during the EXOBM subroutine, that flag F27 was set to allow CNT0 to be used as the counter to transmit the outbound COMMAND 1 to the MTU. In FIG. 37, when the ROB2 and ROBMG subroutines are entered on F5=1 and F1=1, F27 will be equal to 1, thus the exit will be made through the F27=1? Y branch, wherein characters 5-10 of COMMAND 2 will now be stored in locations OBD5 through OBD10 of the RAM.

Referring to FIG. 39, it can be seen that the beginning of COMMAND 2 starts when CNT0 equals 46, After COMMAND 2 is stored in locations OBD5 through OBD10 in the manner as described in connection with FIG. 37, the program will then exit back to OBRT5

(FIG. 37) where the interrupt INT is reset in the computer, the accumulator is restored and the process returns back to the WAIT subroutine. If COMMAND 2 is a transmit command, the same as was previously assumed for COMMAND 1, OBXR of FIG. 40 will again be entered, however at this time F27 will be reset, thus the program will exit through the N branch and utilize CNT1 as the counter to control transmission of COMMAND 2 out to the MTU's. The operation of transmitting the information based on the count of CNT1 from locations OBD5 through OBD10 is done in the same manner as described utilizing CNT0. Therefore, the manner of transmission of COMMAND 2 will not be described in detail.

Reference is now made back to FIG. 38A. Let it now be assumed that COMMAND 1 received from the CIU by the SCU was previously decoded in subroutine EXOBM in the This SCU to Receive? decision block as a command expecting a response message back from the MTU's. In this instance, the program exits the Y branch of that decision block and set flag F12 to indicate to the program that an inbound response message is expected from the MTU's after outbound COMMAND 1 has been transmitted to the MTU's. With F12 now set, reference is made back to the OBISR subroutine in FIG. 36. Upon entry into OBISR, CNT0 and CNT1 are incremented in the manner as previously described. Flag F11 is not set at this time because it was reset in the OBXR subroutine when COMMAND 1 was transmitted to the MTU's. After a "1" or "0" pilot signal is sent to the MTU's in the manner as previously described in connection with the state of flag F4, the program will now enter into the decision block F12=1?. Since F12 is equal to "1", the program will exit through a Y branch wherein F12 will be reset and a flag F17 is set at this time to be used in the program to indicate that an inbound response messsage is expected from the MTU's (See FIG. 6.).

The program will now enter into point OBRT1 where a flag F17 is tested for a "1". Since F17 was just set to a "1" the program will exit through the Y branch and enter into a pre-examine inbound (PREIB) message subroutine.

Figure 41:
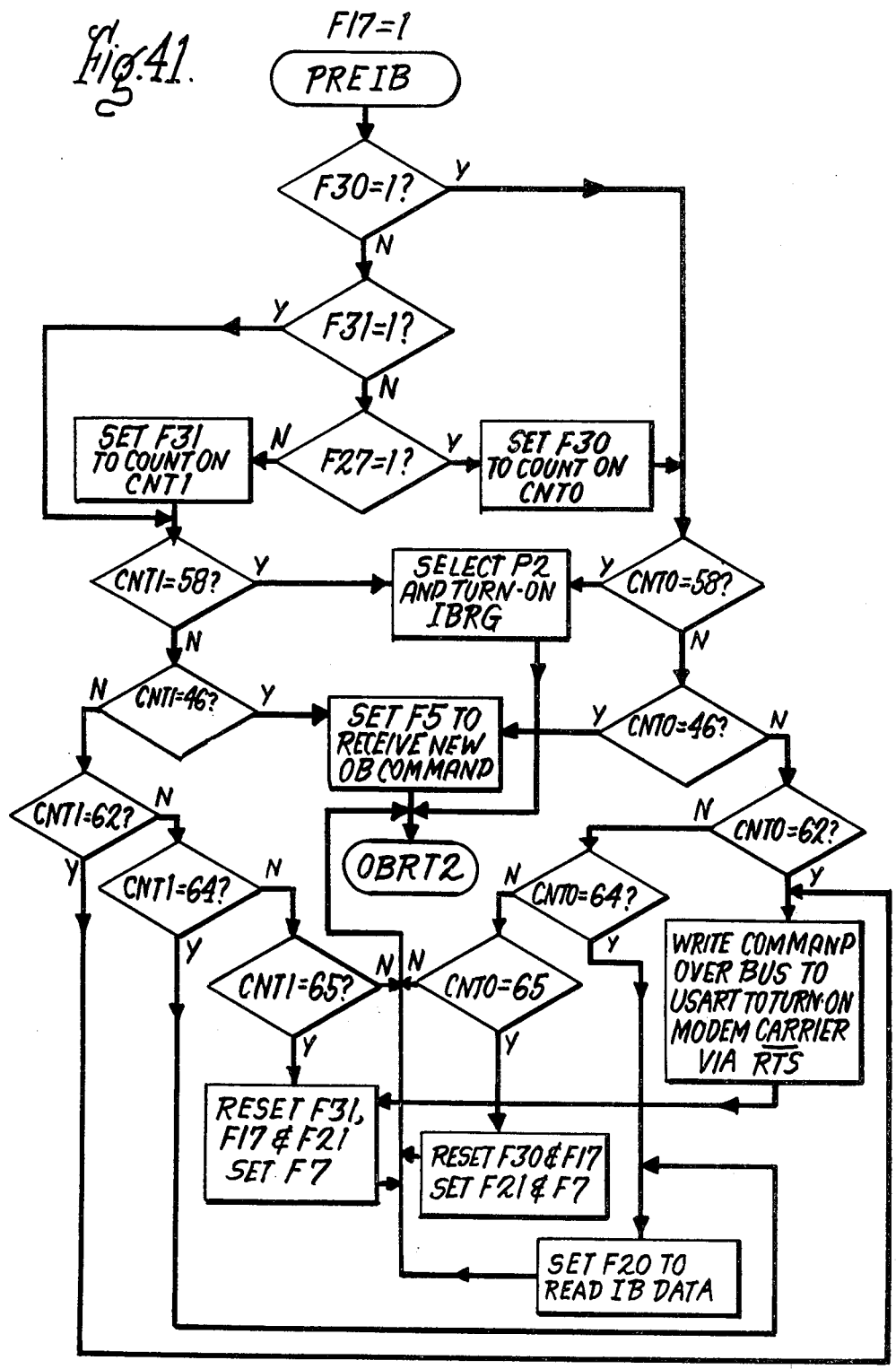

The PREIB subroutine is shown in FIG. 41, and as indicated there is entered when F17=1. Upon the first entry into PREB, two flags F30 and F31 will both be in reset state, therefore the program will exit the N branches of these decision blocks and enter into the F27=1? decision block. At the present time, it is assumed that the computer is counting on CNT0, therefore F27 will be equal to a "1" and the program will exit that decision block through the Y branch. Flag F30 will now be set to indicate to subroutine PREIB that the program is counting on CNT0. The program will now enter into a CNT0=58? decision block.

To understand the timing of the system at this point, reference is made to FIG. 39 in conjunction with FIG. 41. It will be noted that FIG. 39, at the beginning of the MTU to SCU message, CNT0 will be equal to 57 and this first bit will be received by the SCU one bit time later when CNT0 is equal to 58. If CNT0 is equal to 58, the program will exit through the Y branch and the computer will select its P2 and turn on the inbound receive gate IBRG to allow the message bits or characters from the MTU's to be transferred through the receivers into P1 of the computer. The program will then exit back to OBRT2 of the OBISR subroutine of FIG. 36.

Assuming that no other flags are set in Flag 36, the program will now exit back to the WAIT routine pending another interrupt causing re-entry back into OBISR. It shnould be kept in mind that counter CNT0 is incremented each time OBISR is entered, that is CNT0 is incremented each MTU message bit time (same as a CIT to SCU character time). Let it now be assumed that PREIB is entered a second time in FIG. 41. Upon the second entry, flag F30 will be equal to 1, therefore the program will exit through the Y branch and enter into the same decision block CNT0=58?. At this time, CNT0 will be equal to 59, thus the program will now exit through the N branch entering into a decision block CNT0=46?. The reason for testing the contents of CNT0 at this time is not evident now but for another use of this subroutine where it is necessary to make the determination as to whether it is time to receive a new outbound command from the CIU. Referring to FIG. 39, it can be seen, if CNT0 is equal to 46, it is time to receive a new command from the CIU such as COMMAND 2. Therefore, the program will exit through the Y branch and set flag F5 in preparation to receive the new outbound command in the manner as previously described. The program will now exit back to OBRR2 of the OBISR subroutine of FIG. 36.

Let it now be assumed that the program has issued another interrupt and PREIB has just been re-entered. Since F30 is still set, the program will take the route as just described entering into the CNt0=46? decision block. Since CNT0 is not equal to 46 at this time, the program will exit through the N branch and enter into a CNT0=62? decision block. The reason for using the count of 62 at this point in the program is to test to see if it is time to turn on the MODEM carrier to allow the message data from the MTU to be transferred to the CIU via the SCU. It is also significant to note that the six SOM bits, as shown in the inbound message pattern format of FIG. 6 are ignored by the SCU. Thus, referring to FIG. 39 at the MTU to SCU message line, it can be seen that when CNT0 is equal to 62, the six start of message bits have already been presented to the SCU receivers from the power line.

Assuming now that CNT0 is equal to 62, so that as shown in FIG. 41 the program will exit the Y branch entering into an action block wherein the computer will write the command over the BUS on lines DB0-DB7 to turn on the MODEM carrier via the carrier control output from the USART RTS terminal. The program will now return back to OBRT2 and then to the WAIT subroutine in the manner as previously described.

Let it now be assumed that another interrupt has occurred and PREIB is again entered from the OBISR subroutine. The program will take the last path as just described down to the CNT0=62? decision block. At this time, CNT0 will not be equal to 62, therefore the program will exit the N branch entering into the CNT0=64? decision block. Let it now be assumed that CNT0 is equal to 64, indicating that it is time to read the first MTU messages data bits into the computer. As a result the program will exit through the Y branch into an action block, wherein flag F20 will be set in order to be able to read the inbound data from the MTU's during the WAIT subroutine in FIG. 35 in a manner to be described. The program will then exit back to ORBT2 and return to the WAIT subroutine.

Reference is now made back to FIG. 35 to the WAIT subroutine. As shown there, flag F20 is now equal to a "1". Thus, as the program enters the WAIT subroutine, when F20 is tested the program will exit into an RC2 negative to positive transitional arrow decision block. The program wil loop as shown out of the N branch of RC2 back to the input of the F2=1? decision block until the receive clock RC2 goes from negative to positive at the input T1 of the computer (FIG. 30). When RC2 goes from negative to positive, the program will first reset F20 and then select P1 of the computer to parallel the first inbound received data messages bits on lines IBRD1 through IBRD8.

These data bits, are stored in the inbound data word location IBDW of FIG. 33A. Since F20 is now reset, the program will loop back to the input of the F2=1? decision block and wait until another interrupt occurs causing re-entry back into the OBISR subroutine of FIG. 36.

Let it now be assumed that the next interrupt has occurred and that the counter CNT0 has been incremented to 65 in OBISR. Assume also, that PREIB is again entered. The program will continue down to the right hand branches of FIG. 41 in the manner as previously described entering into the CNT0=65 decision block.

Let it now be assumed that the next interrupt has occurred and that the counter CNT0 has been incremented to 65 in OBISR. Assume also that PREIB is again entered. The program will continue down to the right hand branches of FIG. 41 in the manner as previously described entering into the CNT0=65 decision block. Since CNT0 is equal to 65, the program will exit the Y branch entering into an action block wherein flange F30 will be reset so that the computer will not count on CNT0 the next time into PREIB. Flag 17 is also reset to prevent re-entry into this subroutine on the next cycle. Also at this time, the flag F21 is set to indicate to the program in the inbound receive subroutine IBRED to be described, that the computer is to count on CNT0. F7 is also set at this time to indicate to the program that the IBREC subroutine is to be entered next, to read the next inbound message bits on the RC2 clock in the manner as just described. The program will now return back to OBRT2 and into the WAIT subroutine pending another interrupt.

Reference is now made to the OBISR subroutine of FIG. 36. Let it now be assumed that another interrupt has occurred and that OBISR has been re-entered. The program will then continue on down to a decision block F7=1?. Since F7 is now set, as just described in PREIB of FIG. 41, the program will exit through a Y branch entering into subroutine IBREC as shown in FIG. 42.

Figure 42:
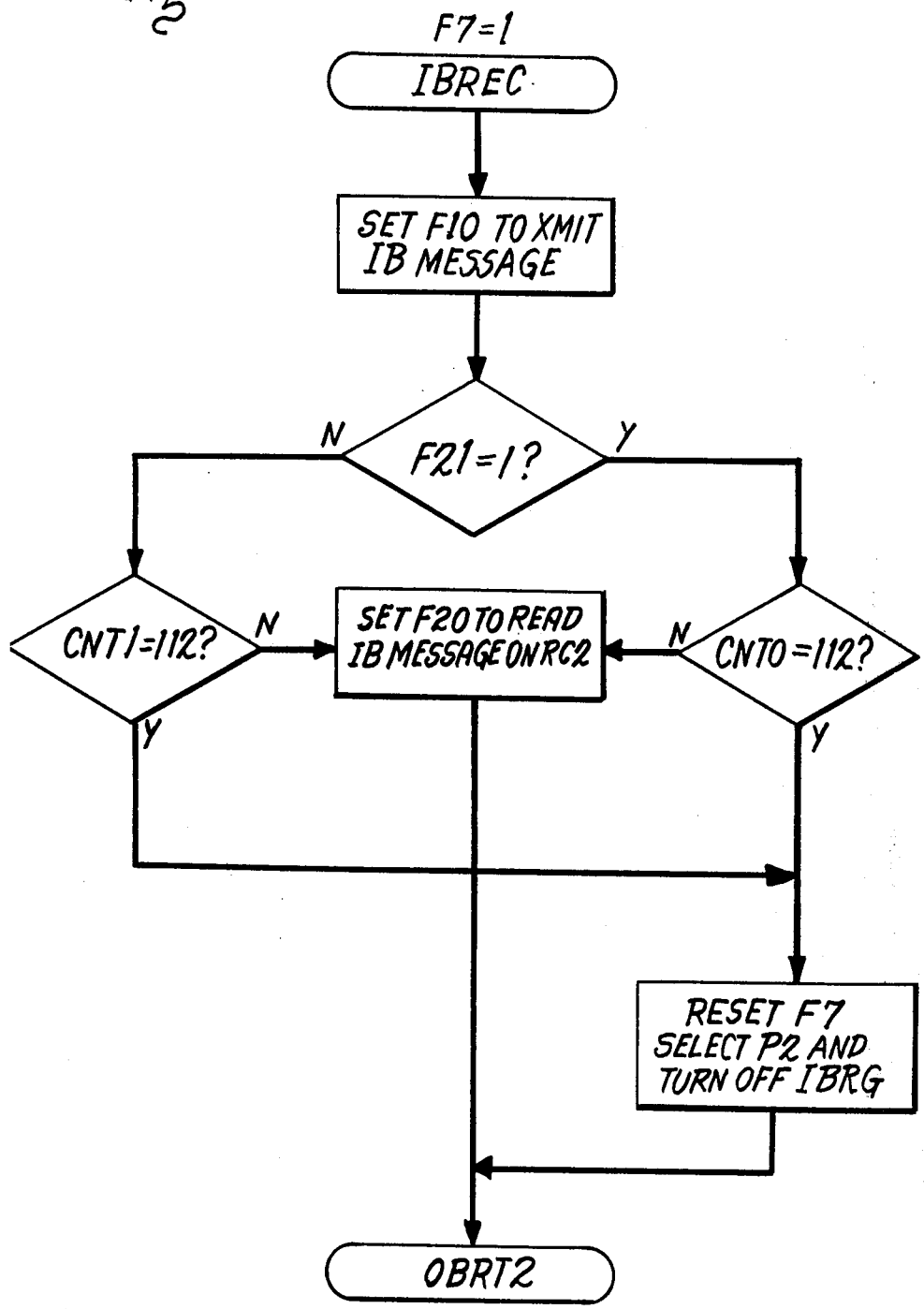

As shown in FIG. 42, IBREC is entered when F7=1. The first action to take place is the computer will set flag F10 in preparation to allowing the first inbound message bits from the MTU6 to be transferred from the inbound data word location IBDW of FIG. 33a over to the CIU. The program will now enter into the decision block F21=1? to make a determination as to whether the computer is counting on CNT0 or CNT1. In the present instance, it is assumed that the computer is counting on CNT0, therefore the program will exit through the Y branch entering into a decision block CNT0=112. To understand the purpose for testing CNT0=112, reference is now made back to FIG. 39 to the MTU to SCU message line at the end of messages 1 and also to the end of COMMAND 3. When the last messages from the MTU's, that is all 54 character bits, have been received, CNT0 will be equal to 111, however it will be recalled that there is a two bit gap where the SCU always transmits a "01" pilot tone at the end of its outbound message. Thus these two bits must be taken into account to determine the absolute end of an MTU message. Then at the end of COMMAND 3 (or absolute end of message 1) the counter CNT0 will be at 112.

Referring back to FIG. 42, let it be assumed however that the entire MTU's message has not been received. Therefore, CNT0 will not be equal to 112. The program will thus exit the N branch entering an action block where F20 will again be set in preparation to reading the next inbound message bits from the MTU's on the positive rising edge of RC2 as previously described for FIG. 35 in the WAIT subroutine. The program will now exit back to OBRT2 of FIG. 36.

Reference is now made back to FIG. 36 to the OBRT2 entry. It will be noted that the first test performed from OBRT2 is in a decision block F10=1?. Since F10 is now set as described in IBREC of FIG. 42, the program will exit through the Y branch to an inbound transmit subroutine IBXR as shown in FIG. 43.

Figure 43A:
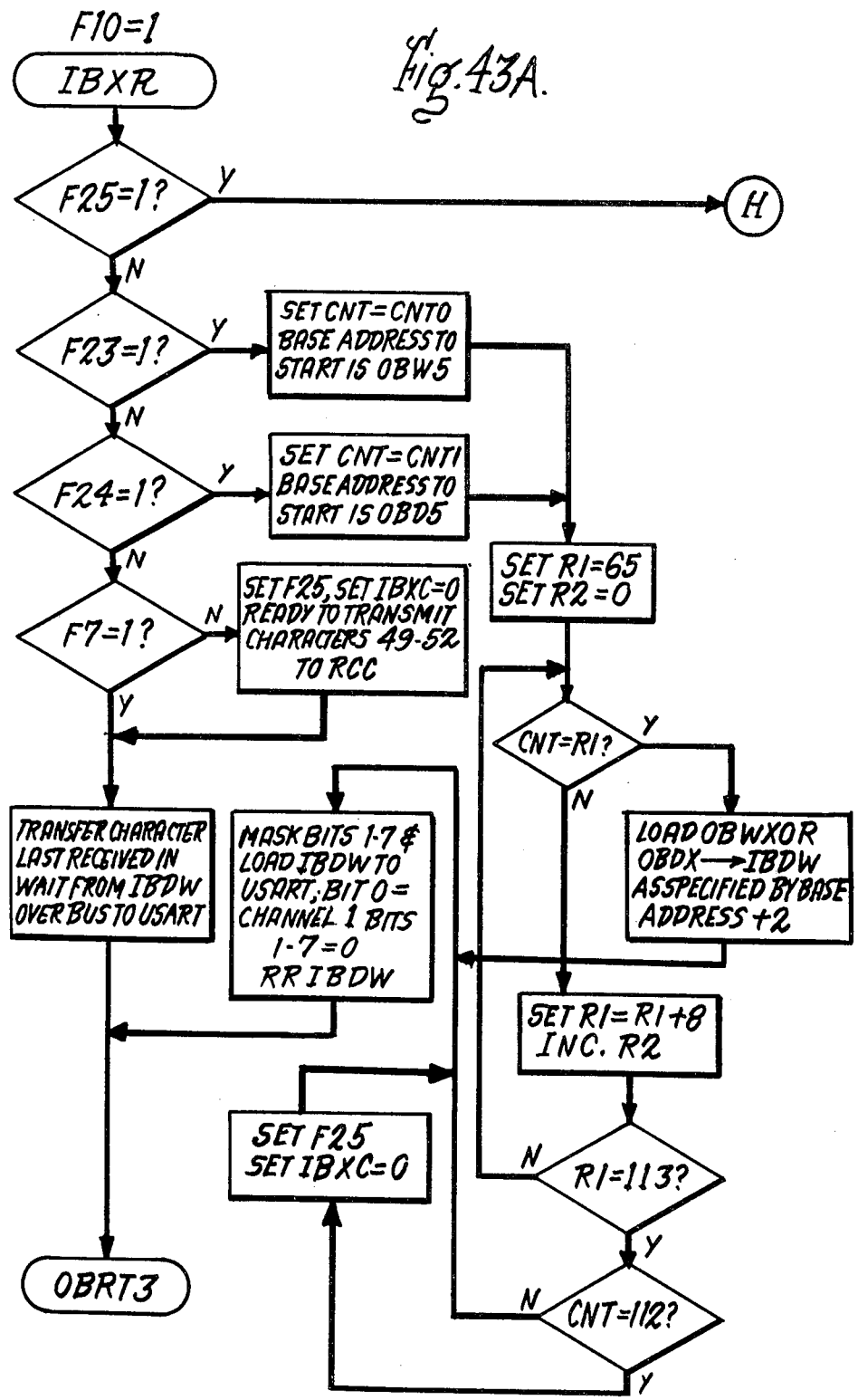

Reference is now made to FIG. 43a to the IBXR subroutine. In this subroutine, the previously stored message bits from the MTU's, which now reside in location IBDW of FIG. 33a, will be transmitted from the SCU to the CIU. This is accomplished as follows. Upon first entry into IBXR, F25 will be in the reset state. Therefore, the program will exit the N branch entering into a decision block F23=1?. Also, upon the first entry into IBXR, flags F23 and the following flag F24 will be in a reset state, therefore the program will exit the N branches of these two decision blocks entering into an F7=1? decision block. F7 was set in PREIB, therefore the program will exit the Y branch entering into an action block wherein the last received character presently residing in IBDW of FIG. 33a is transferred from the computer over the BUS lines DB0 through DB7 to the USART for transfer to the CIU from the SCU in a bit serial character fashion as shown in FIG. 39 on the SCU data to CIU line.

The program will now return back to OBRT3 of the OBISR subroutine of FIG. 36. In OBISR, it is assumed at this time, that no other flags are set on the right hand side of that flow chart. The program will thus return back to the WAIT subroutine of FIG. 35, wherein the next inbound receive message bits are again stored in IBDW of FIG. 33a.

After storing the next data bits, and when the next interrupt occurs, OBISR will be re-entered to direct re-entry into IBREC because F7 is equal to a 1. Referring to FIG. 42, the IBREC subroutine, the program will proceed through the subroutine in the manner just described returning back to OBRT2 of the OBISR subroutine, at which time F10 will be tested again. F10 will thus cause re-entry back into IXBR of FIG. 43, wherein the characters received from the MTU's will continuously be transferred to the CIU in the sequential fashion as just described until the counter CNT0=112 in IBREC (FIG. 42).

Reference is now made to FIG. 42 to the CNT0=112? decision block. Let it be assumed that the last message bits or characters have been received from the MTU's. Thus, CNT0 is equal to 112 and the program will exit through the Y branch entering into an action block wherein the flag F7 will be reset indicating that the inbound response message has been received. The computer now selects P2 and turns off the inbound receive gate IBRG to the SCU receivers, thus preventing further reception of information from the MTU's.

The program will now return back to OBRT2 of FIG. 36 of the OBISR subroutine. Since F10 is still set, the IBXR subroutine of FIG. 43 will again be entered.

Referring to FIG. 43A, the program will now progress down to the F7=1? decision block. It will be recalled that F7 is now in the reset state, as that flag was reset in the IBREC subroutine after completion of the receipt of the MTU messages. Thus, the program will exit through the N branch entering into an action block wherein flag F25 will be set in preparation to transmitting characters 49 through 52 of the inbound message from the SCU to the CIU (see FIG. 8). Also at this time, inbound transmit counter IBXC shown in FIG. 33A is set to 0. The computer will now transfer the character last received in WAIT from IBDW over its BUS to the USART, wherein the last MTU message bits or characters are transferred to the CIU via the USART. The program will now return back to the OBISR subroutine of FIG. 36 to OBRT3.

The program will return back to the WAIT subroutine pending another interrupt. When the next interrupt occurs OBISR will again be entered, at which time the program will progress into IBXR again because F10 is still set. Reference is now made back to FIG. 43A to the IBXR subroutine. It will be noted that F25 is now set due to the last pass through IBXR. Therefore, upon the entry into IBXR, the program will exit the Y branch of the F25=1? decision block entering into connector H of FIG. 43B.

Figure 43B:
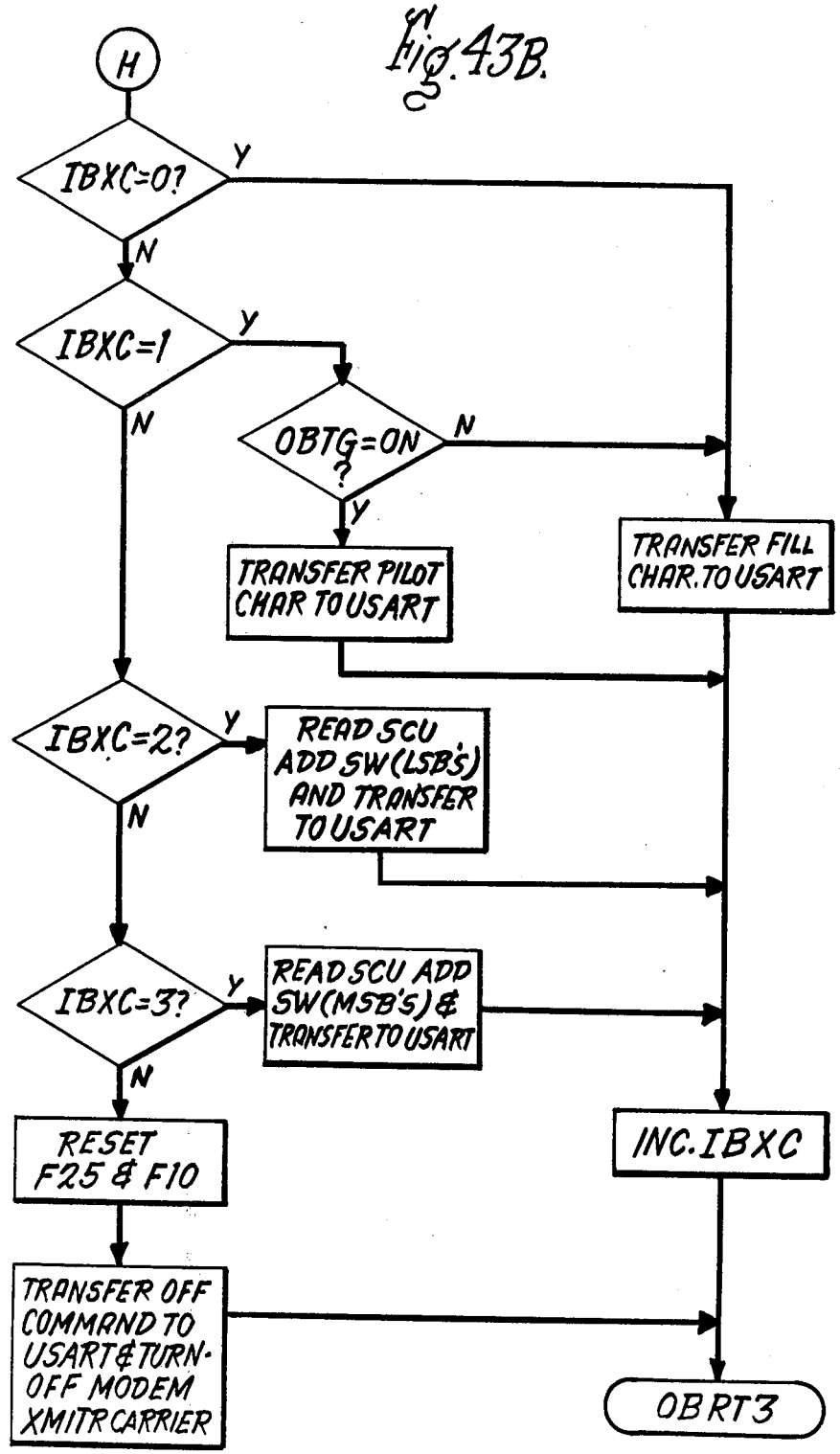

The first test performed in FIG. 43B is in an IBXC=0? decision block. The inbound transmit counter IBSC is utilized to sequence the transmission of characters 49 through 52 (see FIG. 39) from the SCU to the CIU. Upon first entry into connector H, IBXC will be equal to 0, therefore the program will exit through the Y branch entering into an action block where a fill character 49, as shown in the inbound message pattern of FIG. 8, will be transferred over the BUS lines DB0 through DB7 from the computer to the CIU via the USART. The program will then enter into an action block where IBXC is incremented by 1 and return back to OBRT3.

In OBRT of the OBISR subroutine of FIG. 3, assuming that none of the other flags in that subroutine are set, the program will then return back to the WAIT subroutine. Upon the next interrupt, IBXR will again be entered and the program will again exit through the Y branch of the F25=1? decision block to connector H. Upon this entry into the H connector of FIG. 43B, IBXC will be equal to a 1, therefore the program will exit from the N branch of the IBXC=0? decision block and proceed to the IBXC=1? decision block. Since IBXC is equal to a 1, the program will exit through a Y branch into an OBTG=ON? decision block. In this decision block, the computer is testing to see if the OBTG signal line from the computer on P2 is turned on. If OBTG is On, it indicates that a carrier is being transmitted from the SCU to the MTU's. However, if OBTG is OFF, it indicates that the carrier from the SCU to the MTU's is OFF and no command or data are being transmitted to the MTU's. The purpose of making this test of the outbound transmit gate OBTG is to provide status information back to the CIU's for use by the computer program of the RCC. Let it be assumed that OBTG is not in the ON condition, therefore the program will exit an N branch into an action block where the program will transfer a second fill character to the USART as character 50 of the inbound messages shown in FIG. 8. However, assuming that OBTG is on, the program will exit through the Y branch wherein the computer will tranfer a special code known as a pilot character to the USART and on to the CIU as bits 50 or character 50 of FIG. 8. The program will then increment IBXC for the next re-entry into the IBXR subroutine and return back to OBRT3 of FIG. 36 of the OBISR subroutine.

Let it now be assumed that another interrupt has occurred and IBXR has again been entered. Again the program will enter into connector H of FIG. 43B, continuing on down to the test block IBXC=2. At this time, since the first two characters, (characters 49 and 50 of FIG. 8) have been transferred to the CIU, IBXC will be equal to the 2. Therefore, the program will exit through the Y branch into an action block in which the program will read the SCU address least significant bits (LSB's) from the SCU address switches of FIG. 30A and transfer those bits as character 51, as shown in FIG. 8, to the CIU via the USART. The program will now increment IBXC and return back to OBRT3 as previously described.

Upon the next interrupt, and entry into connector H of FIG. 43B, IBXC will be equal to 3. Therefore, in the IBXC=3? decision block the program will progress through the Y branch at which time the computer will read the most significant bits (MSB's) of the SCU address switches and transfer those bits to the CIU via the USART. The IBXC will now ben incremented to 4 and the program will return back to OBRT3.

The entire 52 character messages has now been transferred from the SCU to the RCC. Upon the next interrupt, the IBXR subroutine will again be entered and coming through connector H of 43B, the program will progress on down the left hand side of the page to the N branch of the IBXC=3? decision block. Since IBXC is not equal to 3, the program will exit through the N branch entering into an action block wherein the flag F25 will be reset indicating that the inbound characters 49 through 52 of the message have been transmitted to the CIU. Also, F10 is reset at this time to prevent the further transfer of any inbound messages to the CIU. Upon the conclusion of this action block, the computer now proceeds to transfer an OFF command to the USART to turn off the MODEM transmitter carrier via the USART RTS line as shown in FIG. 30.

As previously mentioned, the SCU, upon receipt of an outbound command from the CIU specifying an action at the SCU only, has the capability of controlling the carrier or pilot tone going from the SCU to the MTU's. Te purpose for this control is to allow one or more SCU's to selectively turn ON and OFF their carriers going to their respective MTU's in the event several SCU's are connected to one power line feeder. This is to prevent adjacent SCU's from interfering with each other. The significance of this feature will become more apparent as the description proceeds in regard to the inventions capability to provide set addressing of SCU's. Also, the execution of an action at the SCU command by the SCU will cause the SCU to turn that command around and send it back to the CIU as status information. This type of command is executed by the SCU in a subroutine SCUTA (SCU TURN AROUND) as shown in the flow charts of FIGS. 44A, 44B, and 44C. However, prior to explaining the operation of the SCUTA subroutine, it is first considered advantageous to explain how the computer gets into that subroutine.

In this respect, reference is made to FIGS. 38A and B of the EXOBM subroutine.

It will be recalled that the EXOBM subroutine has been entered from the WAIT subroutine when flag F2 is set. This is after the outbound message has been received from the CIU by the SCU. During the execution of the EXOBM subroutine, a flag F15 is set as shown in FIG. 38B at the top of that figure coming out of the Y branch of the function equal action at SCU decision block. Flag F15 is set during this time because the SCU action control field of the outbound command specifies that the command is to be executed internal to the SCU. That is, no information is to be transmitted to MTU's or received from MTU's by the SCU. Still referring to FIG. 38B, it will be recalled from the previous description and as shown in the second F27=1? decision block on the right side of FIG. 38B, that either flag F32 or flag F33 is set in order to turn the pilot or carrier OFF going from the SCU to the MTU's during subroutine SCUTA when the counter CNT0 or CNT1 is equal to 64.

Let is now be assumed that F15 has been set and that one of the flags F32 or F33 have been set and that the program has now gone back to the WAIT subroutine. As previously described, when a program interrupt occurs in the WAIT subroutine, OBISR of FIG. 36 will again be entered. Upon this entry into OBISR, and assuming that none of the flags are set to cause branching into some other subroutine, when the program tests the state of F15, the program will branch out of the F15=1? decision block through the Y branch entering into subroutine SCUTA.

Figure 44B:
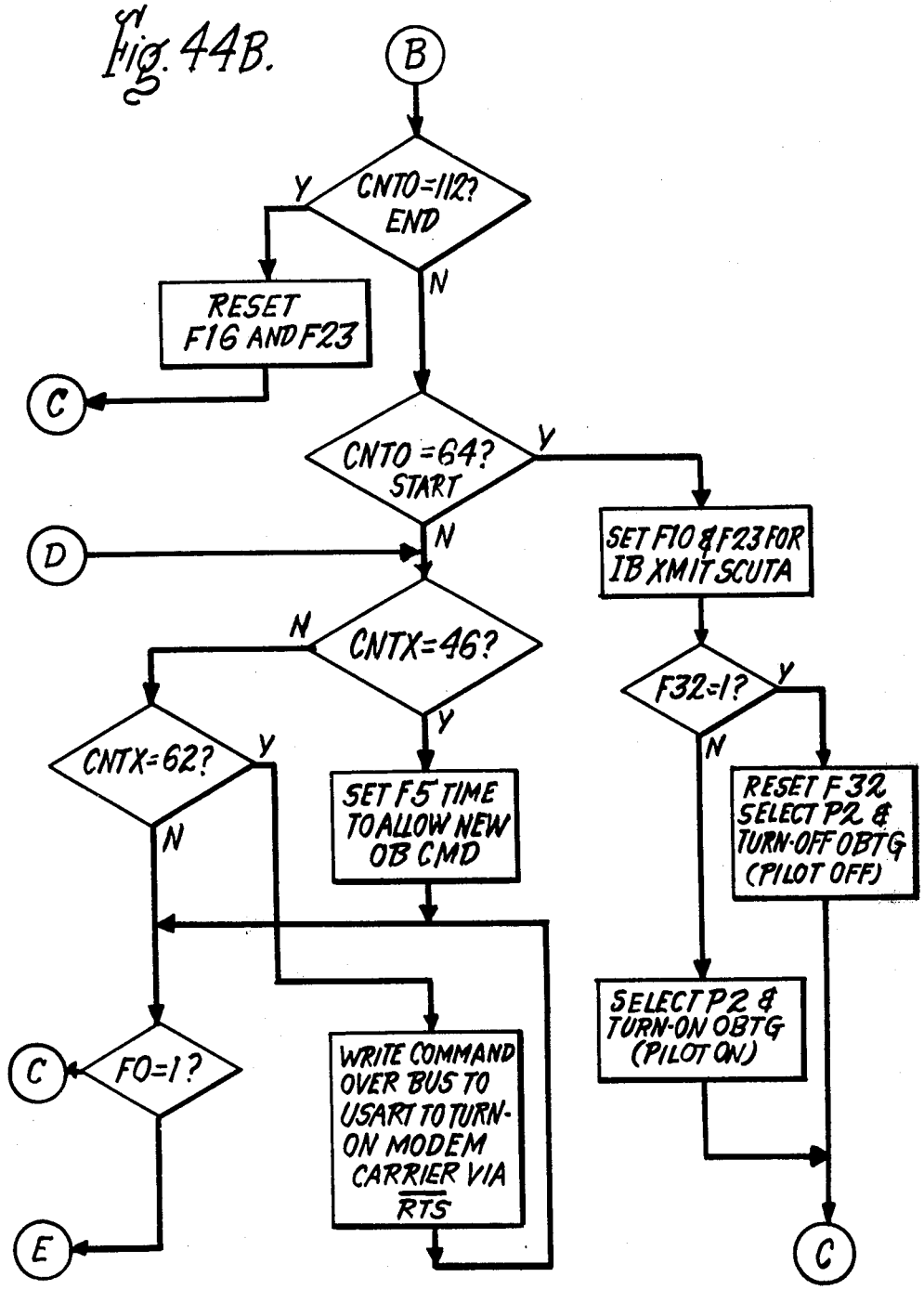
Figure 44C:
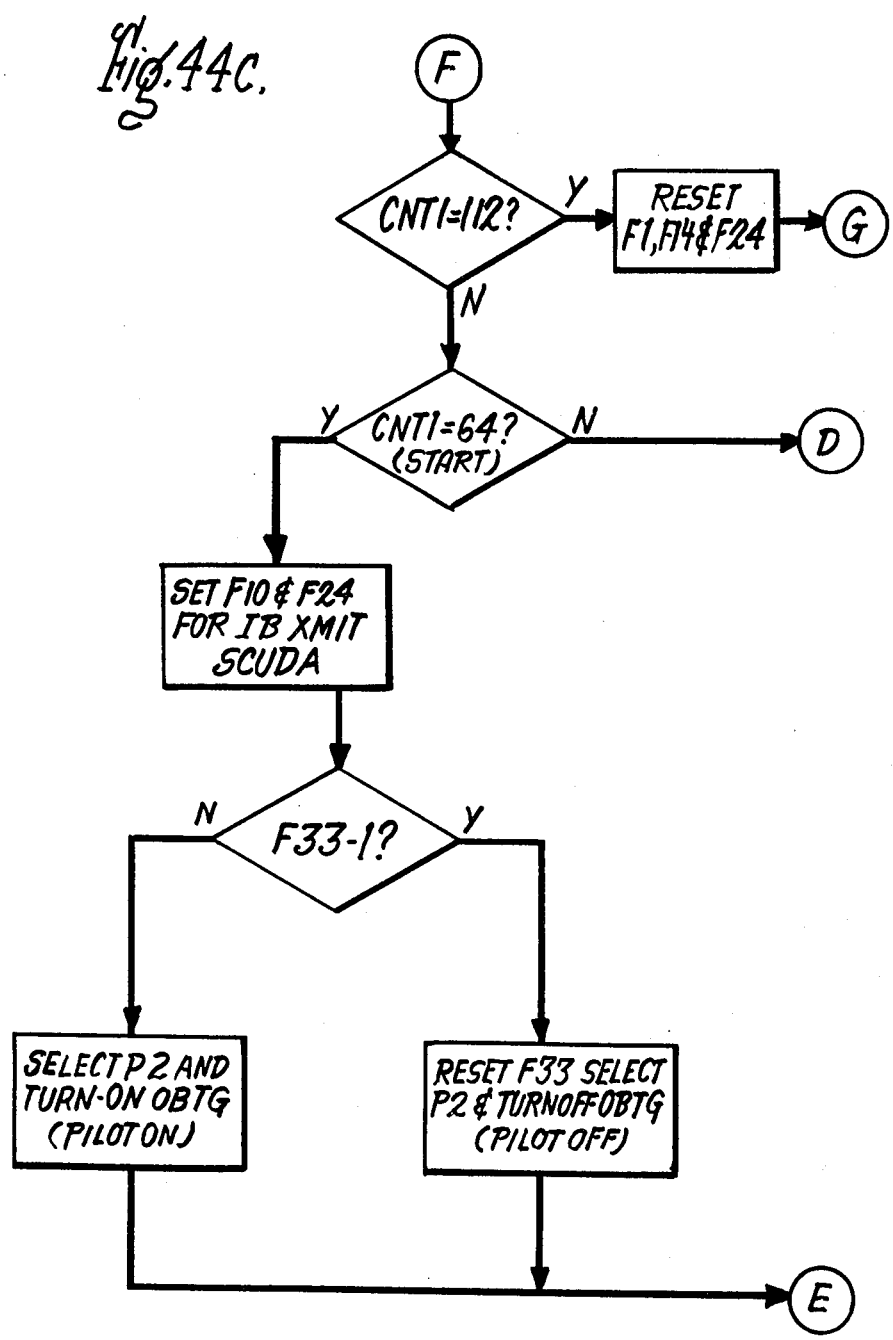

Reference is now made to FIGS. 44A through 44C of the SCUTA subroutine. As shown, SCUTA is entered when F15 is equal to 1. Upon entry in the SCUTA, the first test performed is in an F16=1? decision block. Flag F16 is either set or reset in the EXOBM subroutine depending upon whether the SCU is counting on CNT0 or CNT1. In the instant case, we are assuming that F16 is set, therefore CNT0 is the counter being utilized. Thus, the program will exit the F16=1? decision block through the Y branch entering into an action block wherein a flag F0 is set. F0 is a flag which will subsequently be used to also indicate that the SCU is counting on CNT0 in subroutine SCUTA.

The program will now enter into connector B of FIG. 44B into an action block CNT0=112. This is the block where the SCU tests to see if the entire command has been transferred back to the CIU. Upon the first time into connector B, CNT0 will not be 112, thus the program will exit through the N branch entering another decision block wherein CNT0 is tested to see if it is equal to 64. If CNT0 is equal to 64, it indicates that it is time to transmit the SCU turnaround command back to the CIU. In which case, the program will exit through the Y branch entering into an action block wherein flag F10 will be set to tell the computer to transmit the command back to the CIU. Also, F23 is set to direct the SCU to transmit the inbound command from the SCU back to the CIU on CNT0 during the SCUTA subroutine. The program will now enter into an F32=1? decision block to determine whether the pilot or carrier going from the SCU's to the MTU's is to be turned ON or OFF. If flag 32 is set, the program will exit through the Y branch entering into an action block wherein F32 is reset and P2 of the computer is selected to turn off the outbound transmit gate OBTG by writing a binary 0 to that line. On the other hand, if F32 is not set, it indicates that the pilot is to be turned ON.

Thus, the program will exit through the N branch, P2 will be selected, and the pilot will be turned on by driving OBTG to a binary 1. The program will now return through connector C back to FIG. 44A entering into an action block wherein flag F0 is reset.

A flag F14 is now tested to see if the SCU is counting on CNT1. If CNT1 is being utilized as a counter ast the present time, the program would exit through the Y branch entering into connector F of FIG. 44C. However, let it be assumed that F14 is reset, thus the program will exit the N branch. A test is now performed to see if F16 is equal to a 1 indicating that the SCU is counting on CNT0 in the SCUTA subroutine. If F16 is not set, the program will thus reset F15 and exit to OBRT4 of the OBISR subroutine in FIG. 36. If F16=1, however, the Y exit will be taken leaving F15 set. The program will now go back to the WAIT loop pending another interrupt has occurred and the program is just re-entered OBISR in FIG. 36. Upon progressing through OBISR, F10 will again be found to be set, at which time the IBXR subroutine will be re-entered.

Reference is again made to FIG. 43A of the IBXR subroutine. As will be noted in that flow chart, F23 is now equal to a 1. Thus, as IBXR is entered and F23 is tested, an exit will be made through the Y branch of the F23=1? decision block into an action block wherein a count CNT is set equal to CNT0 as the base address to start the retrieval of outbound words OBW5–OBW10 for transfer back to the CIU. CNT is a counter located in one of the working registers. The program now proceeds into another action block wherein register R1 in the working registers is set equal to 65 designating the beginning of the count for transmission of the command from the SCU back to the CIU and R2 is set equal to 0.

The computer now tests to see if CNT is equal to R1. On the first time in, CNT is equal to R1 because upon entry into the IBXR subroutine CNT0 was equal to 65. Therefore, the program will exit through the Y branch and load the first outboard word OBX5 (designated OBWX) from memory at base address+R2 into the inbound data word location IBDW of FIG. 33A. Referring to FIG. 7, OBW5 contains the function code bits shown as character 5. The program now goes into an action block wherein bits 1 through 7 in location IBDW are masked and the contents of that word in IBDW are transferred to the USART whereby bit 0 is the only bit having significance in that character. Bit 0 in this instance, indicates channel 1 representative of that data normally coming back from the MTU on frequency FI. Also in this action block, the inbound data word IBDW, is right ring shifted 1 bit and stored back into the IBDW location.

The program will now exit to OBRT3 of FIG. 36, wherein F15 is again tested. Since F15 is still set, the SCUTA subroutine will again be entered in FIG. 44A. With F16 still set in SCUTA, exit will be taken through the Y branch wherein F0 will again be set and an entry made into connector B of FIG. 44B. Since CNT0 is not equal to 112, meaning that the complete command has not been transmitted to the CIU, the branch will be taken and a test will again be performed to see if CNT0 is equal to 64. Since CNT0 is not equal to 64, the branch will be taken and a test performed to see if CNT0=46. If CNT0 is equal to 46, it is time to set F5 to allow a new outbound command to be received by the SCU. However, if CNT0 is not 46, which will not be at this time, the N branch will be taken and CNT0 will be tested as CNTX to set if it is equal to 62. Since CNT0 will not be equal to 62 at this time, the N branch will be taken and a test will then be performed to see if F0 is equal to a 1. Since F0 was set upon entry into this subroutine, entry will be made from the F0=1? decision block to connector C of FIG. 44A.

At this time, F0 is reset and a test performed to see if F14 is set. Since at this time it is assumed that the SCU is counting on CNT0, F14 will not be set, therefore the N branch will be taken and F16 will be tested. F16 is also set at this time, therefore, the program will exit through the Y branch returning back to OBRT4. Assuming that none of the other flags in OBISR of FIG. 36 are set, the computer will now return back to the WAIT subroutine pending another interrupt.

When the next interrupt occurs, OBISR will again be entered and the program will proceed down to the point of testing F10=1. Since F10 is still set, the IBXR subroutine of FIG. 43A will again be entered. Upon entry into IBXR, F25 at this time will still be reset and F23 will be set as previously described. Therefore, the Y branch will be taken into the action block wherein the count CNT in again set equal to CNT0. It should be noted at this time, since the program has gone through the OBISR count in CNT on the second pass into IBXR will be equal to 66. The program now proceeds to set R1 equal to 65 again and to set R2 equal to 0. At this time, since CNT is not equal to R1, the program will take the N branch into an action block where R1 is set equal to R1+8, thus incrementing R1 from 65 to 73. Also R2 is incremented by 1.

A test is now made to see if R1 is equal to 113. Since R1 is not equal to 113, the program will take the N branch and loop back to the input of the CNT=R1? decision block. The program will now continue in this loop incrementing R1 by 8 until R1 is equal to 113. At which time the YES branch will be taken and a test will be made to see if the counter is equal to 112. Since it is not, the program will exit to the N branch and again mask bits 1-7 of the IBDW location to thus ship out the second bit of the data word is OBW5. The contents of IBDW will then be ring shifted to right 1 position again putting the next data bit in the first position (bit0). The program will now exit back to OBRT3 in the manner as previously described.

Upon the next entry into IBXR, the same process just described will be repeated until all of the data bits in OBW5 have been shipped out to the CIU. On the ninth entry into IBXR, CNT0 will be equal to 73. Therefore, CNT is equal to 73. R1 is again set to 65 and R2 is set to 0. Upon this entry into the CNT =R1? decision block, since CNT is equal to 73, the base address of OBW6, there will not be a comparison and the program will exit through the N branch whereby R1 will be incremented by 8 to 73, and R2 by 1 in the manner as previously described. R1 is not equal to 113, therefore, the program will branch back through the N branch into the CNT=R1? decision block. Now that R1 is equal to CNT, that is they both equal 73, the YES branch will be taken and the next word OBW6 will then be loaded from the base address +R2 which was incremented by 1 in the first pass through the loop. OBW6 is then retrieved, bits 1 through 7 are masked in IBDW and that character with bit 0 being the only significant bit is shipped out to the CIU as a data bit in channel 1 position. IBXR will be entered 48 times to ship out the entire six characters of the previously received SCU outbound command. When the last bit in character OBW10 of FIG. 33A has shifted out, the program will exit through the R1=113 Y branch in FIG. 43A where the test is made to see if the counter CNT is equal to 112. At this time, CNT is equal to 112 (CNT0 counter from 65-112). Thus, the program will exit through the Y branch, indicating that it is time to append the SCU address bits to the command being transmitted back to the CIU. Therefore, F25 is set and the inbound transmit counter IBXC is set equal to 0. The program will now return back to OBRT 3 after it has shipped out the last data bit of the last character previously described loaded into the IBDW work.

Upon the next entry into IBXR, it will be noted that F25 is equal to a 1. Therefore, the program will take the Y branch and enter into the FIG. 43B at connector H. The operation at FIG. 43B is exactly as previously described for adding the SCU address to the end of the inbound message coming from the MTU's going to the CIU. Upon exiting to OBRT3 from FIG. 43B, the program will then go back to FIG. 36 where F15 will again be tested. Since F15 is still set, the SCUTA subroutine will again be entered. Since F16 is still set, exit will be through the Y branch where F0 will again be set and the program will go into connector B of FIG. 44B. At this time, since CNT0 is equal to 112, it indicates the end of the command, therefore, the computer will take the Y branch and enter into an action block where F16 and F23 are reset. F16 and F23 are reset to indicate that the SCU is no longer counting on CNT0.

The program will now continue to connector C of FIG. 44A where F0 is reset and a test is performed to see if F14 is equal to 1. If F14 is not set, the program will exit through the N branch wherein F16 is tested. F16 is now reset, therfore, the N branch will be taken and flag F15 is reset to prevent re-entry into the SCUTA subroutine. The program now returns back to OBRT4, where assuming that no other flags are set, the program will go back into the WAIT subroutine.

When another interrupt occurs in the WAIT subroutine, OBISR will be entered and the appropriate subroutine will be entered in accordance with the various flags which are set upon entry into OBISR in the manner as previously described.

In the preceding discussion, those portions of the flow charts dealing with counter CNT1 have not been described in detail as it is believed unnecessary to do so as it would be a duplication of that just described for operation of the SCU when using CNT0. The basic difference between CNT0 and CNT1 is that CNT1 has its own flags which are set or reset in accordance with that defined in Table 2.

The significance of the invention lies in the utilization of CNT0 and CNT1 to control the interlace timing as shown in FIG. 39, whereby the two counters operating in a synchronous mode allow two commands to be continuously buffered into the SCU for transmission of a continuous data stream of outbound commands of MTU's and also using the same counters for the receiving of the messages from the MTU's into the SCU's and forwarding those messages from the SCU's on to the CIU.

FIG. 45 has been included in the present embodiment to give further clarification of how the MTU to SCU messages are received and how those messages are transmitted from the SCU to the CIU. It will be noted that the drawing of FIG. 45 corresponds basically to the inbound message format shown in FIG. 8. That is, where a message going from the SCU to the CIU is comprised of 52 characters. As shown in FIG. 45, each of the bits at frequencies F+1 through F+8, coming from eight simultaneously addressed MTU's are presented as an 8 bit character to the 8 receivers in the SCU. As previously described, these 8 bits from each of the eight MTU's is transferred in parallel from the receivers as a character into the computer for transfer from the IBDW location of FIG. 33 to the CIU via the SCU USART. After the entire message has been received from the MTU's, the SCU address is then attached to that message as characters 49 through 52 as shown in FIG. 45 and in FIG. 8.

It is also significant to note from the previous description, by referring to FIG. 45, that the information of a SCU turn around command is transmitted back in the exact same format as the information coming from the MTU to the CIU. That is, bits 2 through 8 of each character transmitted back to the CIU during the execution of SCUTA are masked to zero's, with bit 1 being transmitted to the CIU in each of the 52 characters as if the command actually came in from an MTU on channel 1, the channel associated with the frequency FI1. By so ransmitting a turn-around command, total uniformity is provided in the system in that all commands and/or messages received back at the CIU from the SCU are of the exact same format. This feature makes it easier for the RCC to analyze and separate out the messages returning from the SCU's and the MTU'.

The flexibility of the SCU utilized in the present invention makes many system arrangements possible to increase the data throughput of the entire system. While normally it is possible that an SCU can communicate with its entire complement of MTU's as shown in FIG. 1, where the SCU serves to perform both transmit and receive functions, it is sometimes desirable to have more than one SCU on a CIU channel to communicate with several MTU's.

Figure 47:
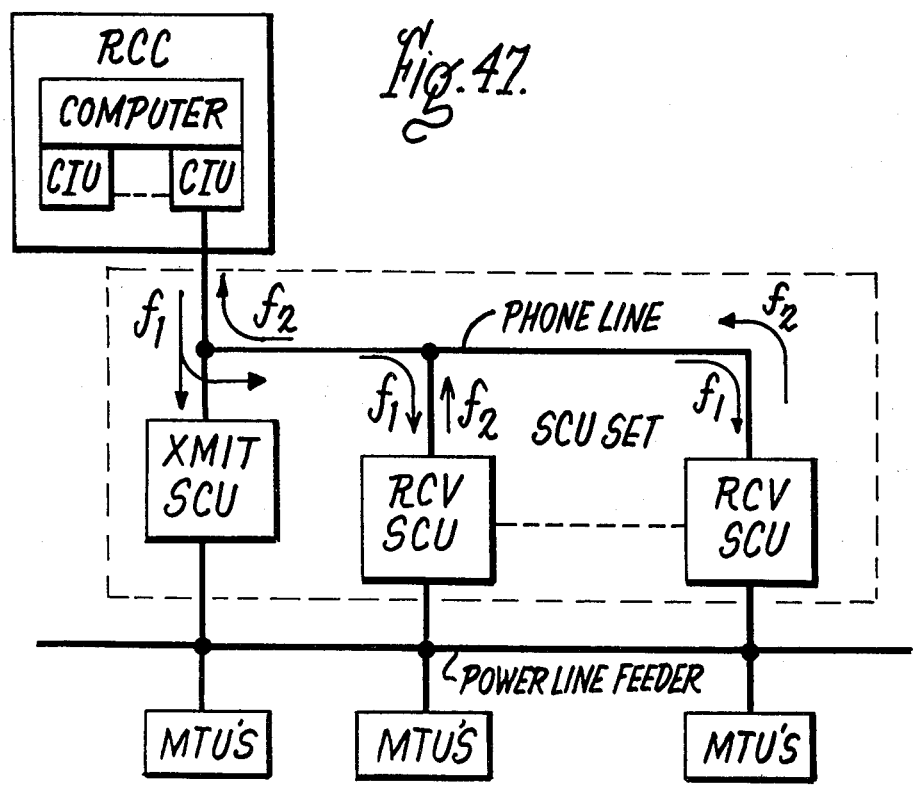

Recognizing that the MTU transmitter is of a much lesser power output than the SCU transmitter, there are situations on a power line where the MTU's may be located so far away from the SCU receivers that the SCU cannot receive the information from the MTU's. When this condition exists, it is sometimes desirable to designate certain SCU's as receive only SCU's and locate them along the power line close to the MTU's from which they are to receive data. Such a system arrangement is shown in FIG. 47, where a CIU channel communicates over a single telephone line with a set of SCU's comprised of a transmit SCU and several receive SCU's all connected to the same power line. To operate such a system as that shown in FIG. 47, it will be noted that each SCU in the SCU set receives its outbound commands at frequency FI1 from its corresponding CIU channel. It should also be noted that each of the receive SCU's transmit their inbound messages which they receive from the MTU's or those which they turn around and send back to the CIU, at the same subchannel frequency F2 as previously defined. In this arrangement, an outbound command transmitted from the RCC to the SCU set, will specify in its transmit address field that the transmit SCU is to send out the command but not to receive messages. That same command would specify in its received address filed that one of the RECEIVE SCU's is to receive messages only and not to transmit. Since each of the RECEIVE SCU's transmit back on the same subchannel frequency (f2) as shown in FIG. 47, only one of those receive SCU's at a time can be addressed to receive messages from the MTU's addressed by the outbound command from the transmit SCU.

Figure 46:
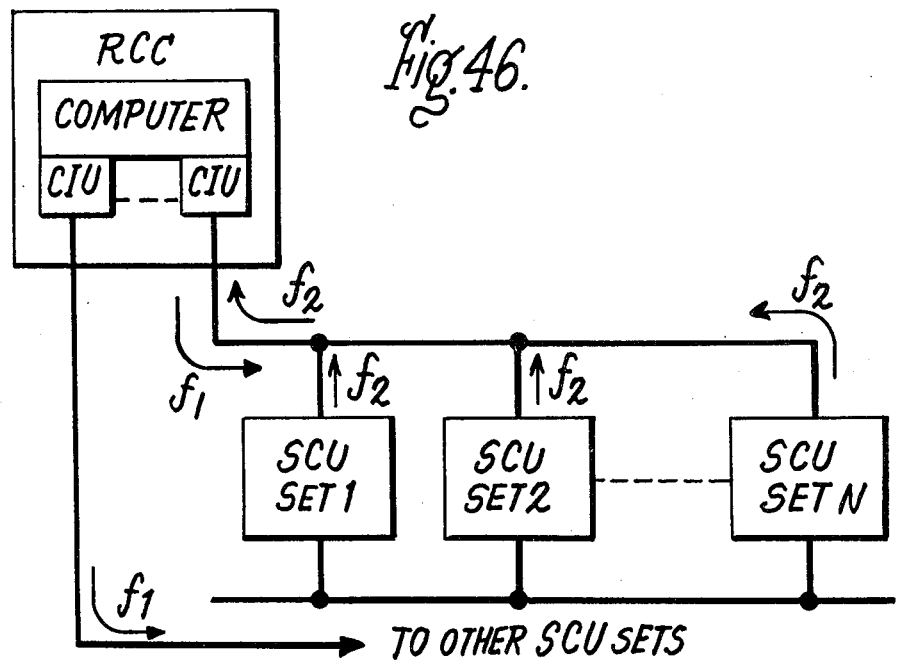

By definition, an SCU set may comprise one or more SCU's in the system. The only criterion is that all SCU's in a set be connected to the same CIU via the same subchannel. Thus, if a single SCU comprises a set, then that SCU performs the functions of both transmit and receive. As a result, the transmit and receive addresses which are sent to a transmit/receive SCU are identical if it is the main or only SCU of a set, because that SCU is to perform both transmit and receive functions. FIG. 46 illustrates another system arrangement whereby a number of SCU sets are connected to a common power line and to a common CIU subchannel. Each of the SCU sets communicates with the CIU at subchannel frequency f2. In this arrangment, one or more SCU's in any one of the sets may be designated as a transmit SCU and other ones of the SCU's in any of the sets may be designated as receive only SCU's. The only criterion in this arrangement is that only one SCU at a time in any given set can transmit its inbound data back to the CIU.

FIG. 48 illustrates another system arrangement whereby many sets of SCU's communicate with a single CIU channel, with each of the sets connected to separate power lines, with each group of connected SCU sets communicating back to the CIU on a different subchannel frequency f2, f3, and f4. In this arrangement, any SCU from a given CIU set, may be transmitting inbound messages to the CIU at its subchannel frequency, while, simultaneously, the SCU from a different set is transmitting at its subchannel frequency.

For example, SCU set 1 may have an SCU transmitting information back to the CIU at its subchannel frequency f2, while simultaneously an SCU in SCU set 11 may be transmitting its messages back to the CIU on its subchannel frequency F3, etc. FIG. 48 also illustrates that it is possible to connect several SCU sets to a single power line with each SCU set communicating back over a single CIU channel at its own given subchannel frequency.

It is understood, that each CIU input channel will have matching receivers tuned to receive the respective subchannel frequencies f2, f3, f4 from the SCU's.

FIG. 49 illustrates the subchannel command and message interlacing technique for one subchannel in a system of the type described in connection with FIG. 1. FIG. 49 illustrates by arrows starting from the left to the right, that the CIU sequentially transmits five outbound commands to the SCU. As soon as the first command is received by the SCU and decoded, the SCU then transmits that command on to the MTU's. A first group of eight MTU'is addressed to simultaneously transmit their messages back to the SCU in response to the first command. The SCU will transfer these messages from the eigth MTU's to the CIU while transmitting a second command to a different group of MTU's, which in turn respond with their messages while a third command is being transmitted, etc.

FIG. 50 illustrates the command and message interlacing for three subchannels where information is simultaneously transmitted between the CIU's and the MTU's via the SCU's. The CIU is shown generating three (1, 2, 3) sequential commands addressed to each of three SCU's designated SCU1, SCU2, and SCU3. As shown, when the first command is addressed to SCU1, that command is transmitted out by SCU1, the eight MTU's communicating with SCU1. Immediately, following command 1, commands two and three are sent out to addressSCU2 and SCU3 respectively. As shown in FIG. 50, while the CIU is sending out its second command, the 8 MTU's previously addressed by the first command sent out by the SCU1 are transmitting their messages back to the CIU via SCU1. As can be seen, this interlacing of commands and messages continues for SCU2 and SCU3 in response to commands two and three from the CIU. When three subchannel are being used, the messages being transmitted from SCU1 to the CIU would be at subchannel frequency f2, the subchannel frequency of SCU2 would be f3 and that frequency from SCU3 would be f4. Thus, it can be seen, that one CIU can operate simultaneously on one single telephone line with three subchannel frequencies from three distinct SCU's.

In summary, the concept of the utilization of SCU sets can include many combinations, a few of which have been described. Such combinations are (1) a single CIU, normally located at a sub station or anywhere else, may be used for load control only to control loads at MTU's. This single SCU would only transmit. (2) a single transmit SCU, located at a substation plus one or more receive only SCU's located out along the power line feeder or feeders. (3) a single transmit/receive SCU at a sub station, plus one or more transmit and receive SCU's or receive only SCU's outalong the power line feeder or feeders. (4) any combination of the above.

The feature that the SCU has of being able to control its own transmit power line carrier or pilot as previously discussed enables any number of SCU's connected to a common power line to communicate between their MTU's and CIU's without interference by merely switching off their own power line carriers under command control from the CIU. This is a distinct advantage of the system in that it provides the capability of being able to control the connection of large sets of SCU's to the power line.

While the principles of the invention have now been made clear in an illustrative embodiment, there will be immediately obvious to those skilled in the art, many modifications of structure, arrangement, the elements, material, and components used in the practice of the invention and otherwise, which are particularly adapted for specific environments and operating requirements without departing from those principles. The appended claims are, therefore, intended to cover and embrace any such modifications within the limits only of the true spirit and scope of the invention.

What is claimed is:

1. A remote automatic utility monitoring and control system including a terminal unit connected to a power line, said terminal unit comprising:
   (a) means for receiving a command over said power line, said command including an action field portion and a function code portion; and
   (b) decode means responsive to said received command to effect the immediate execution of the functions as specified by said function code portion when said decode means recognizes a first address type contained in said action field portion and further recognizes an address assigned to said terminal unit as specified by at least a portion of the contents of the first address type; and to effect the execution of the functions as specified by said function code portion at a specified time when said decode means recognizes a second address type contained in said action field portion, said time of execution being specified by a time field portion of the contents of said second address type, and further recognizes an address assigned to said terminal unit as specified by an address portion of the contents of said second address type.

2. A terminal unit in accordance with claim 1 additionally comprising:
   (c) at least one meter including an encoder, said encoder generating data signals representative of a commodity reading measured by said meter;
   (d) a plurality of function code identifiable storage means; and
   (e) wherein said decode means, in response to a first function code type contained in the function code portion of a received command, selectively effects the storage data signals from said encoder, as measurement data information, into an identified one of said storage means; and, in response to a second function code type contained in the function code portion of a received command, selectively effects the transfer of information contained in a specified one of said storage means, as identified by the second function code type, to transmitter means for transmitting said information over said power line.

3. A terminal unit in accordance with claim 2 wherein said assigned address comprises:
   (a) a main address uniquely assigned to a particular terminal unit of said system; and
   (b) at least one auxiliary address, the contents of which are common to at least two terminal units of said system which are to respond simultaneously to a received command which contains said second address type having a predetermined information pattern in the address portion thereof.

4. A terminal unit in accordance with claim 3 including at least two auxiliary addresses comprising:
   (a) a first auxiliary address, the contents of which are common to all terminal units which are to respond simultaneously to a received command which contains the second address type having a first bit pattern in the address portion thereof; and
   (b) at least one additional auxiliary address, the contents of which are common to a block of terminal units, each block including a predetermined number of terminal units which are to respond simultaneously to a received command which contains the second address type having a bit pattern which is different from said first bit pattern in the address portion thereof.

5. A terminal unit in accordance with claim 4 including, in addition to said first auxiliary address:
   (a) a second auxiliary address, the contents of which are common to a first block of terminal units, said first block including 1/16 of all terminal units in the system, which are to respond simultaneously to a received command which contains the second address type having a second bit pattern in the address portion thereof; and
   (b) a third auxiliary addresss, the contents of which are common to a second block of terminal units, said second block including 1/32 of all terminal units in the system which are to respond simultaneously to a received command which contains the second address type having a third bit pattern in the address portion thereon.

6. A terminal unit in accordance with claim 3 wherein said decode means, in response to a third function code type contained in the function code portion of a received command having a recognized address, selectively effects the initiation of a demand on for a predetermined time period, said demand on period including at least one demand interval having a predetermined duration, wherein during said demand on period the difference of measurement data obtained at the beginning and end of each demand interval is compared to the largest difference obtained during a preceeding time interval of said demand on period, the larger of the two compared difference values being stored in an identified one of said storage means.

7. A terminal unit in accordance with claim 6 wherein the initiation of said demand on will take place only if a command containing a recognizable second address type has been previously received, said command containing a fourth function code type in the function code portion; and wherein said decode means, in response to said fourth function code type, effects the termination of the demand at a predetermined specified future time.

8. A terminal unit in accordance with claim 7 wherein said decode means, in response to said fourth function code type contained in the function code portion of a received command containing said second address type having a recognizable bit pattern in the address portion thereof, selectively effects termination of demand at a predetermined time, as specified by the time field portion thereof, after receipt of said command.

9. A terminal unit in accordance with claim 7 wherein said decode means, in response to said fourth function code type contained in the function code portion of a received command containing said second address type having a bit pattern in a predetermined portion of said address portion thereof which matches a predetermined portion of a bit pattern contained in an auxiliary address, selectively effects termination of demand at a predetermined time, as specified by the time field portion of said second address type, afer receipt of said command.

10. A terminal unit in accordance with claim 3 additionally comprising:
(f) at least one load control means for controlling a load associated therewith; and
(g) wherein said decode means, in response to a fifth function code type contained in the function code portion of a received command, selectively activates an identified one of said load control means to effect the turning off of the load associated therewith; and, in response to a sixth function code type contained in the function code portion of a received command, selectively activates an identified one of said load control means to effect the turning on of the load associated therewith.

11. A terminal unit in accordance with claim 10 wherein said decode means, in response to said fifth function code type contained in the function code portion of a received command containing said first address type having a bit pattern which matches a predetermined portion of a bit pattern contained in the main address, selectively activates a specified one of said load control means, as identified by the fifth function code type, to effect the turning off of the load associated therewith.

12. A terminal unit in accordance with claim 10 wherein the initiation of the burning off of an associated load will take place only if a command containing a recognizable second address type has been previously received, said command containing a seventh function code type in the function code portion; and wherein said decode means, in response to said seventh function code type, effects the turning on of the associated load at a predetermined specified future time.

13. A terminal unit in accordance with claim 10 wherein said decode means, in response to said sixth function code type contained in the function code portion of a received command containing said second address type having a recognizable bit pattern in the address portion thereof, activates, at a predetermined time after receipt of said command as specified by the contents of the time field portion of said second address type, as identified one of said load control means to effect the turning on of the load associated therewith.

14. A terminal unit in accordance with claim 10 wherein said decode means, in response to said sixth function code type contained in the function code portion of a received command containing said second address type having a bit pattern in a predetermined portion of said address portion thereof which matches a predetermined portion of a bit pattern contained in an auxiliary address, activates, at a predetermined time after receipt of said command as specified by the contents of the time field portion of said second address type, an identified one of said load control means to effect the turning on of the load associated therewith.

15. A terminal unit in accordance with claim 10 additionally comprising:
(h) at least one alert control means for controlling an alert device associated therewith; and
(i) wherein said decode means, in response to an eighth function code type contained in the function code portion of a received command, selectively activates an identified one of said alert control means to effect the turning on of the alert device associated therewith; and, in response to a ninth function code type contained in the function code portion of a received command, selectively activates an identified one of said alert control means to effect the turning off of the alert device associated therewith.

16. A terminal unit in accordance with claim 15 additionally comprising:
(j) at least one status means for monitoring the status of a switch associated therewith; and,
(k) wherein said decode means, in response to a tenth function code type contained in the function code portion of a received command, selectively effects the storage of a signal from said status means, as an indication of switch status, into an identified one of said storage means; and effects the transfer of the switch status from said one of said storage means to transmitter means for transmitting said measurement data over said power line.

17. A terminal unit in accordance with claim 3 wherein said decode means, in response to said first function code type contained in the function code portion of a received command containing said first address type having a bit pattern which matches a predetermined portion of a bit pattern contained in the main address, selectively effects the storage of data signals from said encoder, as measurement data information, into an identified one of said storage means.

18. A terminal unit in accordance with claim 3 wherein said decode means, in response to said second function code type contained in the function code portion of a received command containing said first address type having a bit pattern which matches a predetermined portion of a bit pattern contained in the main address, selectively effects the transfer of information contained in a specified one of said storage means, as identified by the second function code type, to said transmitter means for transmitting said information over said power line.

19. A method of delaying execution of a command by a terminal unit of a remote automatic utility monitoring and control system, said method comprising the steps of:

(a) receiving a command having a function code portion and an action field portion, said function code portion containing a specified function to be performed, and said action field portioj containing an etecute hejca typa address including an address portion containing specified terminal unit address information and a time field portion containing a specified value of time;

(b) storing the contents of said function code and said time field portions of a command having a recognizable address portion;

(c) decrementing the stored contents of said time field portion at predetermined equal intervals; and (d) performing the function specified by the stored contents of said function code portion when the contents of said stored time field portion has been decremented to zero.

20. A method of enhancing the security of a remote automatic utility monitoring and control system including a terminal unit for performing specified functions, said method comprising the steps of:

(a) transmitting to said terminal unit a first command having a function code portion and an action field portion, said function code portion containing a specified function to be performed, and said action field portion containing an execute hence type address including an address portion containing specified terminal unit address information and a time field portion containing a specified time interval for delaying the performance of said specified function;

(b) storing the contents of said function code and said time field portions of a first command having a recognizable address portion;

(c) transmitting to said terminal unit a second command having a function code portion and an action field portion, said function code portion containing a specified function to be performed which is an opposite of the function specified in said first command, and said action field portion containing an execute immediate type address including an address portion containing address information identifying the same terminal unit addressed by the first command; and (d) performing the function specified in the function code portion of the second command only if the opposite function specified in the first command has been received and stored by the terminal unit for execution thereby at the expiration of said specified time interval.

21. A method in accordance with claim 20 wherein step (a) includes transmitting to said terminal unit a first command, the function code portion of which contains a demand off function and step (c) includes transmitting to said terminal unit a second command, the function code portion of which contains a demand on function.

22. A method in accordance with claim 20 wherein step (a) including transmitting to said terminal unit a first command, the function code portion of which contains a load on function and step (c) includes transmitting to said terminal unit a second command, the function code portion of which contains a load off function.

* * * * *